(12) United States Patent
Yoshimizu

(10) Patent No.: US 11,587,944 B2
(45) Date of Patent: Feb. 21, 2023

(54) SEMICONDUCTOR STORAGE DEVICE

(71) Applicant: KIOXIA CORPORATION, Tokyo (JP)

(72) Inventor: Yasuhito Yoshimizu, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 166 days.

(21) Appl. No.: 17/172,947

(22) Filed: Feb. 10, 2021

(65) Prior Publication Data

US 2021/0296349 A1   Sep. 23, 2021

(30) Foreign Application Priority Data

Mar. 17, 2020   (JP) .............................. JP2020-047025

(51) Int. Cl.
*H01L 27/11578* (2017.01)
*H01L 27/11573* (2017.01)
*H01L 27/11565* (2017.01)
*H01L 27/11526* (2017.01)
*H01L 27/11519* (2017.01)
*H01L 27/11551* (2017.01)

(52) U.S. Cl.
CPC .. *H01L 27/11578* (2013.01); *H01L 27/11519* (2013.01); *H01L 27/11526* (2013.01); *H01L 27/11551* (2013.01); *H01L 27/11565* (2013.01); *H01L 27/11573* (2013.01)

(58) Field of Classification Search
CPC ......... H01L 27/11578; H01L 27/11519; H01L 27/11526; H01L 27/11551; H01L 27/11565; H01L 27/11573; H01L 2224/08145; H01L 27/11575; H01L 27/11582; H01L 27/11568; H01L 27/11521; H01L 27/11556
See application file for complete search history.

(56) References Cited

U.S. PATENT DOCUMENTS

| | | | |
|---|---|---|---|
| 7,952,136 B2 | 5/2011 | Kito et al. | |
| 2010/0019310 A1 | 1/2010 | Sakamoto | |
| 2018/0226424 A1* | 8/2018 | Shin | H01L 27/11582 |
| 2021/0074643 A1 | 3/2021 | Watanabe et al. | |
| 2022/0173120 A1* | 6/2022 | Lee | H01L 27/11556 |

FOREIGN PATENT DOCUMENTS

JP   5100080 B2   12/2012

* cited by examiner

*Primary Examiner* — Allison Bernstein
(74) *Attorney, Agent, or Firm* — Kim & Stewart LLP

(57) ABSTRACT

A semiconductor storage device includes a substrate with a memory cell region and a first region to one side of the memory cell region. A first memory cell layer is on the substrate. A second memory cell layer is between the first memory cell layer and the substrate. A plurality of first conductive layers are stacked on each other in the first memory cell layer. A plurality of second conductive layers are stacked on each other in the second memory cell layer. A plurality of first contacts are above the first region of the substrate, extending through second conductive layer from the substrate to the first memory cell layer. The contacts are electrically insulated from the second conductive layers and electrically connected to ends of the first conductive layers in the first region.

19 Claims, 49 Drawing Sheets

SEMICONDUCTOR STORAGE DEVICE

CROSS-REFERENCE TO RELATED APPLICATION

This application is based upon and claims the benefit of priority from Japanese Patent Application No. 2020-047025, filed Mar. 17, 2020, the entire contents of which are incorporated herein by reference.

FIELD

Embodiments described herein relate generally to a semiconductor storage device.

BACKGROUND

A semiconductor storage device including stacked memory cells and/or memory cell arrays are known.

DETAILED DESCRIPTION

Figure 1:
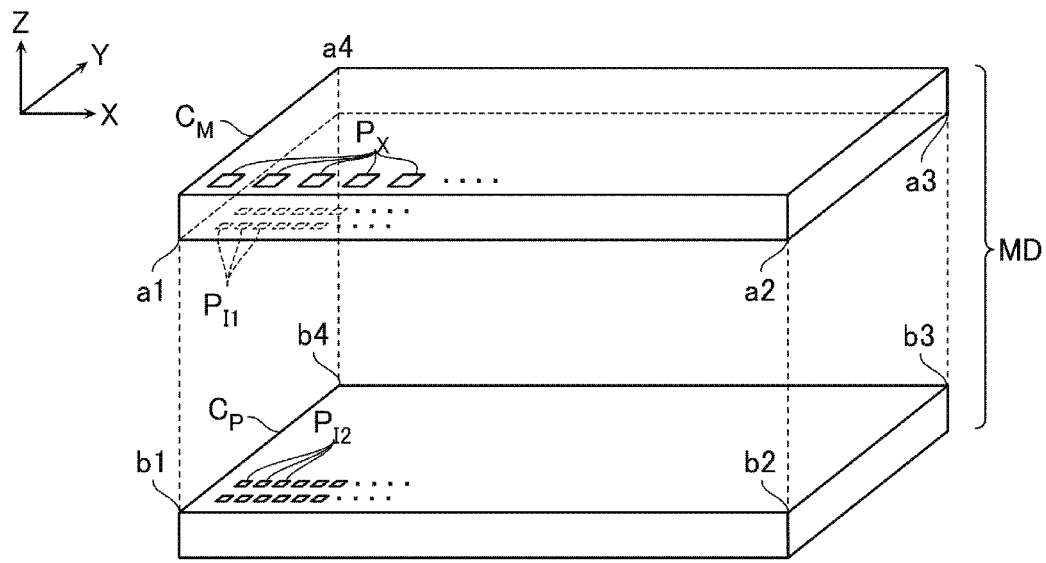
FIG. 1 is a schematic exploded perspective view showing a configuration example of a memory die MD.

Embodiments provide a semiconductor storage device capable of being highly integrated.

In general, according to one embodiment, a semiconductor storage device includes a substrate having a first surface with a memory cell region and a first region that is disposed to one side of the memory cell region in a direction parallel to the first surface. A first memory cell array layer is on the substrate. A second memory cell array layer is between the first memory cell array layer and the substrate in a first direction. A plurality of first conductive layers are in the first memory cell array layer. The first conductive layers are stacked on each other in the first direction. A plurality of second conductive layers are in the second memory cell array layer. The second conductive layers are stacked on each other in the first direction. A plurality of first contacts are above the first region of the substrate. The first contacts extend in the first direction through second conductive layer from the substrate to the first memory cell array layer. The first contacts are electrically insulated from the second conductive layers and electrically connected to ends of the first conductive layers in the first region.

Next, a semiconductor storage device according to certain example embodiments will be described with reference to the drawings. The following embodiments are merely examples and are not intended to limit the present disclosure. In addition, the following drawings are schematic, and some configurations, elements, aspects and the like may be omitted for convenience of explanation. The same reference numerals are given to common parts of the plurality of embodiments and additional description thereof may be omitted in some instances.

In the present specification, when a first configuration is said to be "electrically connected" to a second configuration, the first configuration may be directly connected to the second configuration or the first configuration may be connected to the second configuration via wiring, a semiconductor member, a transistor, or the like. For example, when three transistors are connected in series, the first transistor is "electrically connected" to the third transistor even if the second transistor is in the OFF state.

Furthermore, in the present specification, when a circuit is said to "conduct" two wirings or other elements, it may mean that this circuit or the like includes a transistor or similar element in a current path between the two wirings or other elements, and this transistor or similar element is turned on (i.e., in a conductive state between current path terminals).

In the present specification, a one direction parallel to the upper surface of the substrate is the X direction, the direction parallel to the upper surface of the substrate but perpendicular to the X direction is the Y direction, and the direction perpendicular to the upper surface of the substrate is the Z direction.

In the present specification, a direction along a predetermined surface may be called a first direction, a direction intersecting the first direction along the predetermined surface may be called a second direction, and the direction intersecting the predetermined surface may be called a third direction. The first direction, the second direction, and the third direction need not correspond to the X direction, the Y direction, and the Z direction.

In this specification, expressions such as "upper" and "lower" are based on the semiconductor substrate. For example, the direction going away from the semiconductor substrate along the Z direction is called "up", and the direction moving closer to the semiconductor substrate along the Z direction is called "down". When reference to a lower surface or a lower end of a component or element is made, it means the surface or the end portion of this configuration on the semiconductor substrate side. When reference to an upper surface or an upper end of a component or element is made, it means the surface or the end portion of this component or element on the side away from the semiconductor substrate. A surface that intersects the X direction or the Y direction can be referred to as a side surface, a lateral surface, or the like.

In the present specification, when "width" or "thickness" in a predetermined direction is stated for a component, element, configuration, a member, aspect, or the like, it may mean the width or thickness in a cross section or the like observed by the scanning electron microscopy (SEM), the transmission electron microscopy (TEM), or the like.

First Embodiment

[Structure of Memory Die MD]

FIG. 1 is a schematic exploded perspective view showing a configuration example of a semiconductor storage device according to the first embodiment. As shown in FIG. 1, the memory die MD includes a chip $C_M$ on a memory cell array side of the die and a chip $C_P$ on a peripheral circuit side of the die.

A plurality of external pad electrodes $P_X$ are provided on the upper surface of the chip $C_M$. A plurality of first bonded electrodes $P_{I1}$ are provided on the lower surface of the chip $C_M$. A plurality of second bonded electrodes $P_{I2}$ are provided on the upper surface of the chip $C_P$. For the chip $C_M$, the surface on which the first bonded electrodes $P_{I1}$ are provided is referred to as a front surface, and the surface on which the external pad electrodes $P_X$ are provided is referred to as a rear surface. For the chip $C_P$, the surface on which the second bonded electrodes $P_{I2}$ are provided is referred to as a front surface, and the surface opposite to the front surface of the chip $C_P$ is referred to as a rear surface. In the illustrated example, the front surface of the chip $C_P$ is above the rear surface of the chip $C_P$, and the rear surface of the chip $C_M$ is above the front surface of the chip $C_M$.

The chip $C_M$ and the chip $C_P$ are arranged so that the front surface of the chip $C_M$ and the front surface of the chip $C_P$ face each other. The first bonded electrodes $P_{I1}$ are respectively provided corresponding to the second bonded electrodes $P_{I2}$ and are arranged at positions where they can be bonded to the plurality of second bonded electrodes $P_{I2}$. The first bonded electrodes $P_{I1}$ and the second bonded electrodes $P_{I2}$ function together as bonded electrodes for bonding and electrically connecting the chip $C_M$ to the chip $C_P$.

In the example of FIG. 1, corners a1, a2, a3, and a4 of the chip $C_M$ correspond in arrangement and position to corners b1, b2, b3, and b4 of the chip $C_P$, respectively.

Figure 2:
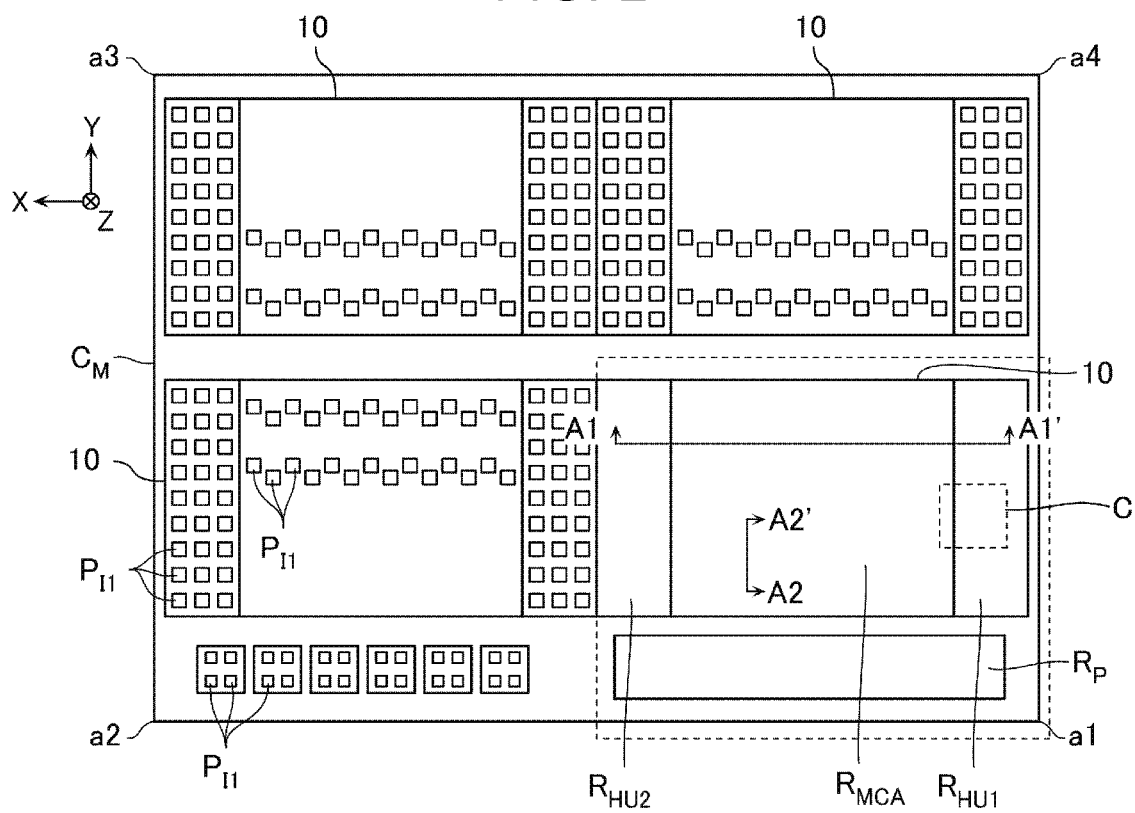
FIG. 2 is a schematic bottom view showing a configuration example of a chip $C_M$.
Figure 3:
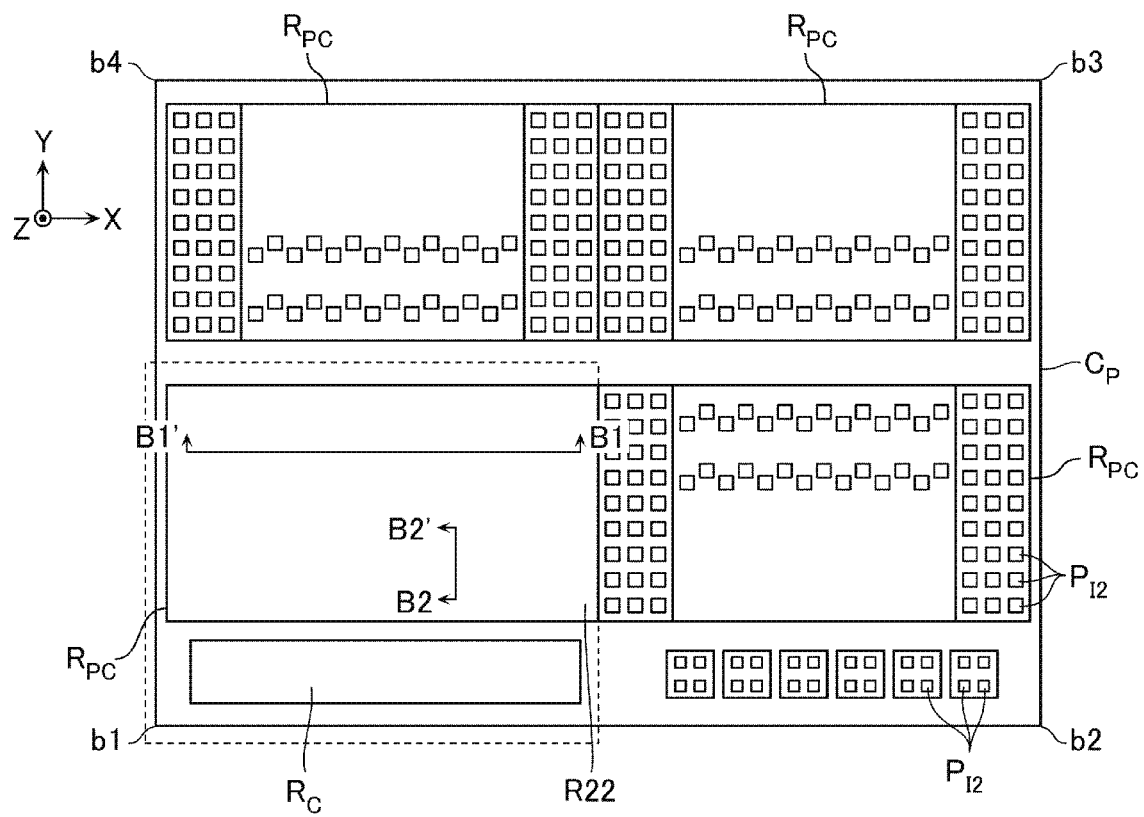
FIG. 3 is a schematic plan view showing a configuration example of a chip $C_P$.
Figure 4:
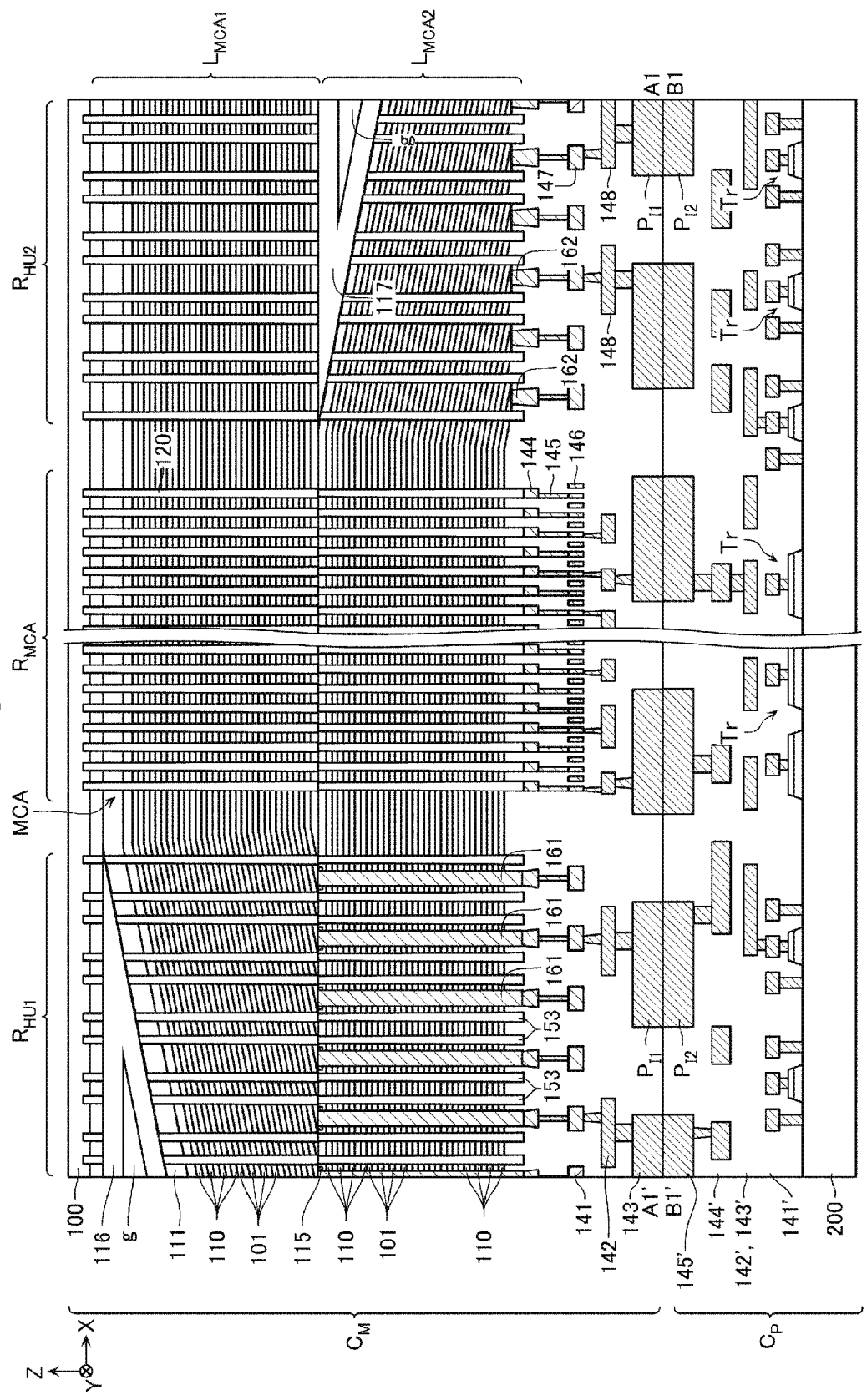
FIG. 4 is a schematic cross-sectional view corresponding to the A1-A1' line of FIG. 2 and the B1-B1' line of FIG. 3.
Figure 5:
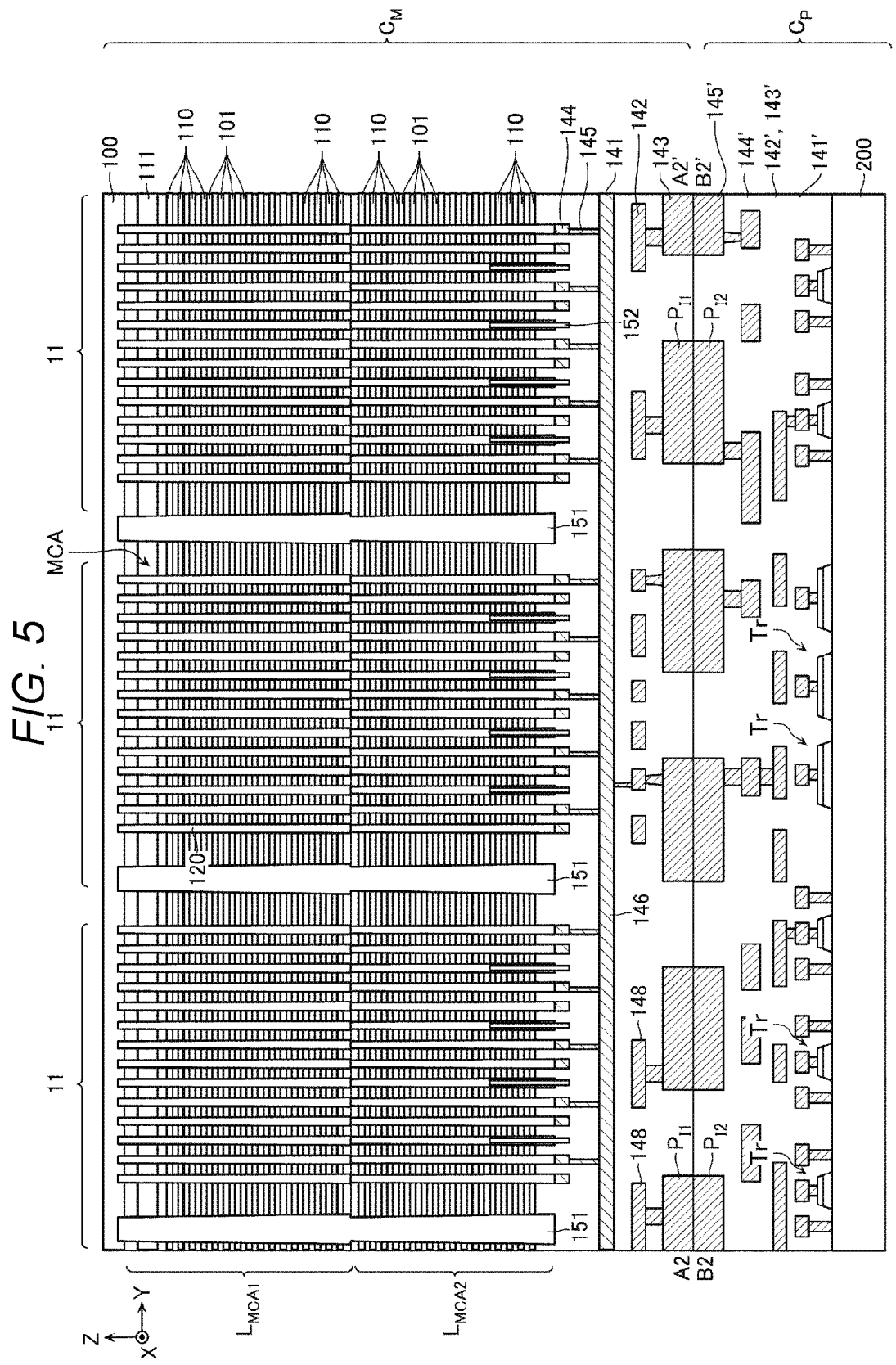
FIG. 5 is a schematic cross-sectional view corresponding to the A2-A2' line of FIG. 2 and the B2-B2' line of FIG. 3.
Figure 6:
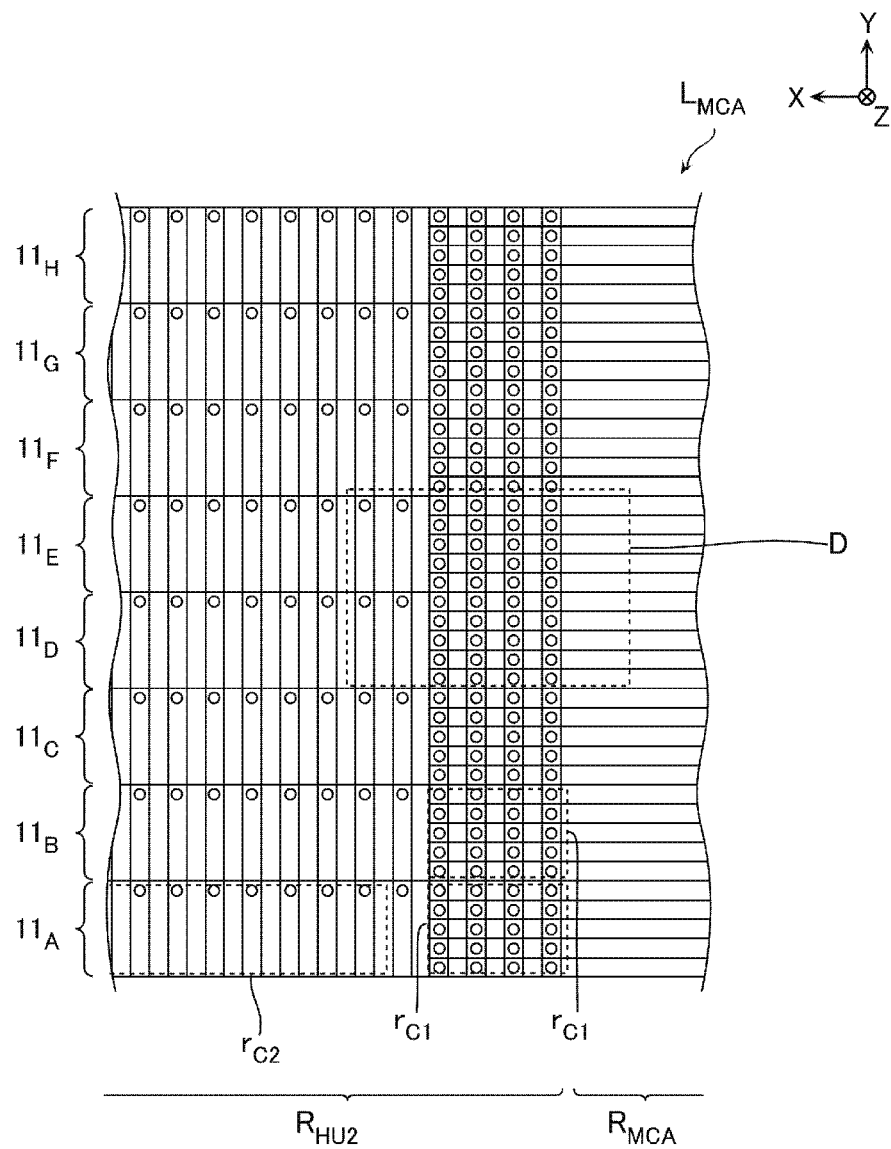
FIG. 6 is a schematic enlarged view of the part C of FIG. 2.
Figure 7:
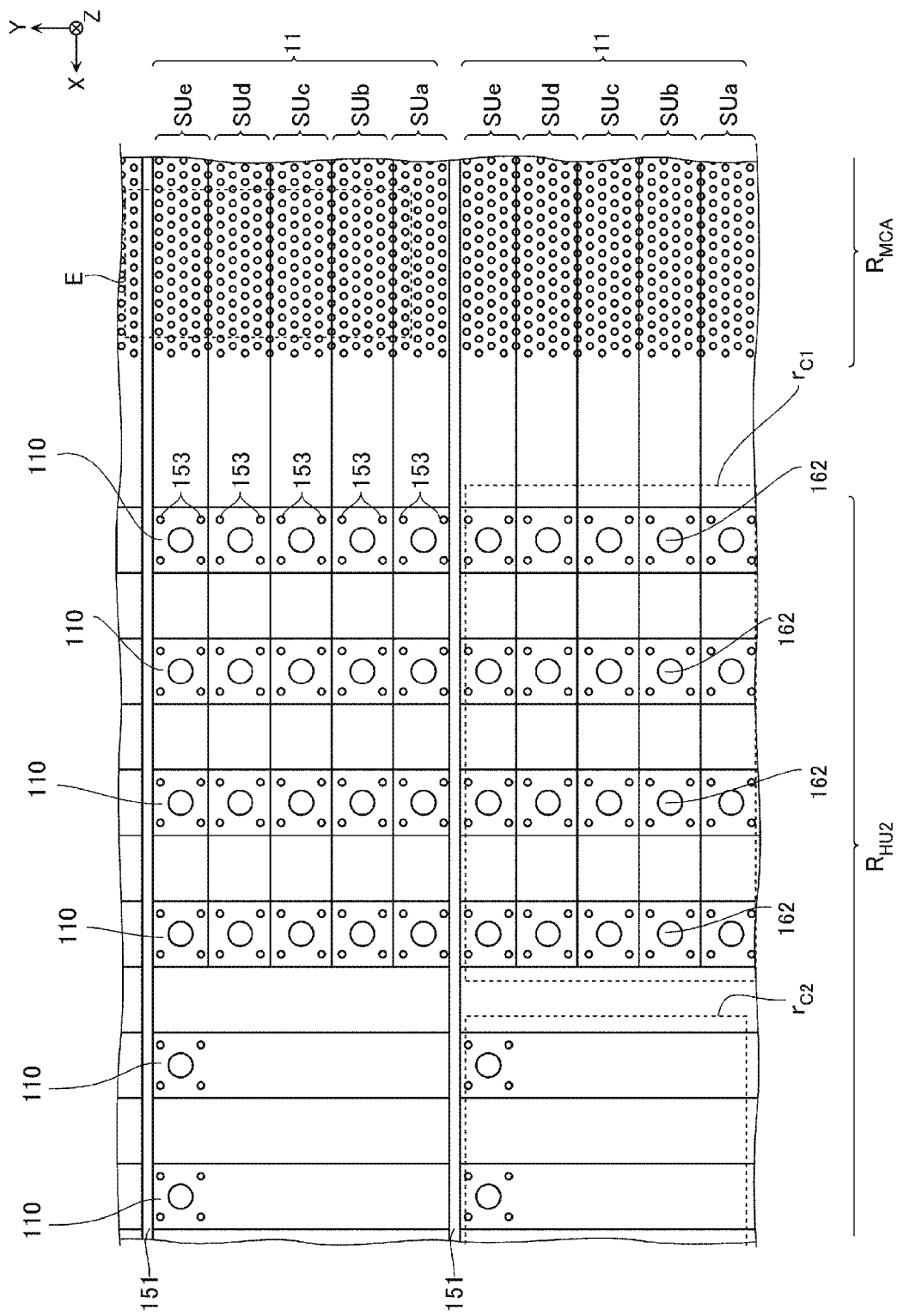
FIG. 7 is a schematic enlarged view of part D of FIG. 6.
Figure 8:
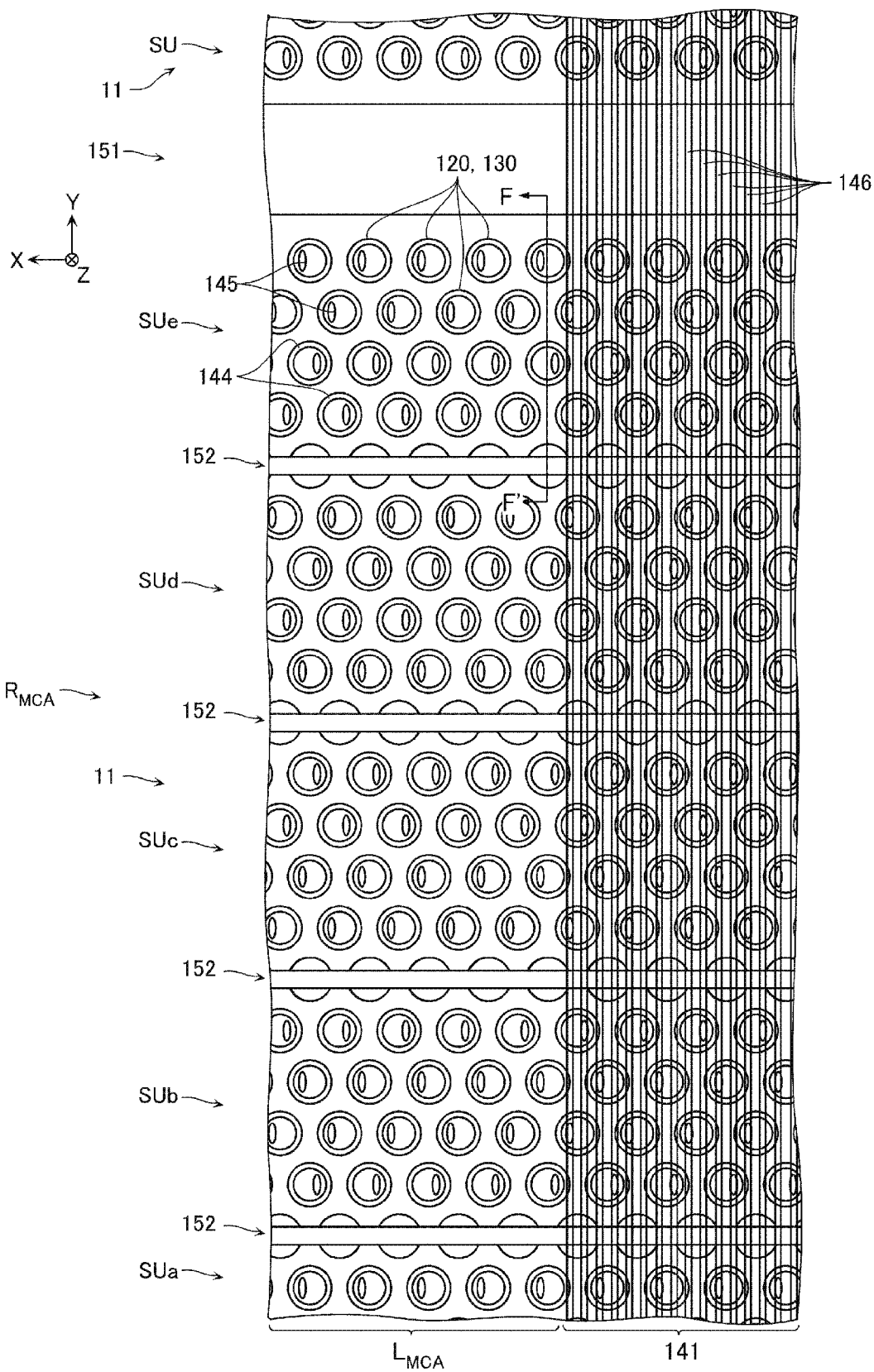
FIG. 8 is a schematic enlarged view of the part E of FIG. 7.
Figure 9:
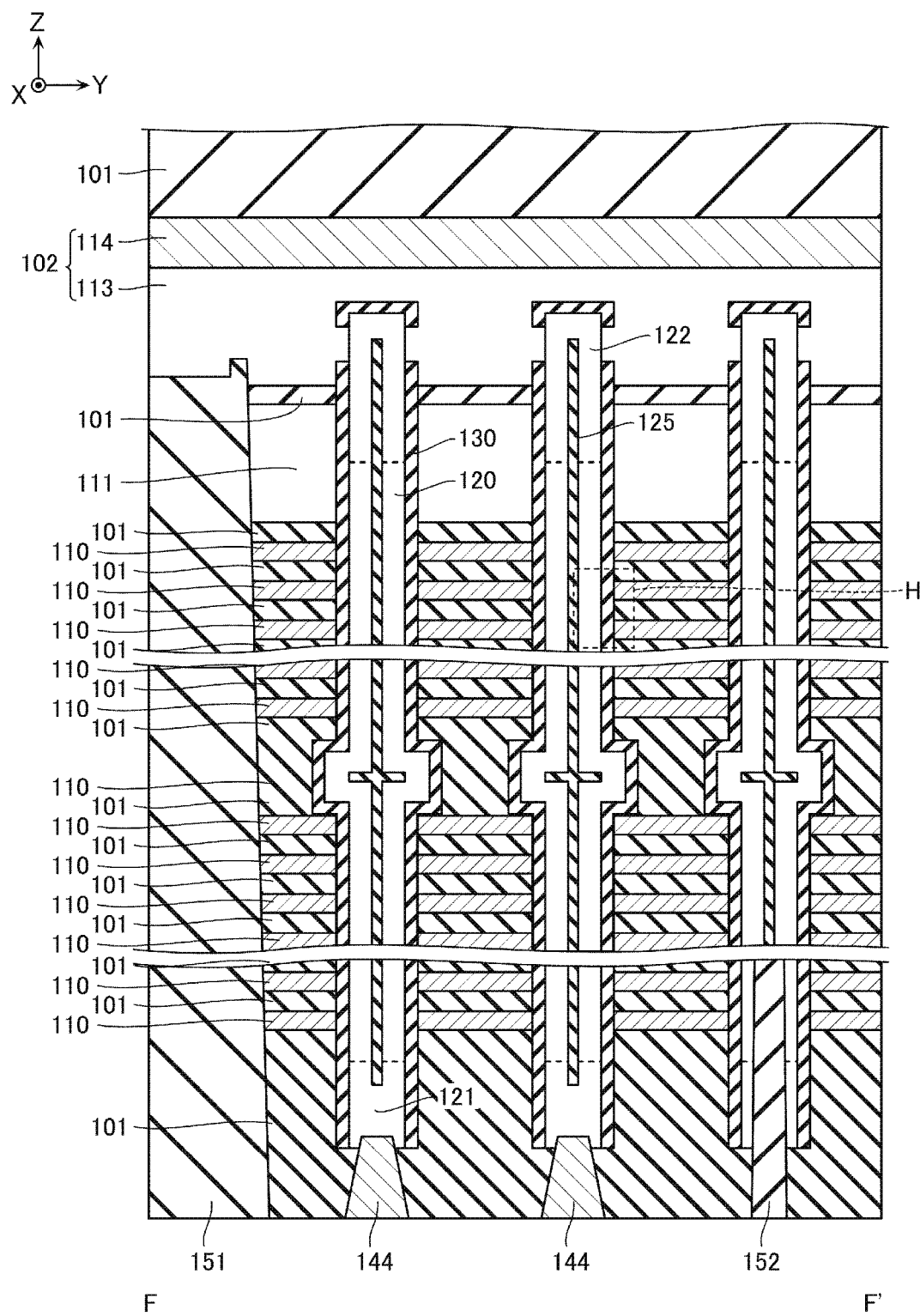
FIG. 9 is a schematic cross-sectional view of the structure shown in FIG. 8 cut along the F-F' line and viewed along the direction of the arrow.
Figure 10:
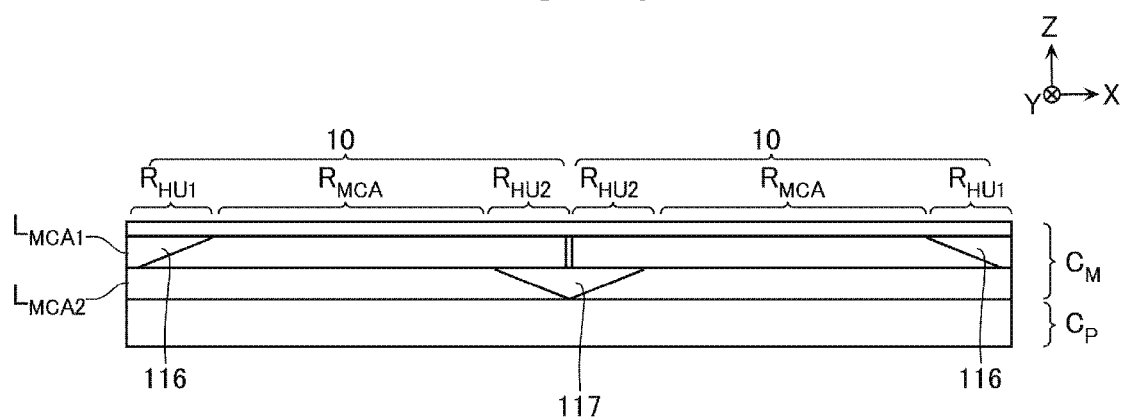
FIG. 10 is a schematic cross-sectional view of the structure shown in FIGS. 2 and 3.
Figure 11:
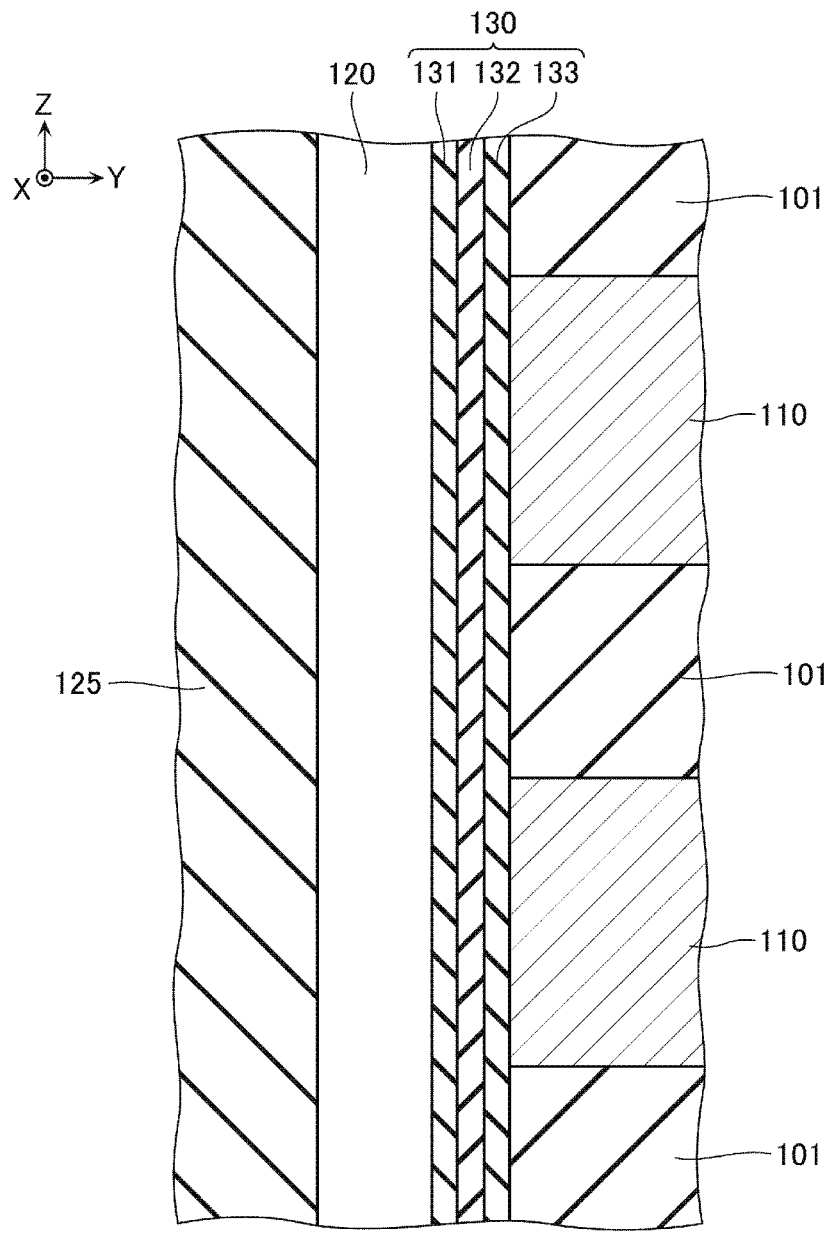
FIG. 11 is a schematic enlarged view of the part H of FIG. 9.
Figure 12:
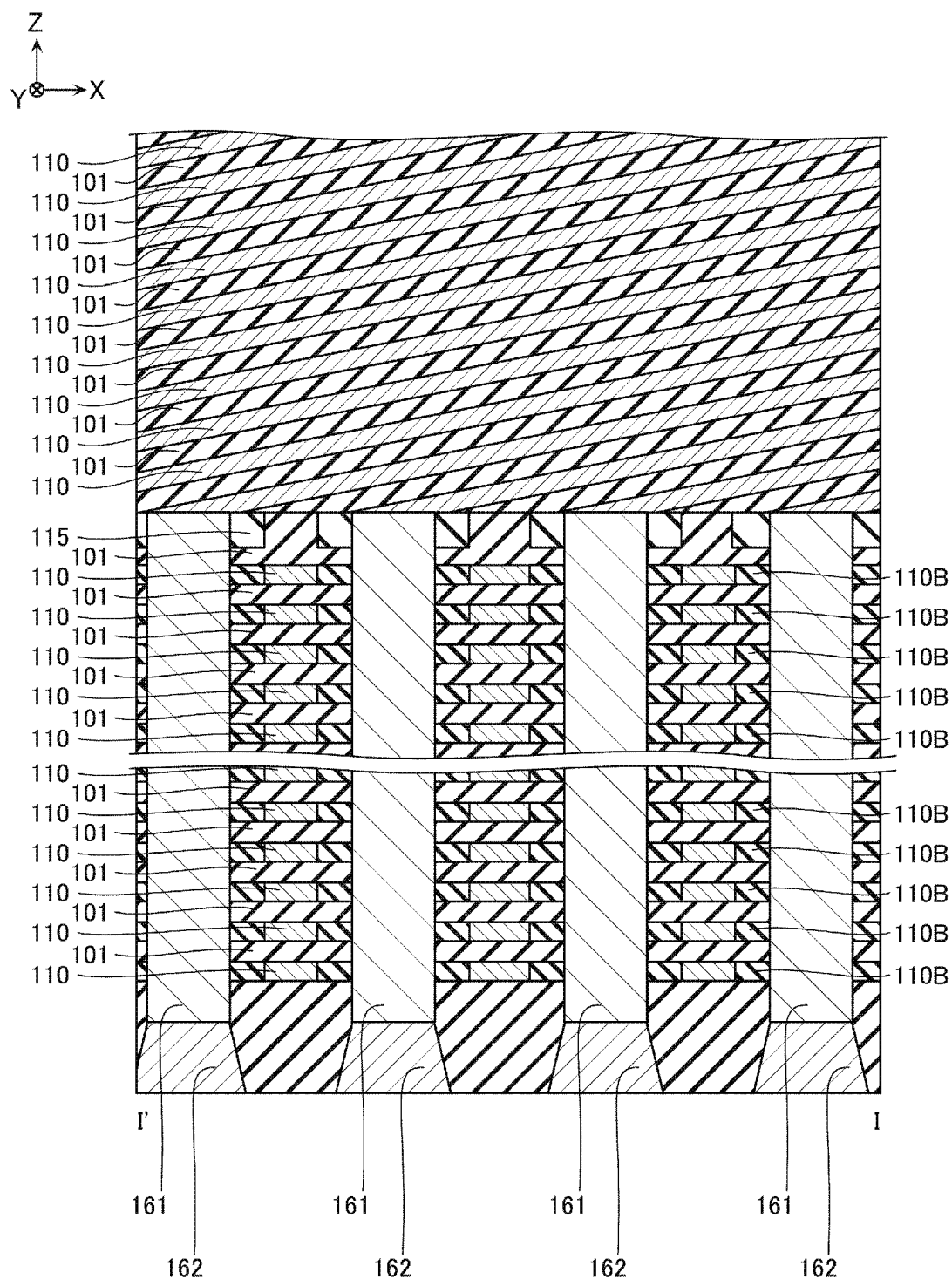
FIG. 12 is a schematic enlarged view of the structure shown in FIG. 4.

FIG. 2 is a schematic bottom view showing a configuration example of the chip $C_M$. The portion surrounded by the unlabeled dotted line in the lower right of FIG. 2 shows the structure inside the front surface of the chip $C_M$ provided with the plurality of first bonded electrodes $P_{I1}$. FIG. 3 is a schematic plan view showing a configuration example of the chip $C_P$. The portion surrounded by the unlabeled dotted line in the lower left of FIG. 3 shows the structure inside the front surface of the chip $C_P$ provided with the plurality of second bonded electrodes $P_{I2}$. FIG. 4 is a schematic cross-sectional view corresponding to the A1-A1' line of FIG. 2 and the B1-B1' line of FIG. 3. FIG. 5 is a schematic cross-sectional view corresponding to the A2-A2' line of FIG. 2 and the B2-B2' line of FIG. 3. FIGS. 4 and 5 show cross sections when the structures shown in FIGS. 2 and 3 are cut along each of the noted reference lines and viewed in the direction of the corresponding arrows. FIG. 6 is a schematic enlarged view of the portion C in FIG. 2. FIG. 7 is a schematic enlarged view of the portion D in FIG. 6. FIG. 8 is a schematic enlarged view of the portion E in FIG. 7. FIG. 9 is a schematic cross-sectional view of the structure shown in FIG. 8 cut along the F-F' line and viewed along the direction of the arrow. FIG. 10 is a schematic cross-sectional view of the structure shown in FIGS. 2 and 3. FIG. 11 is a schematic enlarged view of the portion shown by H in FIG. 9. FIG. 12 is a schematic enlarged view of the structure shown in FIG. 4.

FIGS. 2 to 12 show schematic configurations. For example, in the XZ cross-sectional view shown in FIG. 4, the contacts 161 and 162, and a support structure 153 are shown. However, as shown in FIG. 7, the positions of the contacts 161 and 162, and the support structure 153 may be different in the Y direction. Furthermore, in FIGS. 2 to 12, some configurations/aspects are omitted. For example, bit lines 146 provided in a wiring layer 141 are shown in the right portion of FIG. 8, but the bit lines 146 are not shown in the left portion of FIG. 8. However, as shown in FIG. 4, the bit lines 146 are, in fact, provided over the entire region of a memory cell array region $R_{MCA}$ in this example.

[Structure of Chip $C_M$]

As shown in FIG. 2, the chip $C_M$ includes, for example, four memory planes 10 arranged in the X and Y directions. Each memory plane 10 includes the memory cell array region $R_{MCA}$ (in which a memory cell array MCA is provided) along with a first hookup region $R_{HU1}$ and a second hookup region $R_{HU2}$, which are adjacent to the memory cell array region $R_{MCA}$ in the X direction. In the illustrated example, the first hookup region $R_{HU1}$ is located to the outer side of the memory cell array region $R_{MCA}$. That is, in the memory plane 10 on the right side in FIG. 2, the first hookup region $R_{HU1}$ is disposed on the right side of the memory cell array region $R_{MCA}$ nearest the outer edge of the chip $C_M$. The second hookup region $R_{HU2}$ is located to the inner side of the memory cell array region $R_{MCA}$. That is, in the memory plane 10 on the right side in FIG. 2, the second hookup region $R_{HU2}$ is disposed on the left side of the memory cell array region $R_{MCA}$ away from the outer edge of the chip $C_M$. The chip $C_M$ includes a peripheral area $R_P$ provided on one end side in the Y direction of the four memory planes 10.

As shown in FIGS. 4 and 5, the chip $C_M$ includes a base layer 100, a memory cell array layer $L_{MCA1}$ below the base layer 100, a memory cell array layer $L_{MCA2}$ below the memory cell array layer $L_{MCA1}$, and a plurality of wiring layers (e.g., wiring layers 141, 142, and 143) below the memory cell array layer $L_{MCA2}$.

[Structure of Base Layer 100 of Chip $C_M$]

As shown in FIG. 4, the base layer 100 is provided on the rear surface of the chip $C_M$. The base layer 100 includes an insulating layer 101 and a conductive layer 102, which will be further described with reference to FIG. 9. The base layer 100 also includes a passivation film (not separately depicted) provided on the rear surface side of the chip $C_M$, and a rear surface wiring layer (not separately depicted in FIG. 9) that functions as an external pad electrode $P_X$ (see FIG. 1) or the like.

[Structure of Memory Cell Array Layers $L_{MCA1}$ and $L_{MCA2}$ of Chip $C_M$ in Memory Cell Array Region $R_{MCA}$]

As shown in FIG. 6, memory cell array layers $L_{MCA1}$ and $L_{MCA2}$ (referenced collectively as "$L_{MCA}$" in FIG. 6) are provided with a plurality of memory blocks 11 (individually designated as $11_A$ to $11_H$ in FIG. 6) arranged in the Y direction. As shown in FIG. 7, each memory block 11 includes a plurality of string units SU (individually designated as $SU_a$ to $Su_e$ in FIG. 7) arranged in the Y direction. An inter-block insulating layer 151, such as silicon oxide ($SiO_2$), is provided between two memory blocks 11 adjacent to each other in the Y direction. As shown in FIG. 8, an inter-string-unit insulating layer 152, such as silicon oxide ($SiO_2$), is provided between two string units SU adjacent to each other in the Y direction.

A non-limiting example, as illustrated in FIG. 6, with eight memory blocks 11 arranged in the Y direction (memory blocks $11_A$, $11_B$, $11_C$, $11_D$, $11_E$, $11_F$, $11_G$, and $11_H$) is described here. This example further has, as illustrated in FIG. 7, five string units SU in each memory block 11 (string units SUa, SUb, SUc, SUd, and SUe).

As shown in FIG. 9, each memory block 11 includes a plurality of conductive layers 110 stacked in the Z direction. A plurality of semiconductor layers 120 extending generally in the Z direction are provided penetrating through the plurality of conductive layers 110. A gate insulating film 130 extending generally in the Z direction is provided between each semiconductor layer 120 and the plurality of conductive layers 110.

Each conductive layer 110 is formed in a substantially plate shape extending in the X direction in the memory cell array region $R_{MCA}$. The conductive layer 110 may include a barrier conductive film (e.g., titanium nitride (TiN)) and a stacked film of a metal film (e.g., tungsten (W)). The conductive layer 110 may comprise, for example, polycrystalline silicon doped with impurities (dopants) such as phosphorus (P) or boron (B). An insulating layer 101 (e.g., silicon oxide ($SiO_2$)) is provided between each otherwise adjacent pair of the conductive layers 110 in the Z direction. The plurality of conductive layers 110 can function as gate electrodes and the like of the plurality of memory cells.

A conductive layer 111 is provided above the plurality of conductive layers 110. The conductive layer 111 may comprise, for example, polycrystalline silicon doped with impurities such as phosphorus (P) or boron (B). The insulating layer 101 is provided between the conductive layer 111 and the conductive layer 110.

The conductive layer 102 is provided above the conductive layer 111. In the illustrated example, the conductive layer 102 includes a semiconductor layer 113 connected to the upper end of the semiconductor layer 120 and a conductive layer 114 connected to the upper surface of the semiconductor layer 113. The semiconductor layer 113 may comprise polycrystalline silicon containing impurities such as phosphorus (P) and boron (B). The conductive layer 114 may comprise a metal such as tungsten (W), a conductive material such as tungsten silicide, or another conductive material. The insulating layer 101 is provided between the conductive layer 112 and the conductive layer 111.

As shown in FIG. 8, the semiconductor layers 120 (which may also be referred to as semiconductor pillars, columns, memory pillars, or the like) are arranged in an array-like pattern in the X and Y directions. The semiconductor layer 120 functions as a channel region or the like of a plurality of memory cells. The semiconductor layer 120 is a semiconductor material such as polycrystalline silicon (Si). As shown in FIG. 9, the semiconductor layer 120 has a substantially cylindrical shape, and an insulating layer 125 (e.g., silicon oxide) is provided in the central (interior) portion of the cylindrical shape. The outer peripheral surface of each semiconductor layer 120 is face conductive layers 110. Each conductive layer 110 surrounds a portion of a semiconductor layer 120.

An impurity region 121 containing N-type impurities, such as phosphorus (P), is provided at the lower end of the semiconductor layer 120. The impurity region 121 is connected to a bit line 146 via a contact 144 connected to a contact 145 (see FIGS. 4 and 5).

An impurity region 122 containing either N-type impurities, such as phosphorus (P), or P-type impurities, such as boron (B,) is provided at the upper end of the semiconductor layer 120. The impurity region 122 is connected to the semiconductor layer 113 of the conductive layer 102. The outer peripheral surface of the impurity region 122 is surrounded by the conductive layer 111 and faces the conductive layer 111.

The gate insulating film 130 has a substantially cylindrical shape that covers the outer peripheral surface of the semiconductor layer 120. As shown in FIG. 11, the gate insulating film 130 includes a tunnel insulating film 131, a charge storage film 132, and a block insulating film 133 stacked between the semiconductor layer 120 and the conductive layer 110. The tunnel insulating film 131 and the block insulating film 133 are, for example, insulating films of silicon oxide ($SiO_2$). The charge storage film 132 is a film capable of storing charges, such as, for example, silicon nitride ($Si_3N_4$). The tunnel insulating film 131, the charge storage film 132, and the block insulating film 133 have a substantially cylindrical shape and extend in the Z direction along the outer peripheral surface of the semiconductor layer 120.

FIG. 11 shows an example in which the gate insulating film 130 includes the charge storage film 132. However, the gate insulating film 130 may include a floating gate which may be a polycrystalline silicon containing N-type or P-type impurities.

[Structure of Memory Cell Array Layers $L_{MCA1}$ and $L_{MCA2}$ of Chip $C_M$ in First Hookup Region $R_{HU1}$]

As shown in FIG. 4, the first hookup region $R_{HU1}$ includes an insulating layer 116, and a part of a plurality of conductive layers 110 and conductive layers 111.

The lower surface of the insulating layer 116 is formed at a slope extending in a direction between the X direction and the Z direction (a diagonally downward direction to the left in FIG. 4). The lower surface of the insulating layer 116 slopes downward as the distance from the memory cell array region $R_{MCA}$ increases. The insulating layer 116 may be said to have a wedge shape in this example. In the illustrated example, a gap g is left or formed in the central portion of the insulating layer 116 between an uppermost surface and a lowermost surface of the insulating layer. For example, as shown in FIG. 10, the thickness of the insulating layer 116 in the Z direction increases with distance from the memory cell array region $R_{MCA}$. The maximum value of the thickness of the insulating layer 116 (inclusive of the gap g) in the Z direction is about the same as the thickness of the memory cell array layer $L_{MCA1}$ in the Z direction.

Among the plurality of conductive layers 110 and the conductive layer 111 in the memory cell array layer $L_{MCA1}$, the portions provided in the first hookup region $R_{HU1}$ extend at an angle in a direction between the X direction and Z direction (the diagonally downward direction to the left in FIG. 4) with the slope of the lower surface of the insulating layer 116. The outer X-direction end portions of the conductive layers 110 and the conductive layer 111 angle downward to be at the same level as the lower ends of the memory cell array layer $L_{MCA1}$, which is below the level of all the conductive layers 110 in the memory cell array layer $L_{MCA1}$ within the memory cell array region $R_{MCA}$.

An insulating layer 115 is provided at the lower surface of the end portions of the conductive layers 110 and the conductive layer 111 in the first hookup region $R_{HU1}$. The insulating layer 115 comprises a metal oxide such as aluminum oxide (AlO), hafnium oxide (HfO), or zirconium oxide (ZrO). In the illustrated example, a plurality of spaced insulating layers 115 are provided corresponding to each of the plurality of contacts 161. However, in other examples, instead of the plurality of insulating layers 115, a single insulating layer 115 that covers the lower surface of the memory cell array layer $L_{MCA1}$ may be provided over the entire first hookup region $R_{HU1}$. Furthermore, the insulating layer (s) 115 may be provided over a region other than the first hookup region $R_{HU1}$.

The plurality of conductive layers 110 in the memory cell array layer $L_{MCA2}$ provided in the first hookup region $R_{HU1}$ extends in the X direction parallel to X-Y plane. Therefore, the heights of the end portions of the plurality of conductive layers 110 match with the height of the corresponding conductive layers 110 in the memory cell array region $R_{MCA}$.

A plurality of contacts 161 extending in the Z direction are provided in the first hookup region $R_{HU1}$ of the memory cell array layer $L_{MCA2}$. The contacts 161 penetrate the plurality of conductive layers 110 of the memory cell array layer $L_{MCA2}$ and are connected to an X-direction end portion of conductive layers 110 of the memory cell array layer $L_{MCA1}$. As shown in FIG. 12, a plurality of insulating layers 110B spaced from each other in the Z direction and a plurality of insulating layers 101 provided between the plurality of insulating layers 110B. These insulating layers 101 and 110B are provided on the outer peripheral surface of the contacts 161. Each of the insulating layers 110B is provided between a contact 161 and a conductive layer 110 and comprises silicon oxide (SiO$_2$) or the like. In some examples, the insulating layer 110B may include or comprise gaps (unfilled voids, or seams). Each contact 161 is insulated from the conductive layers 110 by the insulating layers 110B. The lower end of each contact 161 is connected to the upper end of a contact 162 extending in the Z direction. As illustrated in FIG. 4, the plurality of contacts 162 are connected to the configuration in the chip $C_P$ via the wirings 147 and 148 and the first bonded electrode $P_{I1}$ in the wiring layers 141, 142, and 143. The contacts 161 and 162 each comprise, for example, a barrier conductive film (e.g., titanium nitride (TiN)) and a stacked film of a metal film (e.g., tungsten (W)).

As shown in FIG. 4, among the plurality of contacts 161 arranged along the X direction, the one closest to the memory cell array region $R_{MCA}$ is connected to the first conductive layer 110 as counted from the bottom of the memory cell array layer $L_{MCA1}$. The second closest one of the contacts 161 to the memory cell array region $R_{MCA}$ is connected to the second conductive layer 110 as counted from the bottom of the memory cell array layer $L_{MCA1}$. Similarly, the a-th (where a is a natural number) closest one of the contacts 161 to the memory cell array region $R_{MCA}$ is connected to the a-th conductive layer 110 as counted from the bottom of the memory cell array layer $L_{MCA1}$.

The first hookup region $R_{HU1}$ is provided with the support structures 153 provided in the vicinity of the contacts 161 and 162. Each support structure 153 extends in the Z direction, as shown in FIG. 4. The support structure 153 comprises, for example, silicon oxide (SiO$_2$).

[Structure of Memory Cell Array Layers $L_{MCA1}$ and $L_{MCA2}$ of Chip $C_M$ in Second Hookup Region $R_{HU2}$]

As shown in FIG. 4, the second hookup region $R_{HU2}$ is provided with a part of the plurality of conductive layers 110 and the conductive layer 111, and an insulating layer 117.

The conductive layers 110 and the conductive layer 111 of the memory cell array layer $L_{MCA1}$ in the second hookup region $R_{HU2}$ extend in the X direction. Therefore, the height of the end portions of these conductive layers 110 and conductive layer 111 coincide with the height of the corresponding conductive layers 110 and conductive layer 111 in the memory cell array region $R_{MCA}$.

The insulating layer 117 is provided on the lower surface of the memory cell array layer $L_{MCA1}$ located in the second hookup region $R_{HU2}$. The lower surface of the insulating layer 117 is formed as a slope extending at an angle in a direction between the X direction and the Z direction (the diagonally downward direction to right in FIG. 4) so as to be located increasingly downward as the distance from the memory cell array region $R_{MCA}$ increases. The insulating layer 117 may be said to have a wedge shape in this example. In the illustrated example, a gap g is provided in the central portion of the insulating layer 117 between the uppermost and lowermost surfaces of the insulating layer 117. As shown in FIG. 10, the thickness of the insulating layer 117 in the Z direction is increases with distance from the memory cell array region $R_{MCA}$. The maximum value of the thickness of the insulating layer 117 (inclusive of gap g) in the Z direction is about the same as the thickness of the memory cell array layer $L_{MCA2}$ in the Z direction.

Among the conductive layers 110 in the memory cell array layer $L_{MCA2}$, the portions provided in the second hookup region $R_{HU2}$ extend at an angle in a direction between the X direction and the Z direction (the diagonally downward direction to the right in FIG. 4) corresponding to the slope of the lower surface of the insulating layer 117. The height of the X-direction ends of the conductive layers 110 coincide with the lower surface of the memory cell array layer $L_{MCA2}$. This height position is lower than the lowest height position of all the conductive layers 110 in the memory cell array layer $L_{MCA2}$ within the memory cell array region $R_{MCA}$.

The ends of conductive layers 110 are connected to the upper ends of contacts 162 extending in the Z direction. As illustrated in FIG. 4, the plurality of contacts 162 are connected to the configuration in the chip $C_P$ via the wirings 147 and 148, and the first bonded electrode $P_{I1}$ in the wiring layers 141, 142, and 143.

As shown in FIG. 6, ends of the plurality of conductive layers 110 in the X direction are located in second hookup region $R_{HU2}$. One part of the second hookup region $R_{HU2}$ is referred to as a contact connection small region $r_{C1}$. Another part of the second hookup region $R_{HU2}$ is referred to as a contact connection small region $r_{C2}$.

As shown in FIG. 7, a plurality of contacts 162 arranged in a matrix in the X direction and the Y direction are provided in the contact connection small region $r_{C1}$. Among contacts 162 aligned with each other along the X direction, the one closest to the memory cell array region $R_{MCA}$ is connected to the first conductive layer 110 (as counted from the bottom of the memory cell array layer $L_{MCA2}$). The second closest one to the memory cell array region $R_{MCA}$ is connected to the second conductive layer 110 as counted from the bottom. Similarly, the b-th (where b is a natural number) closest one to the memory cell array region $R_{MCA}$ is connected to the b-th conductive layer 110 as counted from the bottom.

Some of the contacts 162 arranged along the X direction are in the contact connection small region $r_{C2}$. In FIG. 7, among these contacts 162 arranged along the X direction, the one closest to the memory cell array region $R_{MCA}$ is connected to the fifth conductive layer 110 as counted from the bottom of the memory cell array layer $L_{MCA2}$. The second closest one to the memory cell array region $R_{MCA}$ is connected to the sixth conductive layer 110 as counted from the bottom of the memory cell array layer $L_{MCA2}$. Similarly, among these contacts 162 arranged in the X direction in the contact connection small region $r_{C2}$, the c-th (where c is a natural number) closest one to the memory cell array region $R_{MCA}$ is connected to the (c+4)th conductive layer 110 counted from the bottom of the memory cell array layer $L_{MCA2}$.

As shown in FIG. 7, the second hookup region $R_{HU2}$ is provided with support structures 153 in the vicinity of the contacts 161 and 162.

[Structure of Wiring Layers 141, 142, and 143 of Chip $C_M$]

As shown in FIGS. 4 and 5, a plurality of wirings are in each of the wiring layers 141, 142, and 143. Such wirings are electrically connected to at least one of the configurations in the memory cell array layers $L_{MCA1}$ and $L_{MCA2}$, or the configurations in the chip $C_P$, for example.

A wiring layer 141 includes a plurality of wirings 147. The plurality of wirings 147 may include, for example, a barrier conductive film (e.g., titanium nitride (TiN)) and a stacked film of a metal film (e.g., copper (Cu)). Some of the wirings 147 function as the bit lines 146. As shown in FIG. 8, each bit line 146 is aligned in the X direction and extends in the Y direction. Further, each of the bit lines 146 is connected to one semiconductor layer 120 in each string unit SU.

A wiring layer 142 includes a plurality of wirings 148, as shown in FIGS. 4 and 5. The plurality of wirings 148 may include, for example, a barrier conductive film (e.g., titanium nitride (TiN)) and a stacked film of a metal film (e.g., copper (Cu)).

A wiring layer 143 includes a plurality of first bonded electrodes $P_{I1}$. The plurality of first bonded electrodes $P_{I1}$ may include, for example, a barrier conductive film (e.g., titanium nitride (TiN)) and a stacked film of a metal film (e.g., copper (Cu)).

[Structure of Chip $C_P$]

As shown in FIG. 3, the chip $C_P$ includes four peripheral circuit regions $R_{PC}$ arranged in the X and Y directions corresponding to the memory planes 10. Further, the chip $C_P$ includes a circuit region $R_C$ provided in a region facing the peripheral region $R_P$.

As shown in FIGS. 4 and 5, the chip $C_P$ includes a semiconductor substrate 200, a plurality of transistors Tr provided on the front surface of the semiconductor substrate 200, and a plurality of wiring layers 141',142',143',144', and 145' provided above the plurality of transistors Tr. The semiconductor substrate 200 is, for example, a semiconductor substrate made of P-type silicon (Si) containing P-type dopant such as boron (B). The wiring layer 141' is a wiring layer containing a conductive material such as tungsten (W). The wiring layer 142' is a wiring layer containing a conductive material such as copper (Cu). The wiring layer 143' is a wiring layer containing a conductive material such as copper (Cu). The wiring layer 144' is a wiring layer containing a conductive material such as copper (Cu) or aluminum (Al). The wiring layer 145' is a wiring layer containing a conductive material such as copper (Cu) and includes a plurality of second bonded electrodes Piz.

[Manufacturing Method]

Next, a manufacturing method of the memory die MD will be described with reference to FIGS. 13 to 42. In particular, FIGS. 13 to 16, 18 to 26, and 36 to 38 are schematic cross-sectional views illustrating aspects of the manufacturing method and show a cross section corresponding to FIG. 4. FIGS. 17 and 35 are schematic cross-sectional views for illustrating aspects of the manufacturing method and show the bottom surface corresponding to FIG. 8. FIGS. 27 to 32 are schematic cross-sectional views for illustrating aspects of the manufacturing method and show a cross section corresponding to FIG. 12. FIGS. 33, 34, 36, and 37 are schematic cross-sectional views for illustrating aspects of the manufacturing method and show a cross section corresponding to FIG. 5. FIGS. 39 to 42 are schematic cross-sectional views for illustrating aspects of the manufacturing method and show a cross section corresponding to FIG. 10.

Figure 13:
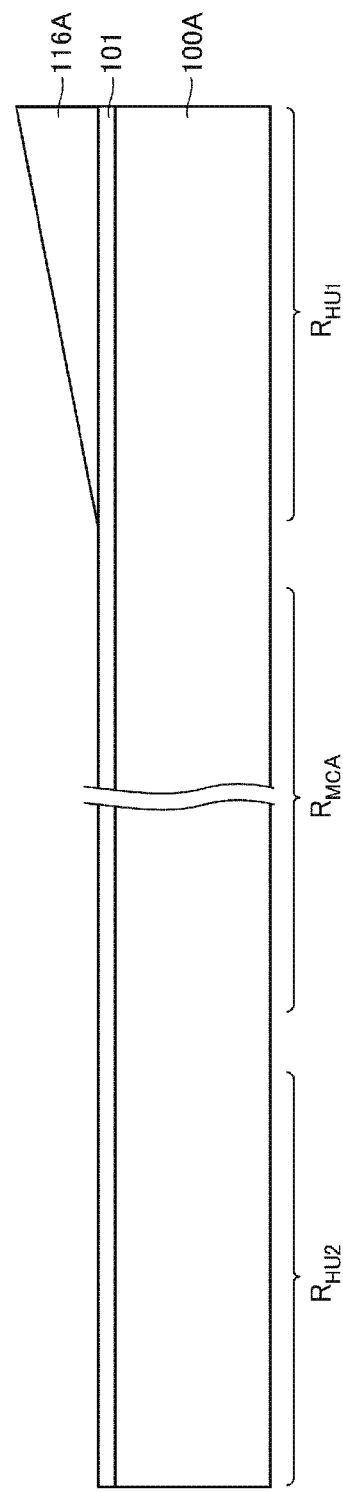
FIGS. 13-42 are schematic cross-sectional views illustrating aspects of a manufacturing method of the memory die MD according to a first embodiment.

When manufacturing the memory die MD according to the present embodiment, a semiconductor wafer 100A is processed as shown in FIG. 13. The insulating layer 101 is formed on the upper surface of the semiconductor wafer 100A. This process is performed by, for example, a method such as chemical vapor deposition (CVD).

Next, as shown in FIG. 13, an insulating layer 116A (e.g., silicon oxide) is formed on the upper surface of the insulating layer 101. For this process, silica paste or the like is applied to the upper surface of the insulating layer 101. Next, a mold is pressed against the applied silica paste. This mold has a slope at a position corresponding to the lower surface of the insulating layer 116 (FIG. 4). The applied silica paste is then cured.

Figure 14:
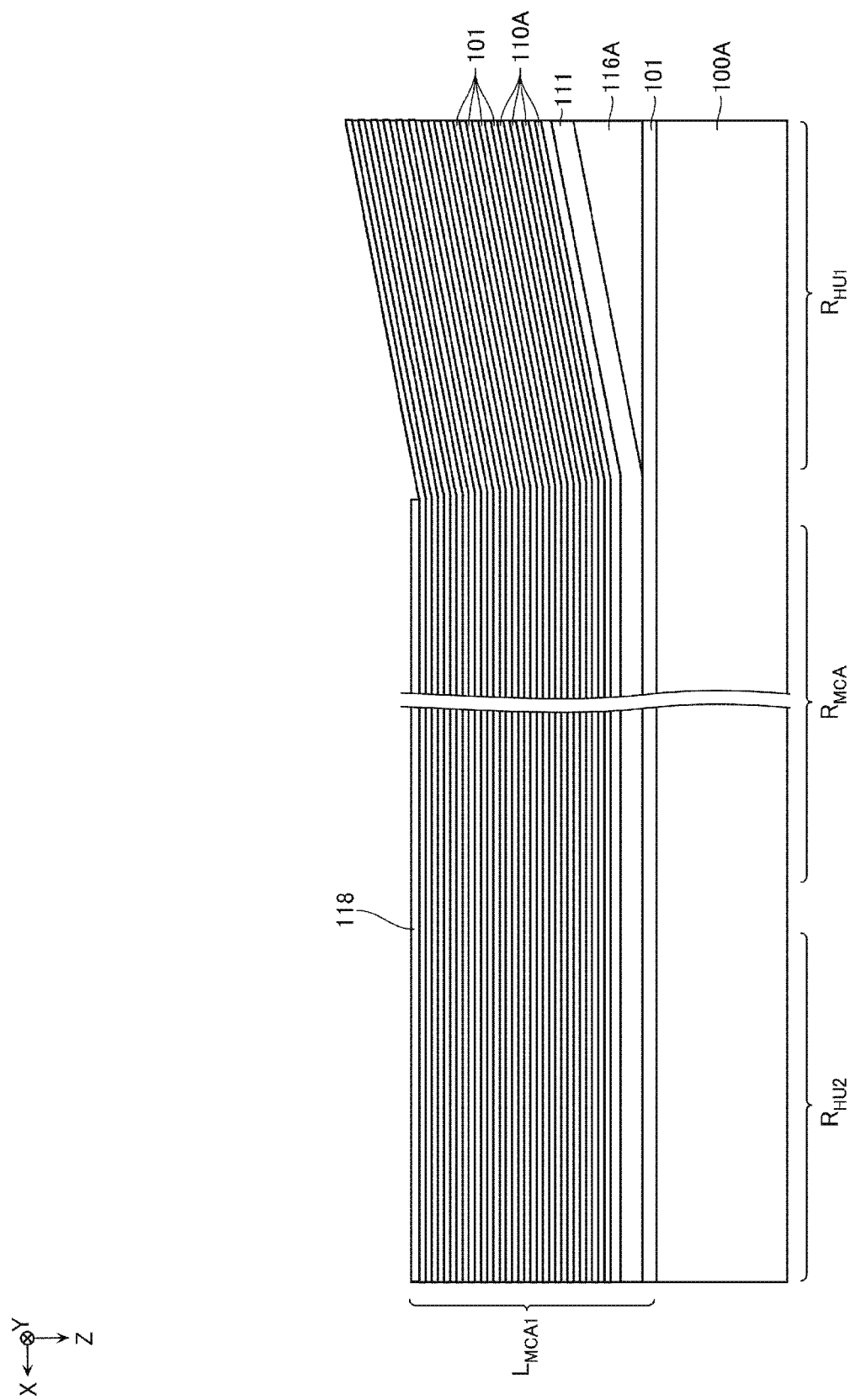

Next, as shown in FIG. 14, the conductive layer 111 and the insulating layer 101 are formed on the upper surfaces of the insulating layer 101 and the insulating layer 116A. Further, a plurality of sacrificial layers 110A and insulating layers 101 are alternately formed. The sacrificial layer 110A comprises, for example, silicon nitride (SiN) or the like. This process is performed by, for example, a method such as CVD.

Next, as shown in FIG. 14, a stopper layer 118 made of silicon (Si) or the like is formed on the upper surface of the sacrificial layer 110A located at the uppermost layer. The stopper layer 118 covers the configuration in the memory cell array region $R_{MCA}$ and the second hookup region $R_{HU2}$ and exposes the configuration in the first hookup region $R_{HU1}$. In this process, a film of silicon or the like is formed by a method such as CVD. A portion of the silicon film provided in the first hookup region $R_{HU1}$ is removed by a method such as photolithography and etching.

Figure 15:
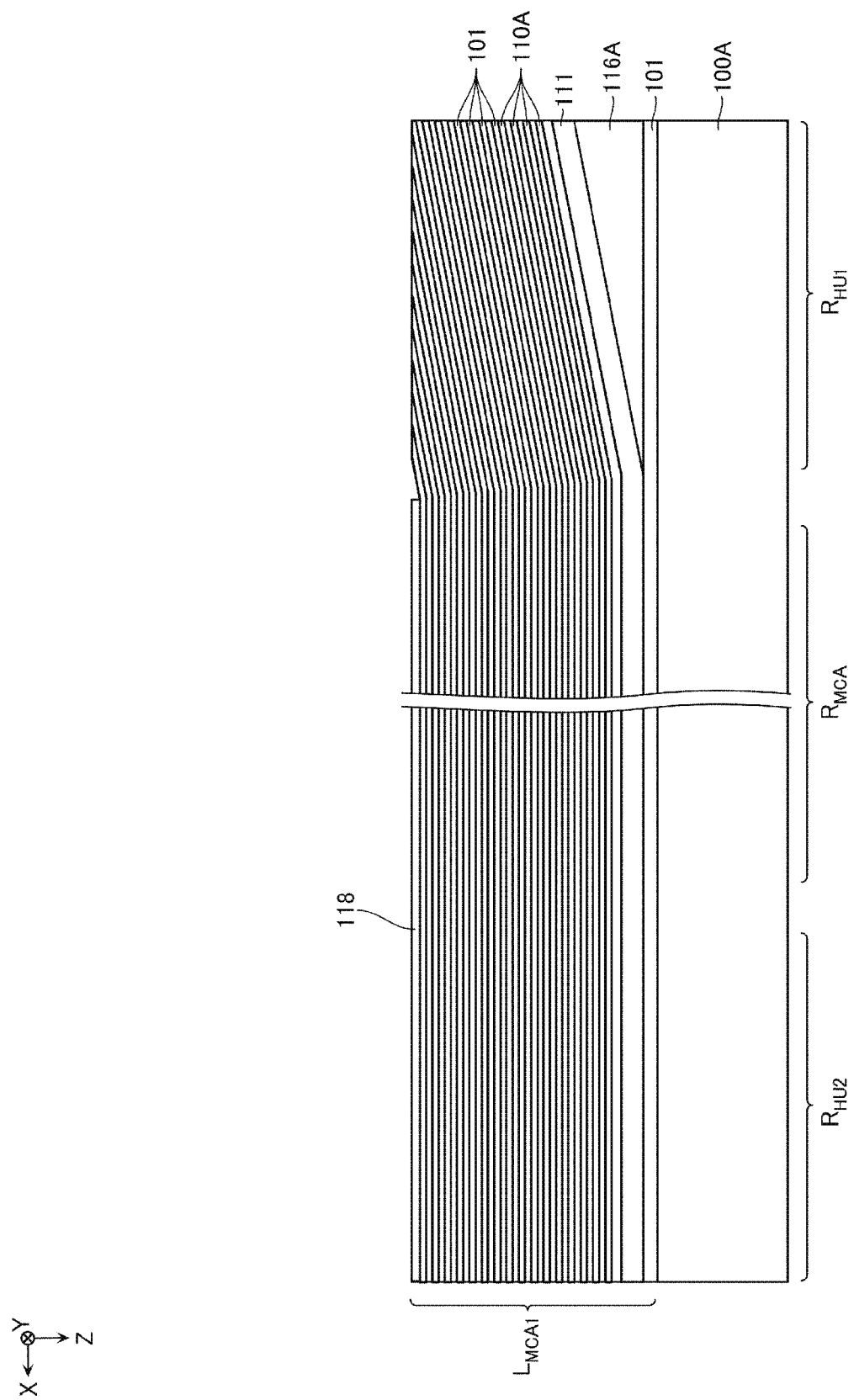

Next, as shown in FIG. 15, a part of the portion of the plurality of sacrificial layers 110A and insulating layers 101 provided in the first hookup region $R_{HU1}$ is removed. In this process, a planarization process, such as chemical mechanical polishing (CMP), using the stopper layer 118 as a stopper is performed. By this process, the conductive layer 111, and the other ends of the plurality of sacrificial layers 110A and insulating layers 101 in the X direction (the right end in FIG. 15) are exposed. After executing this process, the stopper layer 118 is removed.

Figure 16:
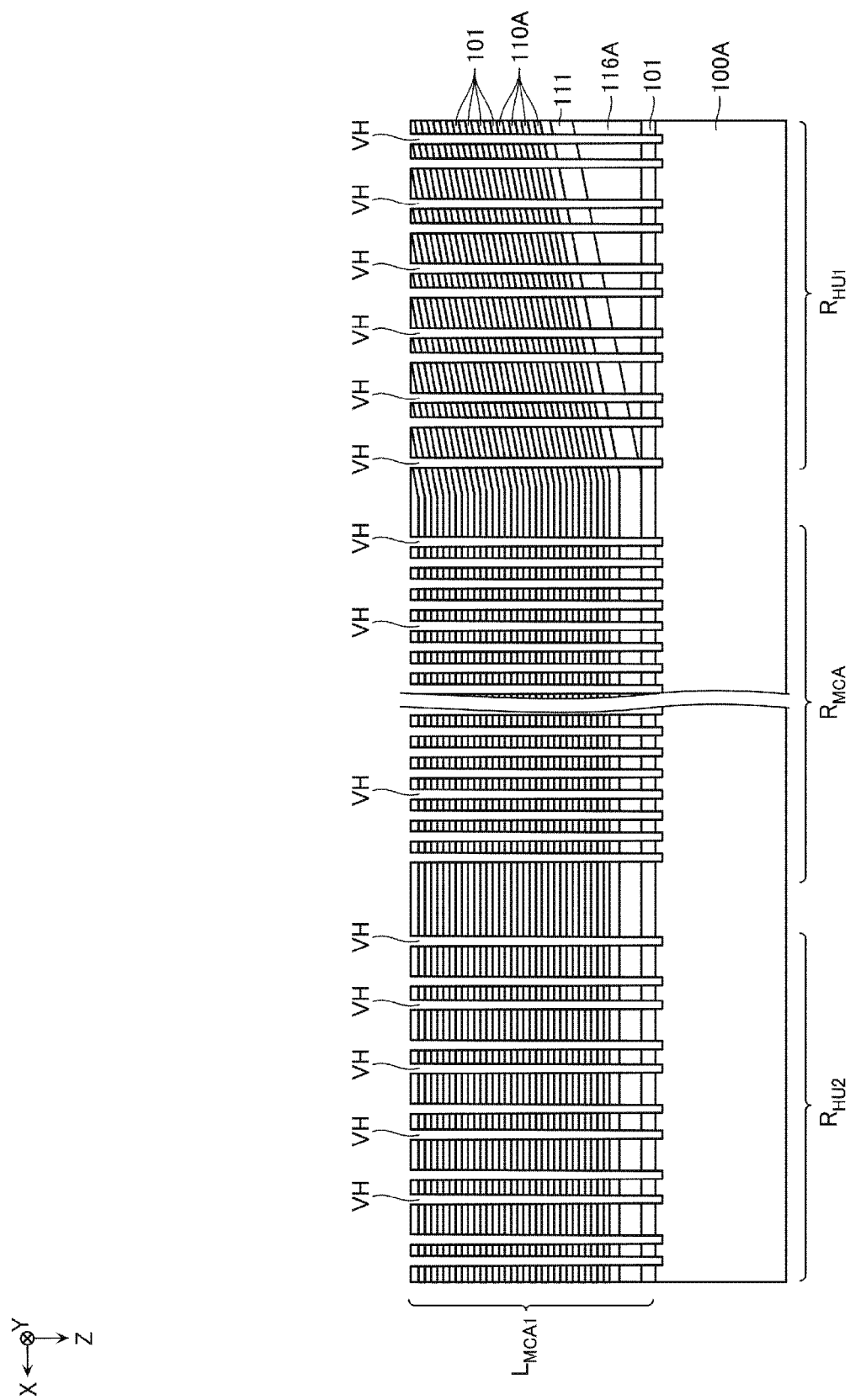
Figure 17:
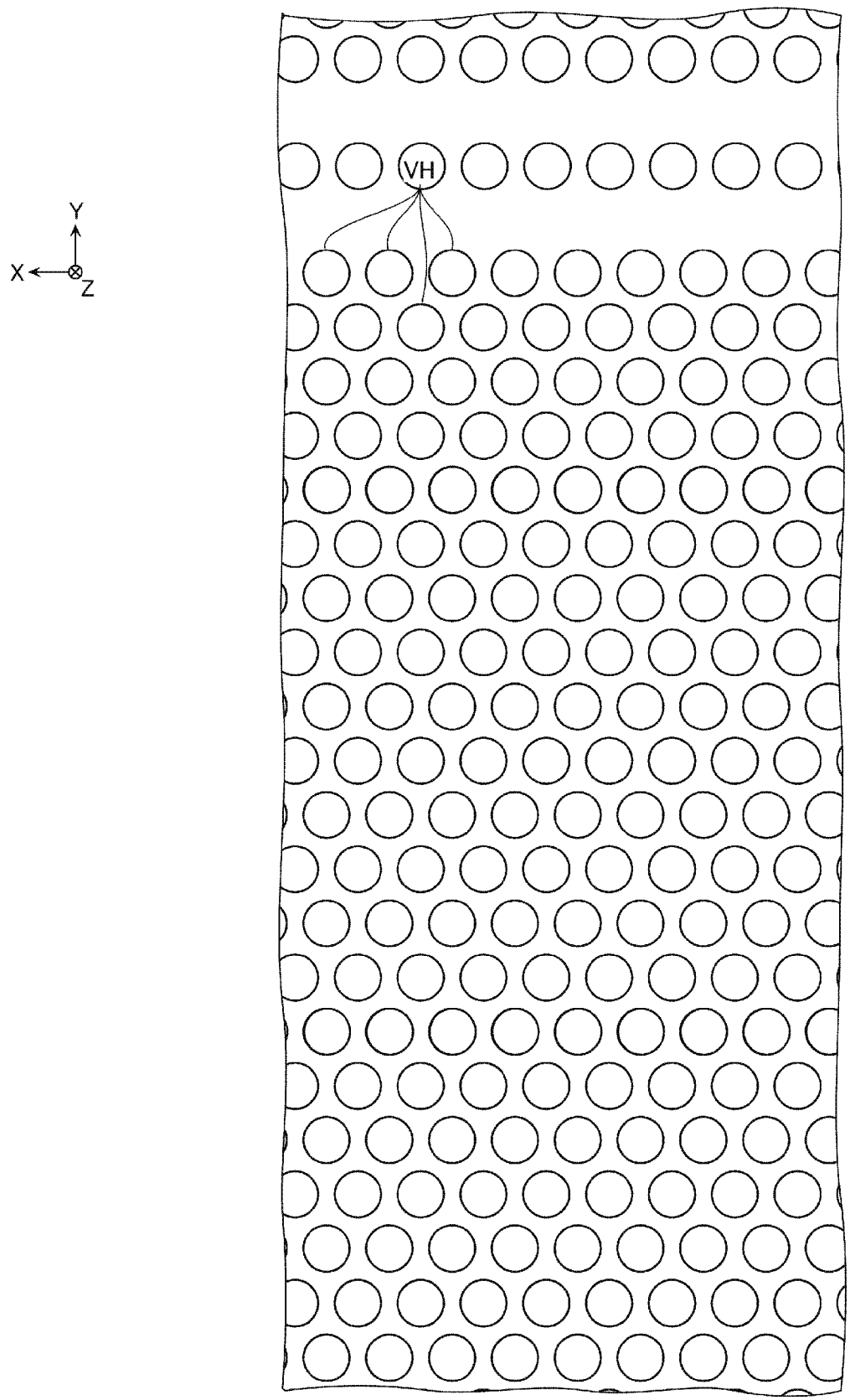

Next, as shown in FIG. 16, a plurality of via holes VH are formed. A via hole VH extends in the Z direction and penetrates the insulating layers 101, the sacrificial layers 110A, the conductive layer 111, the insulating layer 116A, and the like. This process is performed by a method such as RIE. As shown in FIG. 16, the via hole VH is provided at a position corresponding to the semiconductor layer 120 and a position corresponding to the support structure 153. As shown in FIG. 17, the via hole VH is also provided at a position corresponding to the inter-block insulating layer 151.

Figure 18:
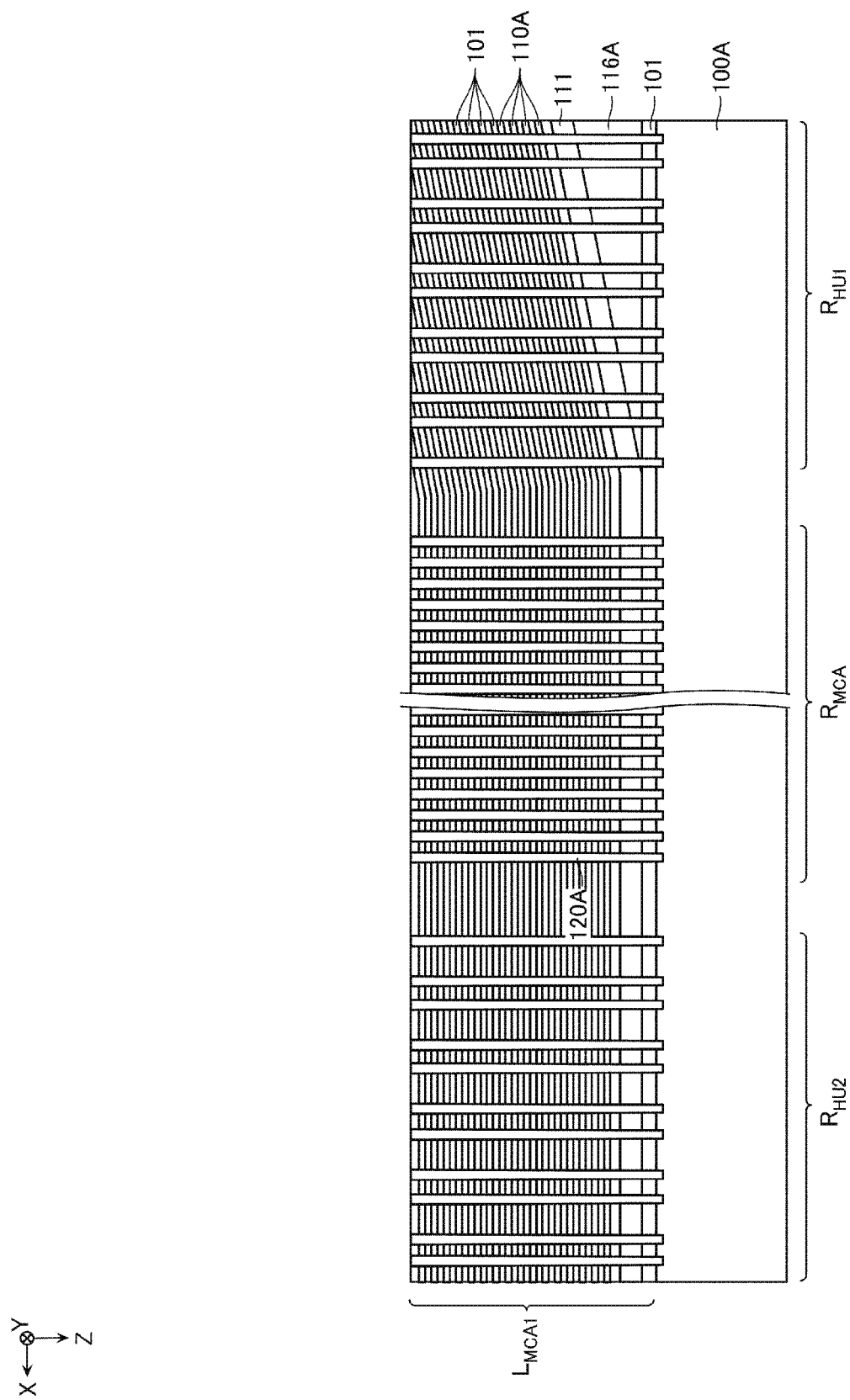

Next, as shown in FIG. 18, a sacrificial film 120A is formed on the inner peripheral surface of the via hole VH. The sacrificial film 120A contains a material also contained in the sacrificial layer 110A but a material different from the material contained in the insulating layer 101. The sacrificial film 120A contains, for example, silicon (Si) or metal. This process is performed by a method such as CVD. In this process, before the sacrificial film 120A is formed, an insulating film, such as silicon oxide ($SiO_2$) or silicon nitride (SiN) may be formed, or an oxidation treatment, a nitriding treatment, or the like may be performed.

Figure 19:
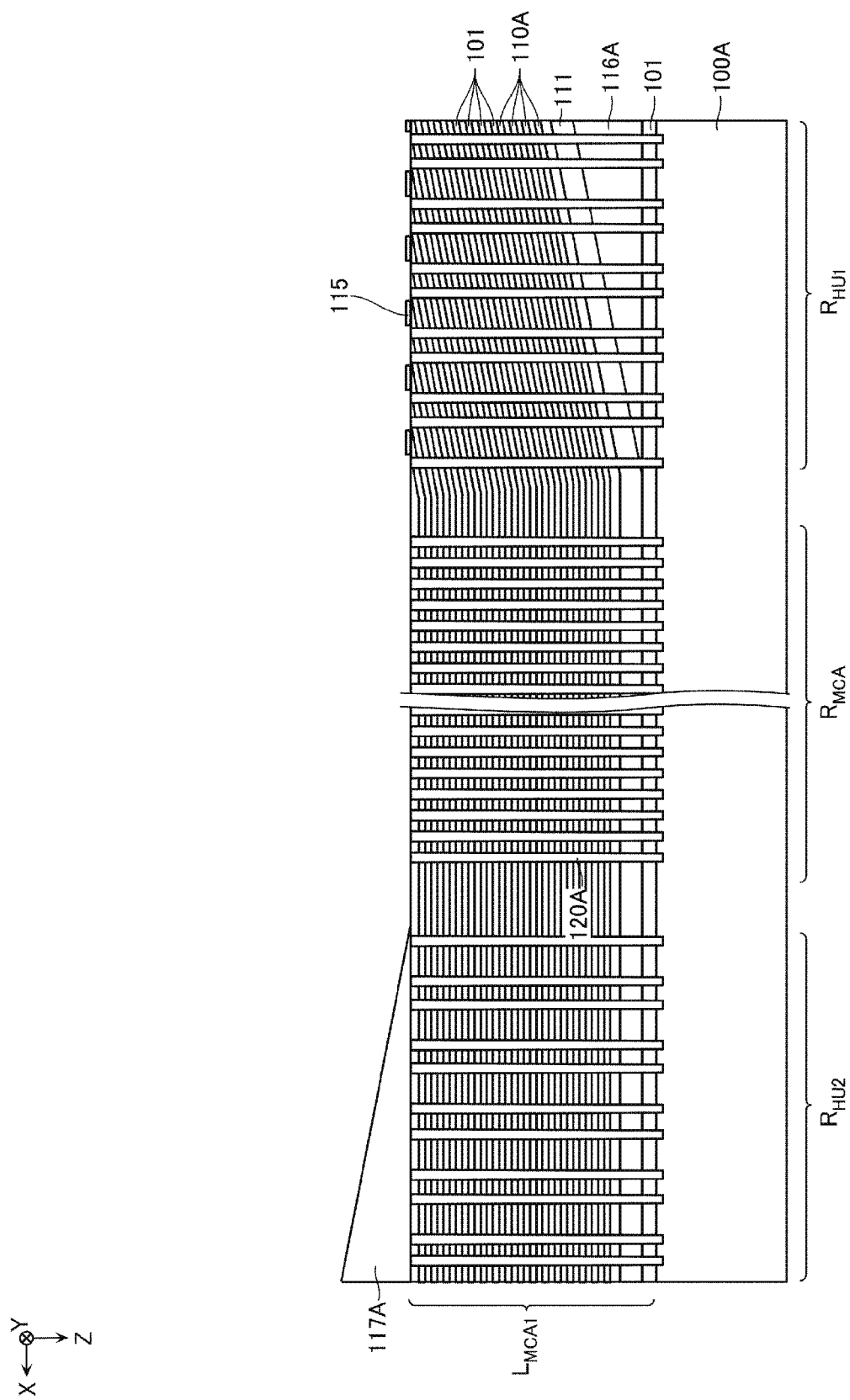

Next, as shown in FIG. 19, for example, the insulating layer 115 is formed at a position corresponding to the upper end of the contact 161 on the upper surface of the structure described with reference to FIG. 18.

Next, as shown in FIG. 19, for example, the insulating layer 117A is formed on the upper surface of the structure described with reference to FIG. 18 at the portion located in the second hookup region $R_{HU2}$. In this step, for example, silica paste or the like is applied to the upper surface of the structure described with reference to FIG. 18. Next, a mold is pressed against the applied silica paste. This mold has a slope at a position corresponding to the lower surface of the insulating layer 117 (FIG. 4). Next, the applied silica paste is cured.

Figure 20:
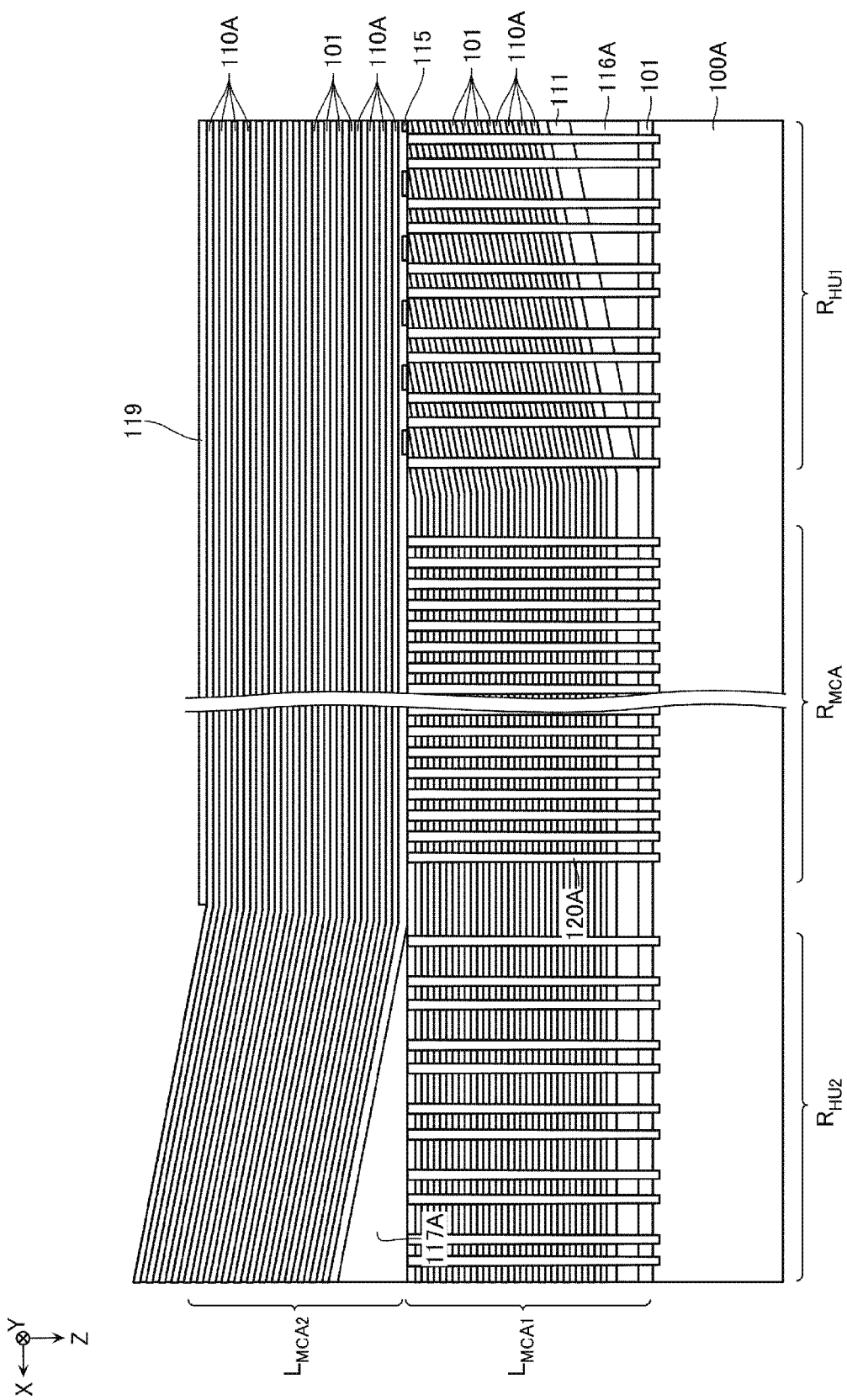

Next, as shown in FIG. 20, for example, the plurality of sacrificial layers 110A and insulating layers 101 are alternately formed on the upper surfaces of the insulating layer 101 and the insulating layer 117A. This process is performed by, for example, a method such as CVD.

Next, as shown in FIG. 20, for example, a stopper layer 119 such as silicon (Si) is formed on the upper surface of the sacrificial layer 110A located at the uppermost layer. The stopper layer 119 covers the configuration in the memory cell array region $R_{MCA}$ and the first hookup region $R_{HU1}$ and exposes the configuration in the second hookup region $R_{HU2}$. In this process, for example, a film of silicon or the like is formed by a method such as CVD. Further, a portion of the film-formed silicon provided in the second hookup region $R_{HU2}$ is removed by a method such as photolithography and etching.

Figure 21:
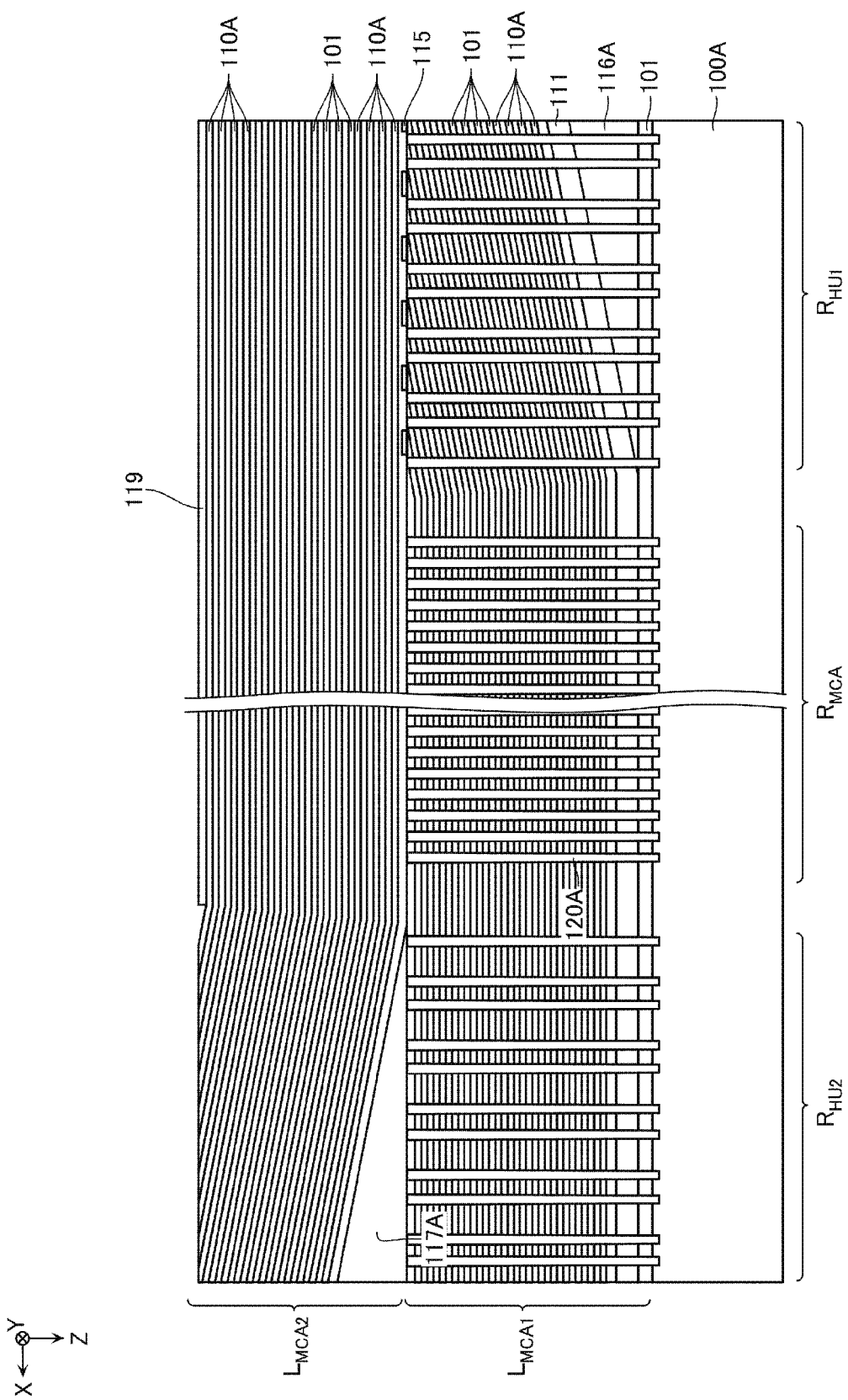

Next, as shown in FIG. 21, for example, a part of the portion of the plurality of sacrificial layers 110A and insulating layers 101 provided in the second hookup region $R_{HU2}$ is removed. In this step, for example, a planarization process such as CMP using the stopper layer 119 as a stopper is performed. By this process, one ends of the plurality of sacrificial layers 110A and insulating layers 101 in the X direction (the left end in FIG. 21) are exposed. After executing this process, the stopper layer 119 is removed.

Figure 22:
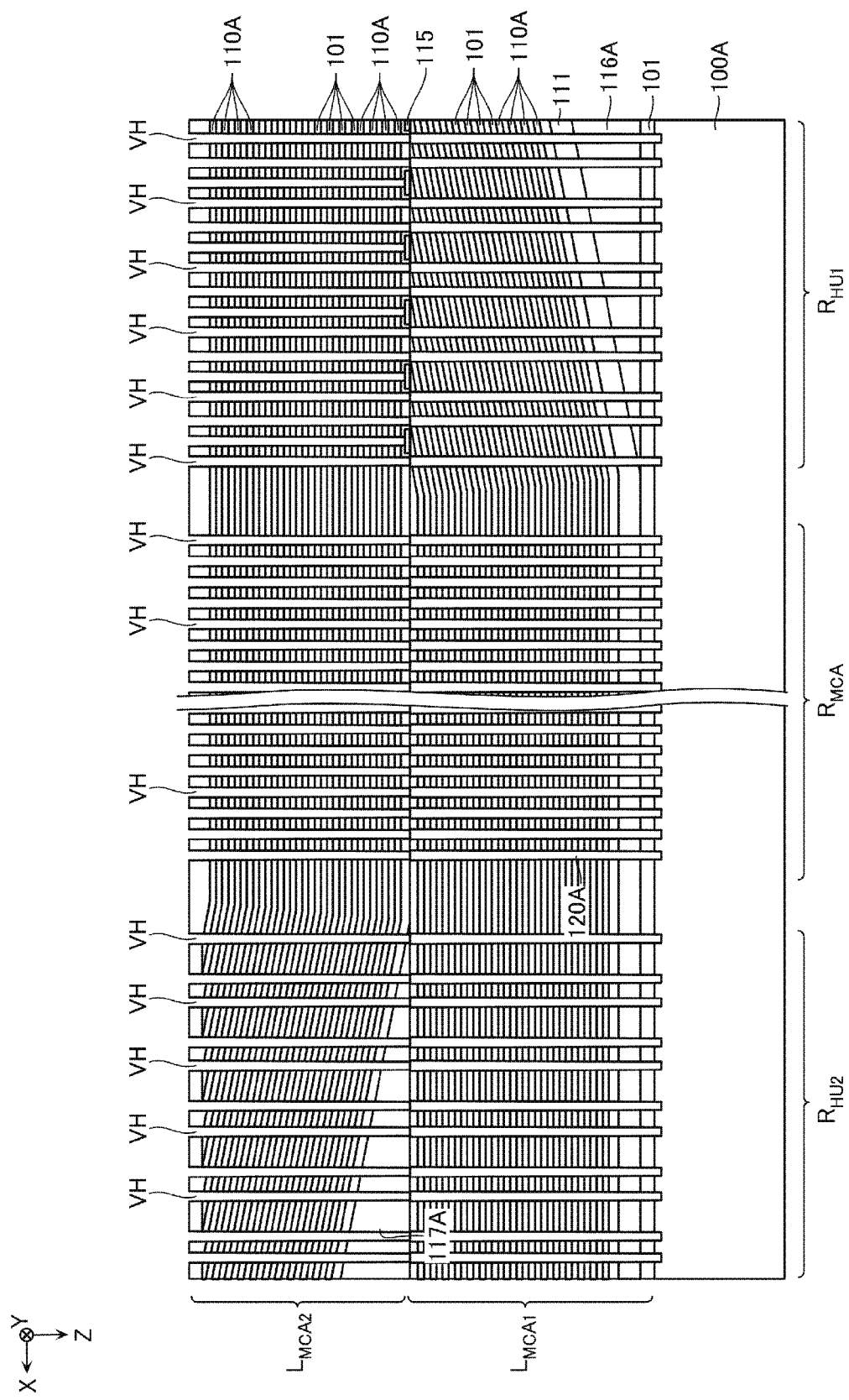

Next, as shown in FIG. 22, a plurality of via holes VH are formed. The via hole VH extends in the Z direction, penetrates the insulating layers 101 and the sacrificial layers 110A, and exposes the upper end of the sacrificial film 120A or the upper surface of the insulating layer 115. This process is performed by, for example, a method such as RIE. As shown in FIG. 22, for example, a via hole VH is provided at a position corresponding to the semiconductor layer 120, a position corresponding to the support structure 153, and a position corresponding to the contact 161. Further, a via hole VH is provided at a position corresponding to the inter-block insulating layer 151.

Figure 23:
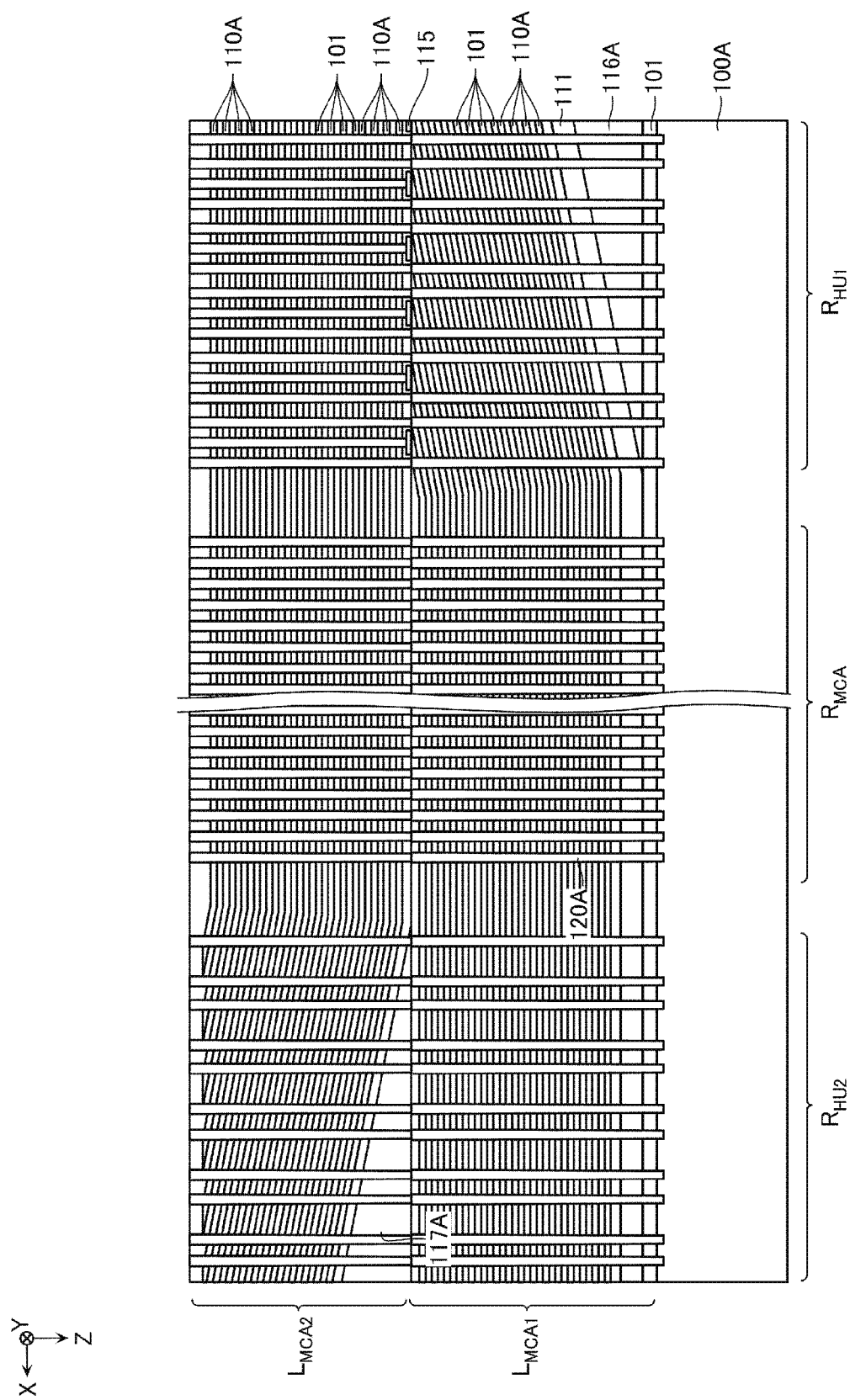

Next, as shown in FIG. 23, the sacrificial film 120A is formed on the inner peripheral surface of the via holes VH. This process is performed by, for example, a method such as CVD.

Figure 24:
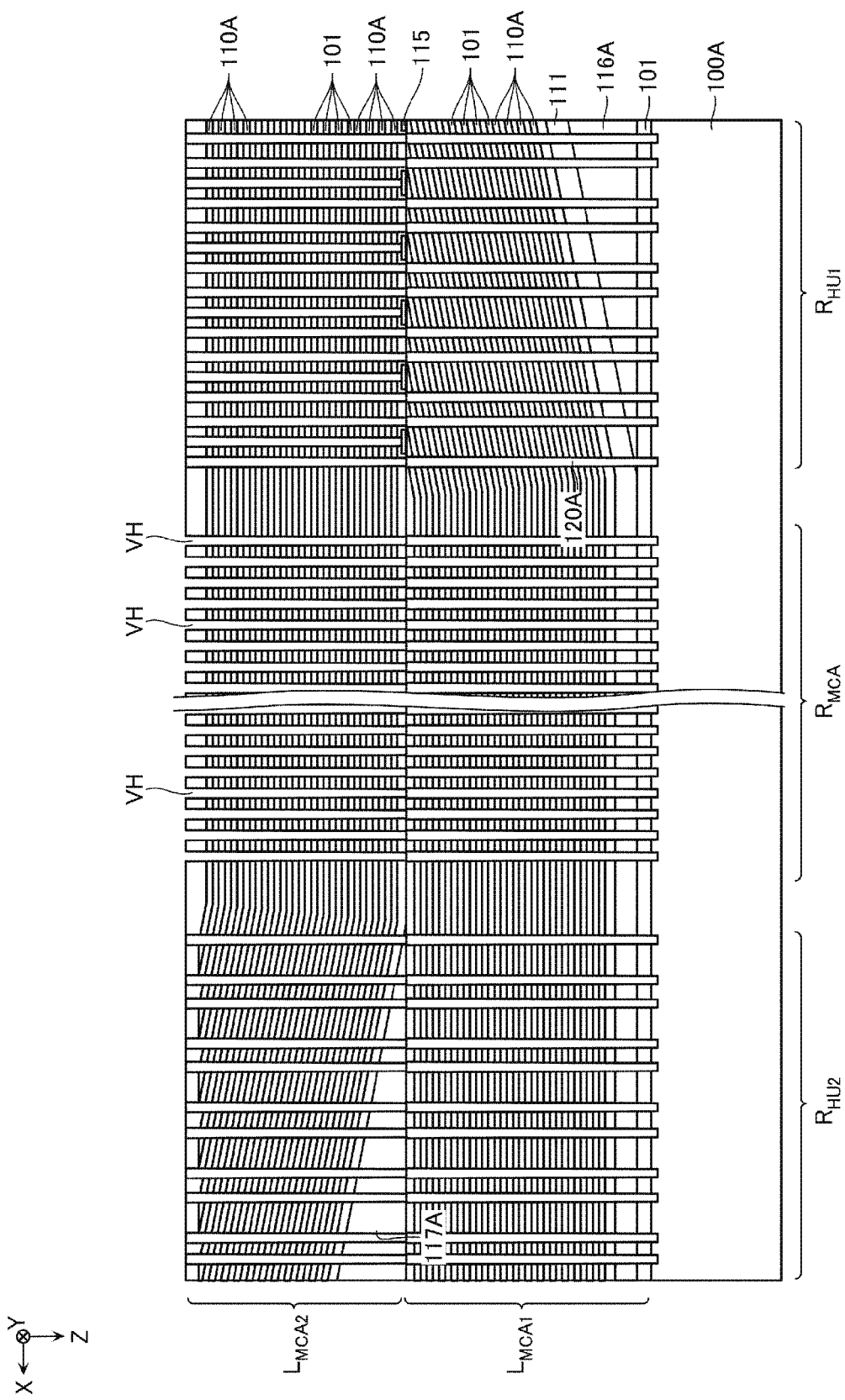

Next, as shown in FIG. 24, the sacrificial film 120A provided inside the via holes VH located in the memory cell array region $R_{MCA}$ is removed. This process is performed, for example, by wet etching or the like.

Figure 25:
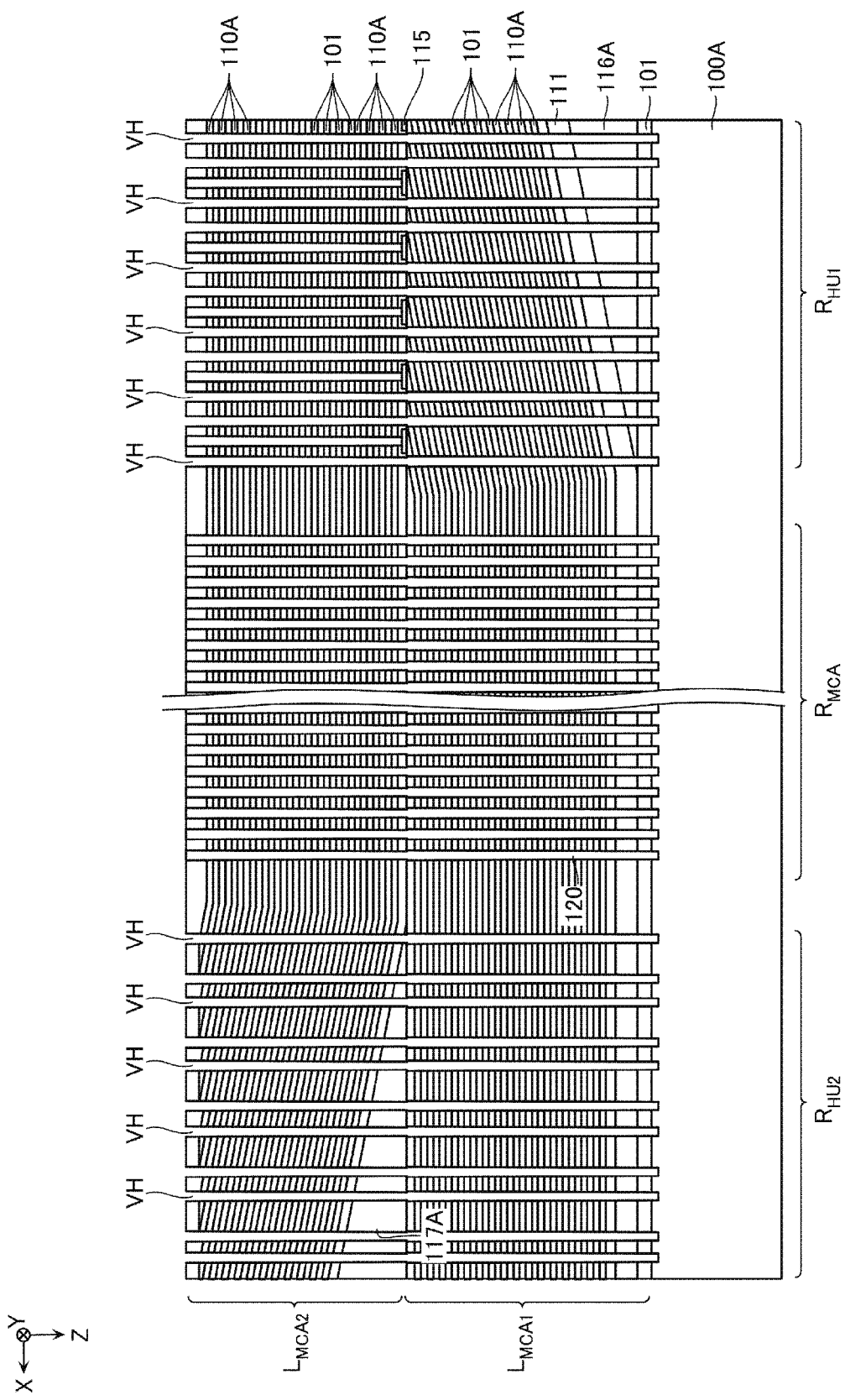

Next, in the processing associated with FIG. 25, a semiconductor layer 120 is initially formed inside each the via holes VH. In this process, the semiconductor layer 120, the gate insulating film 130, the insulating layer 125, and the like described with reference to FIG. 9 are formed inside the via hole VH. When forming the semiconductor layer 120, conformal films can be formed by CVD or the like, and then an amorphous silicon film can be formed inside the via hole VH. Furthermore, the crystal structure of this amorphous silicon film can be modified by an annealing treatment or the like.

Next, as shown in FIG. 25, the sacrificial film 120A provided inside the via holes VH corresponding to the support structures 153 is removed. This process is performed, for example, by wet etching or the like.

Figure 26:
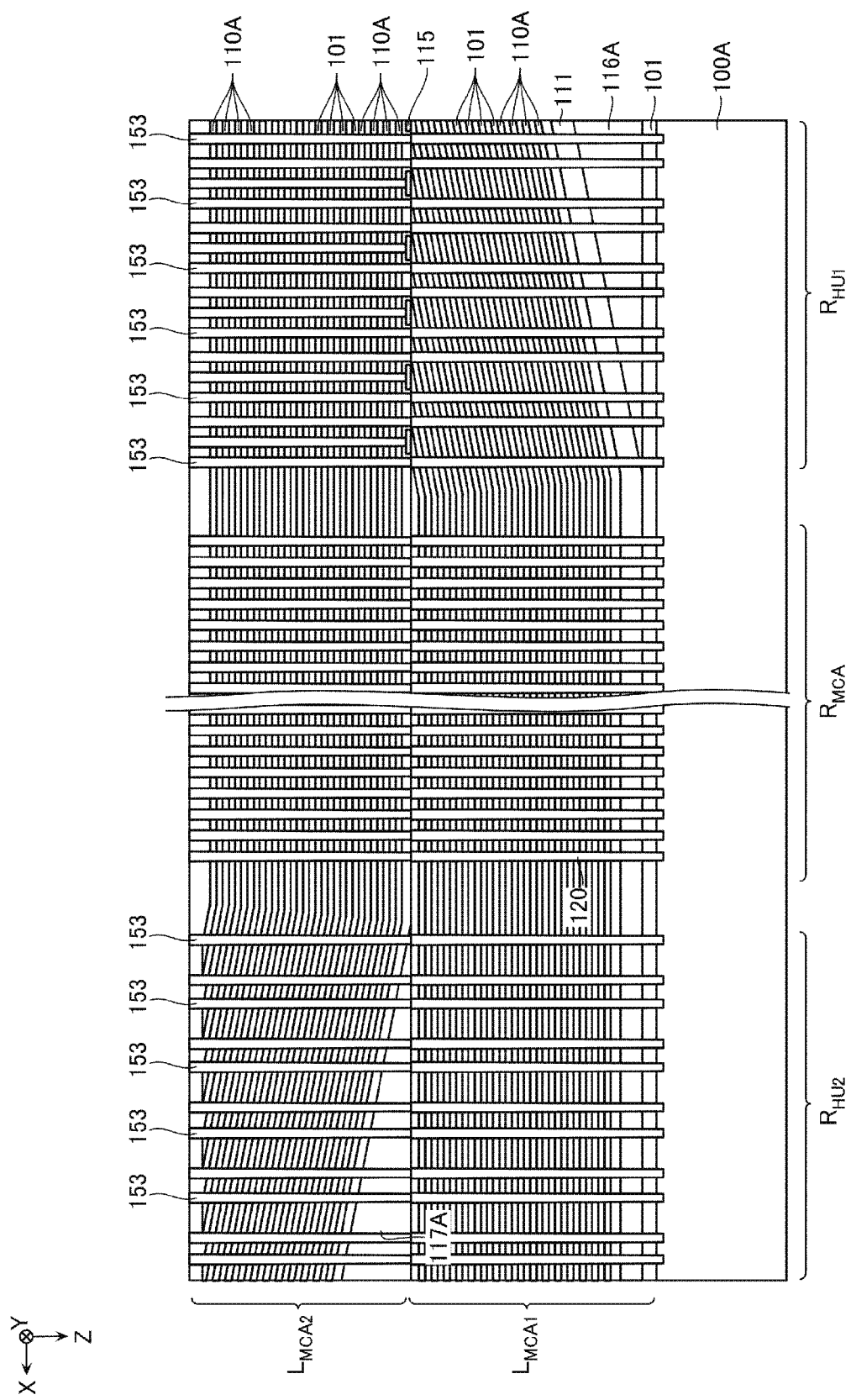

Next, as shown in FIG. 26, the support structure 153 is formed inside the via hole VH. This process is performed by, for example, a method such as CVD.

Figure 27:
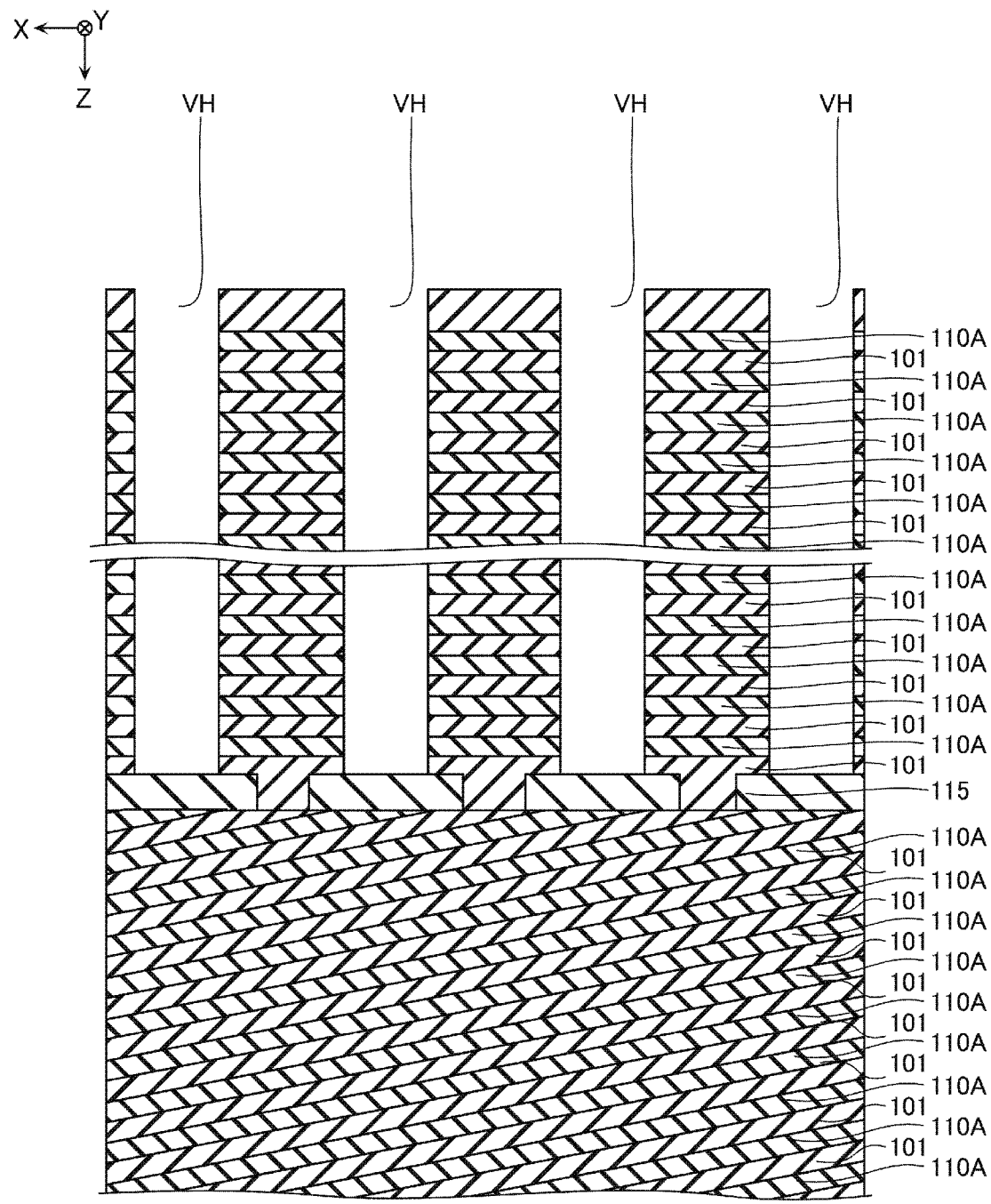

Next, as shown in FIG. 27, the sacrificial film 120A provided inside the via holes VH corresponding to the contacts 161 is removed. This process is performed, for example, by wet etching or the like.

Figure 28:
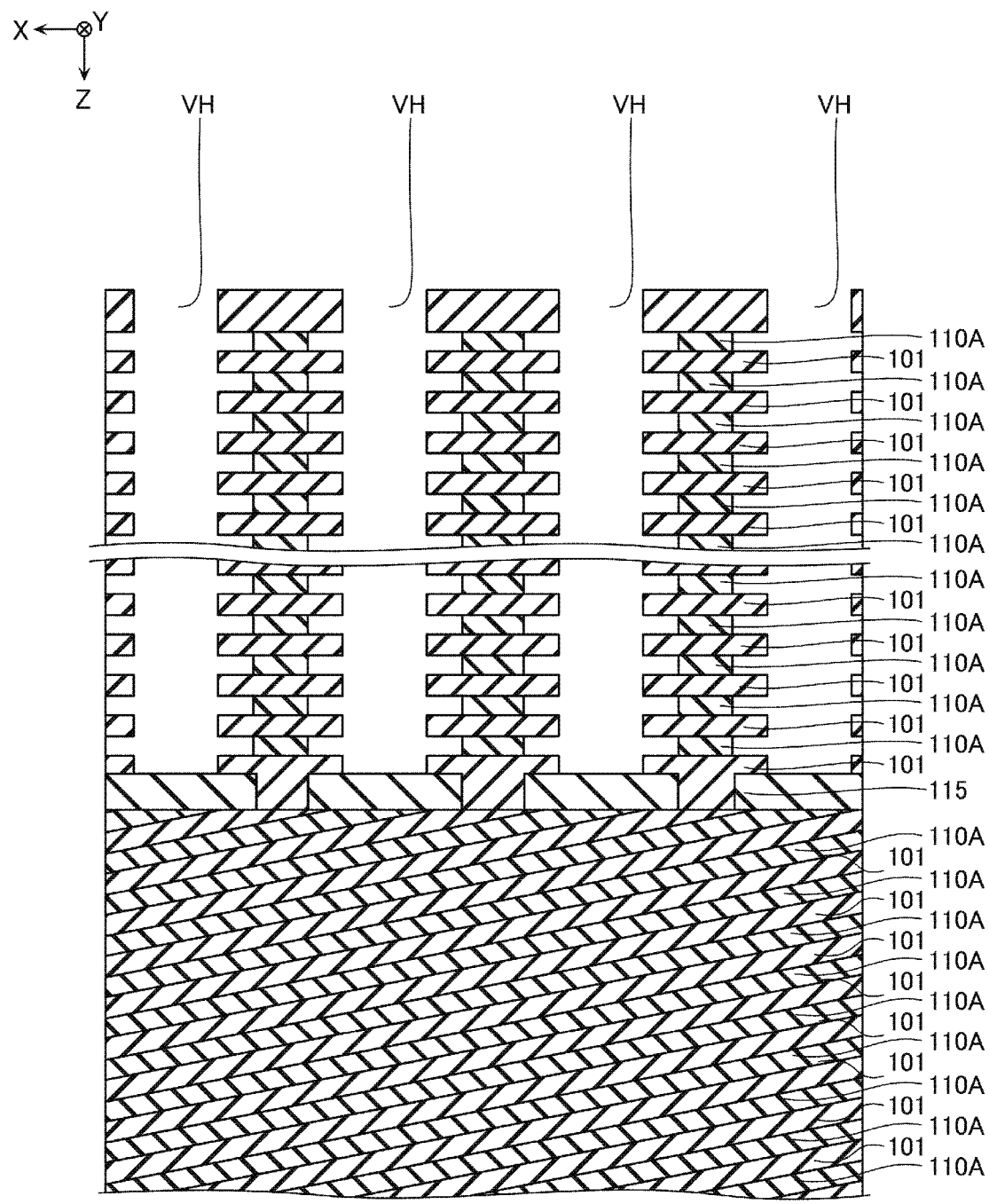

Next, as shown in FIG. 28, a part of the sacrificial layer 110A is removed. This process is performed, for example, by wet etching or the like. In this process, a part of the insulating layer 101 may also be removed along with the part of the sacrificial layer 110A. As a result, the diameter of the via hole VH may be increased.

Figure 29:
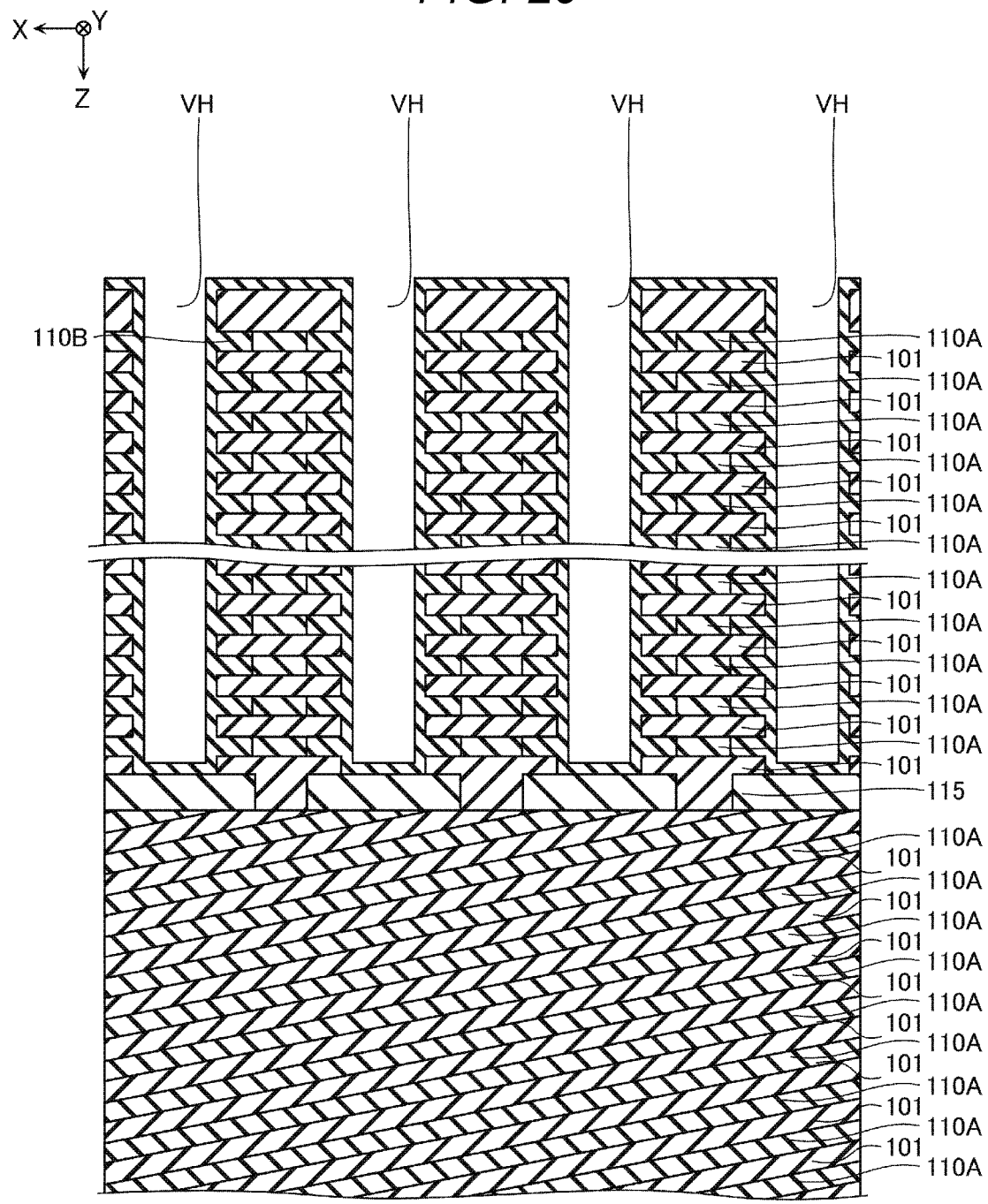

Next, as shown in FIG. 29, an insulating layer 110B is formed on the upper surface of the uppermost insulating layer 101 and the inner peripheral surface of the open via holes VH. The insulating layer 110B is formed thin so that the via holes VH are not filled or blocked completely. This process is performed by, for example, a method such as CVD.

Figure 30:
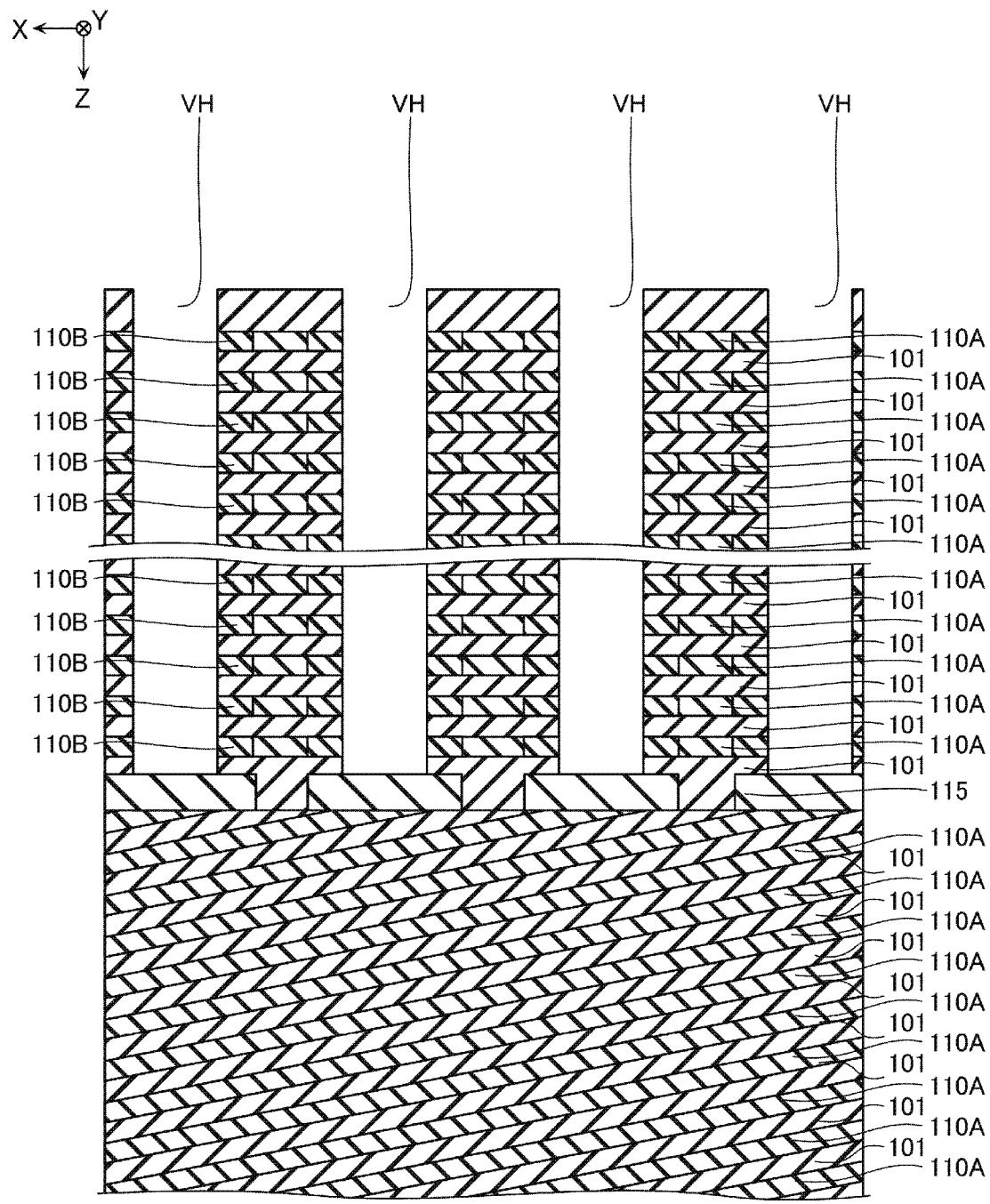

Next, as shown in FIG. 30, a portion of the insulating layer 110B, on the upper surface of the uppermost insulating layer 101 and on the side surface of the insulating layer 101 is removed. This process is performed, for example, by wet etching or the like.

Figure 31:
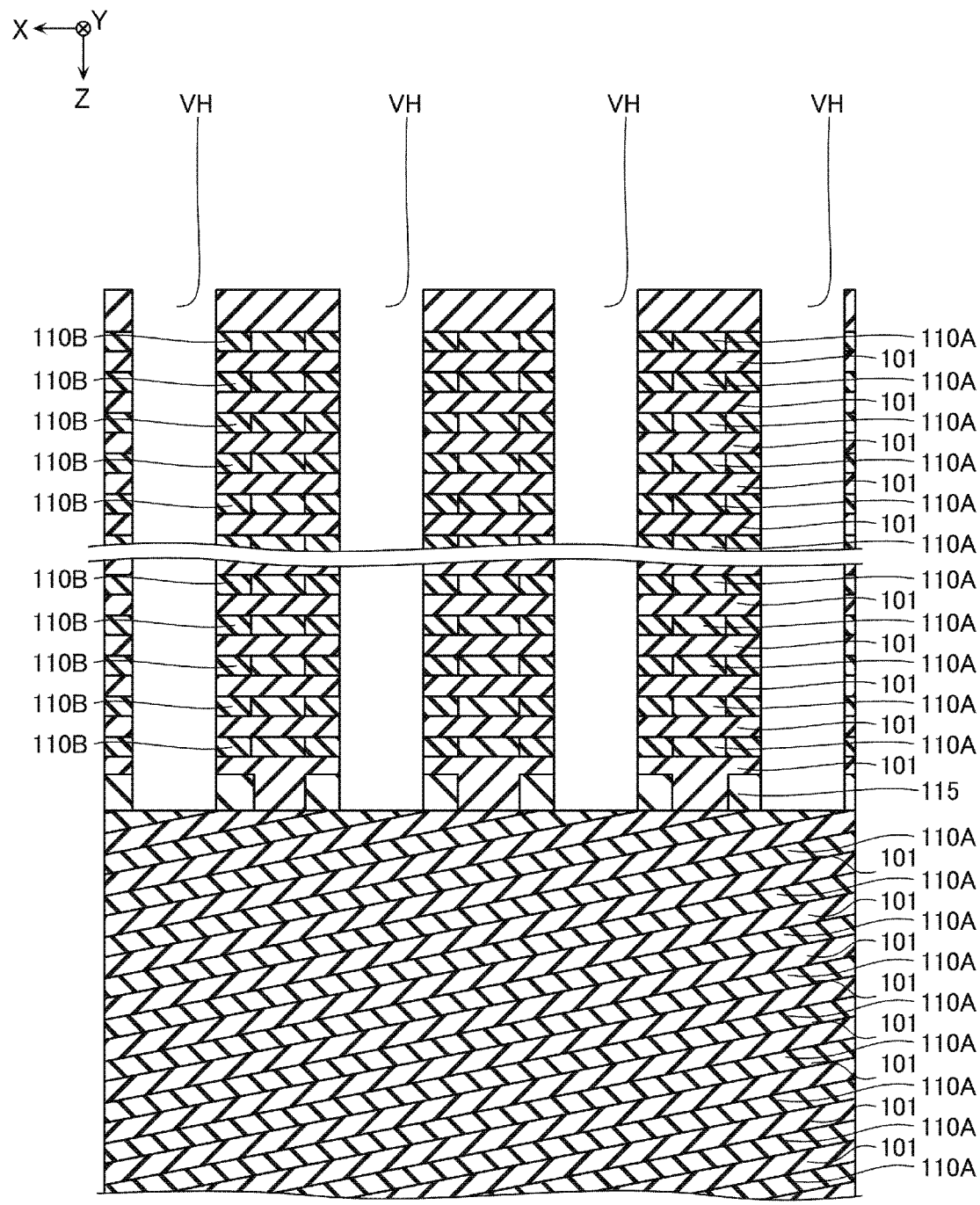

Next, as shown in FIG. 31, a part of the insulating layer 115 is removed to expose the end portion of the sacrificial layer 110A in the X direction. This process is performed, for example, by wet etching or the like.

Figure 32:
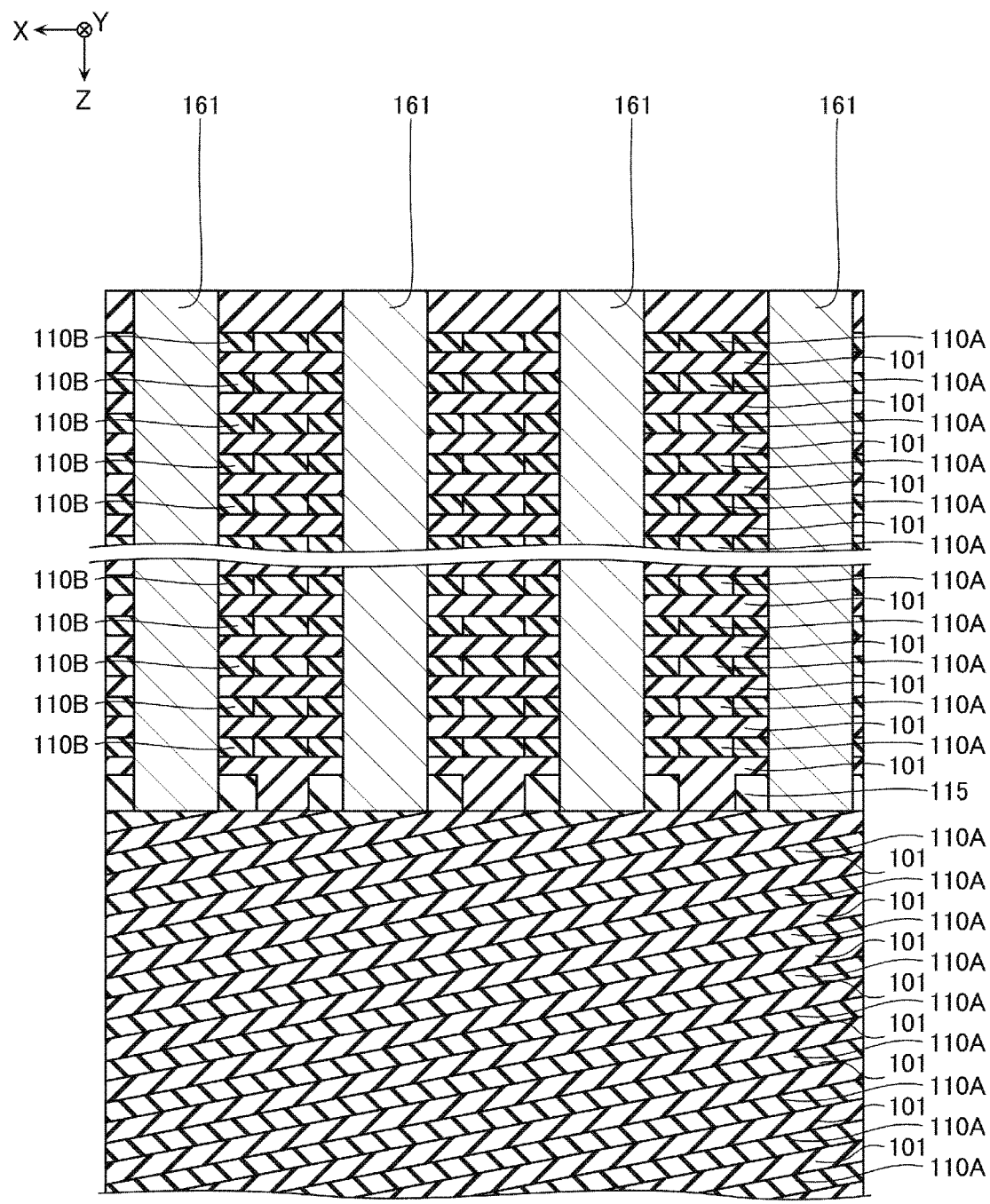

Next, as shown in FIG. 32, the contact 161 is formed inside the via hole VH. This process is performed by, for example, a method such as CVD.

Figure 33:
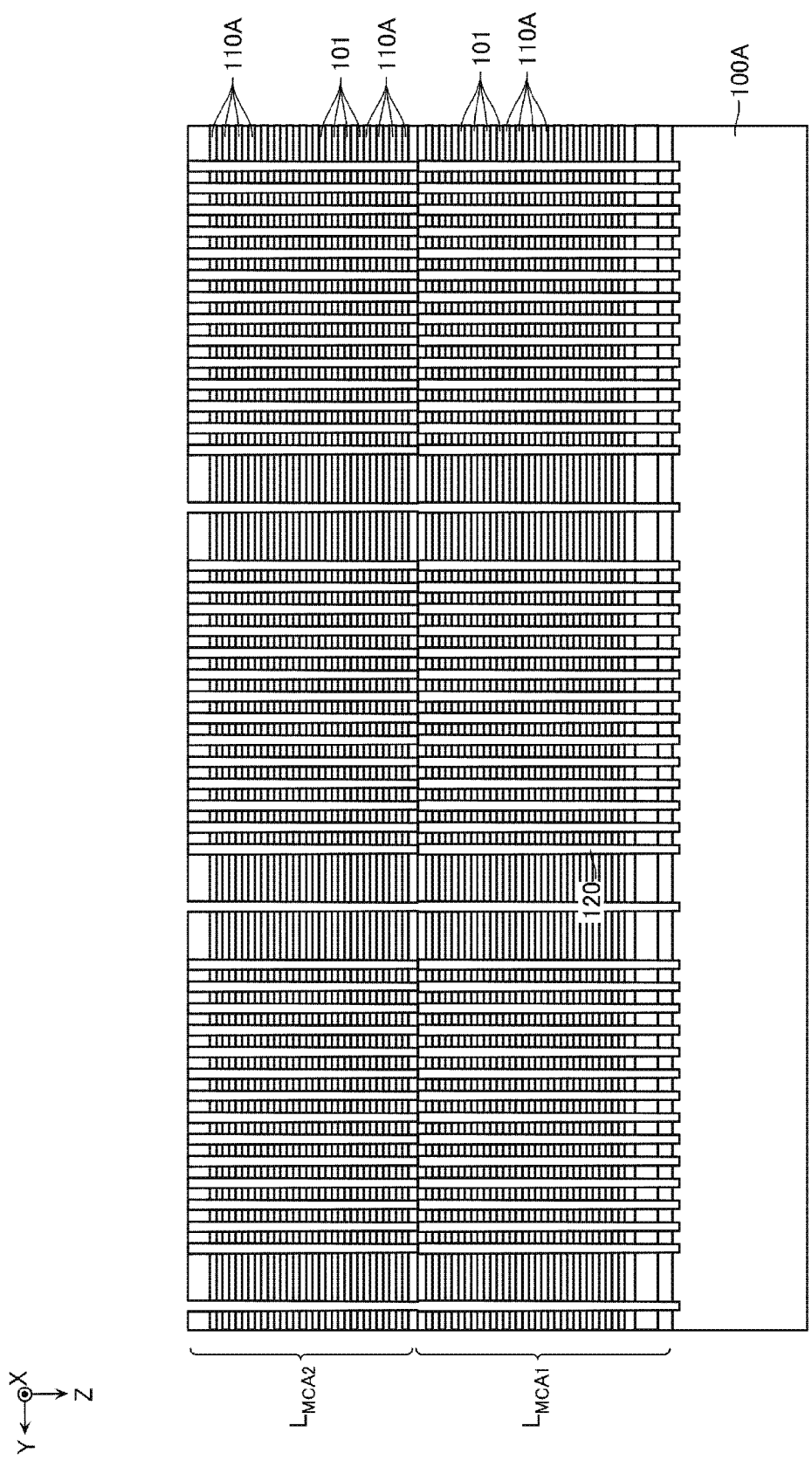

Next, as shown in FIG. 33, the sacrificial film 120A provided inside the via holes VH corresponding in position to the inter-block insulating layer 151 is removed. This process is performed, for example, by wet etching or the like.

Figure 34:
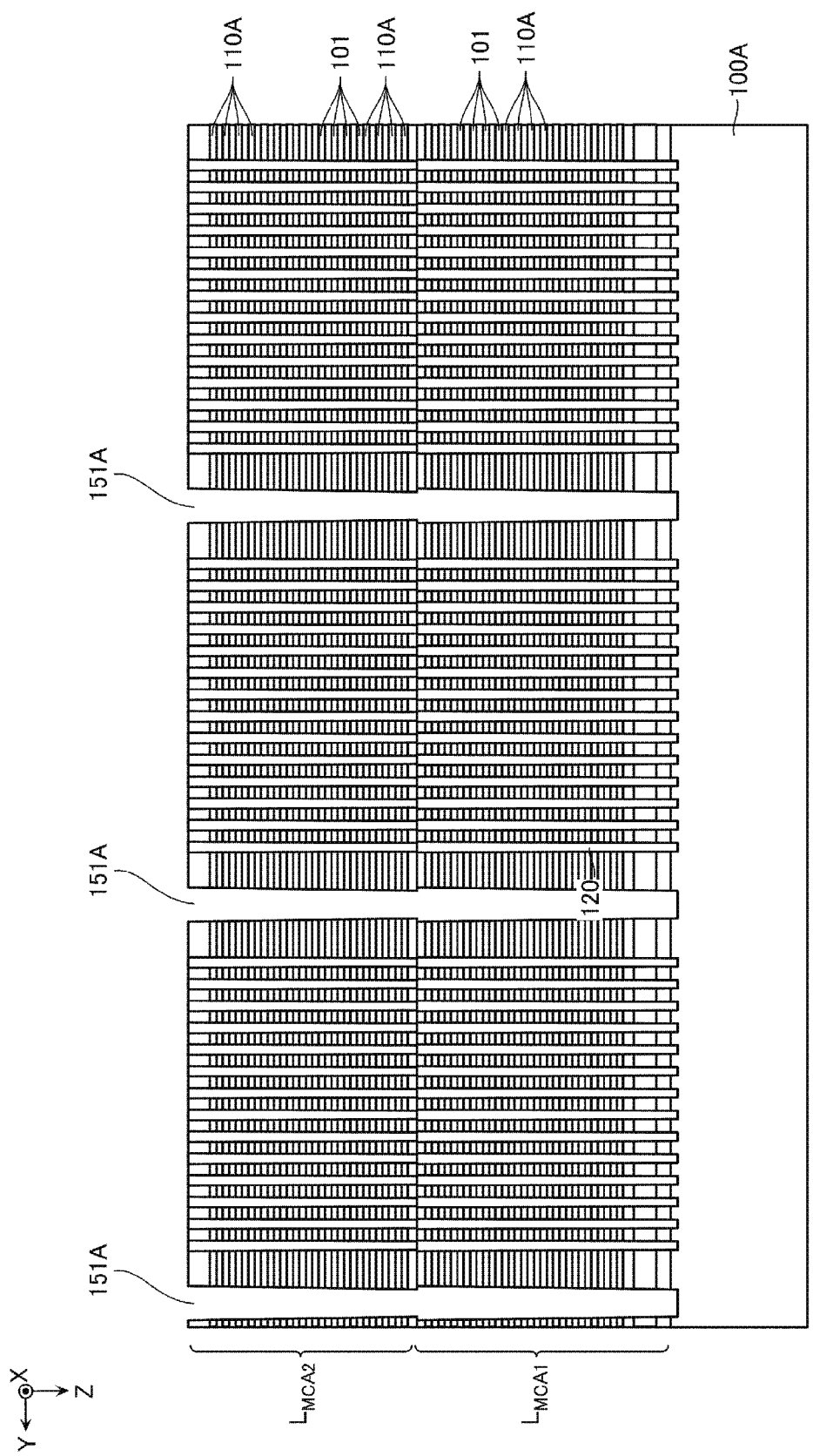
Figure 35:
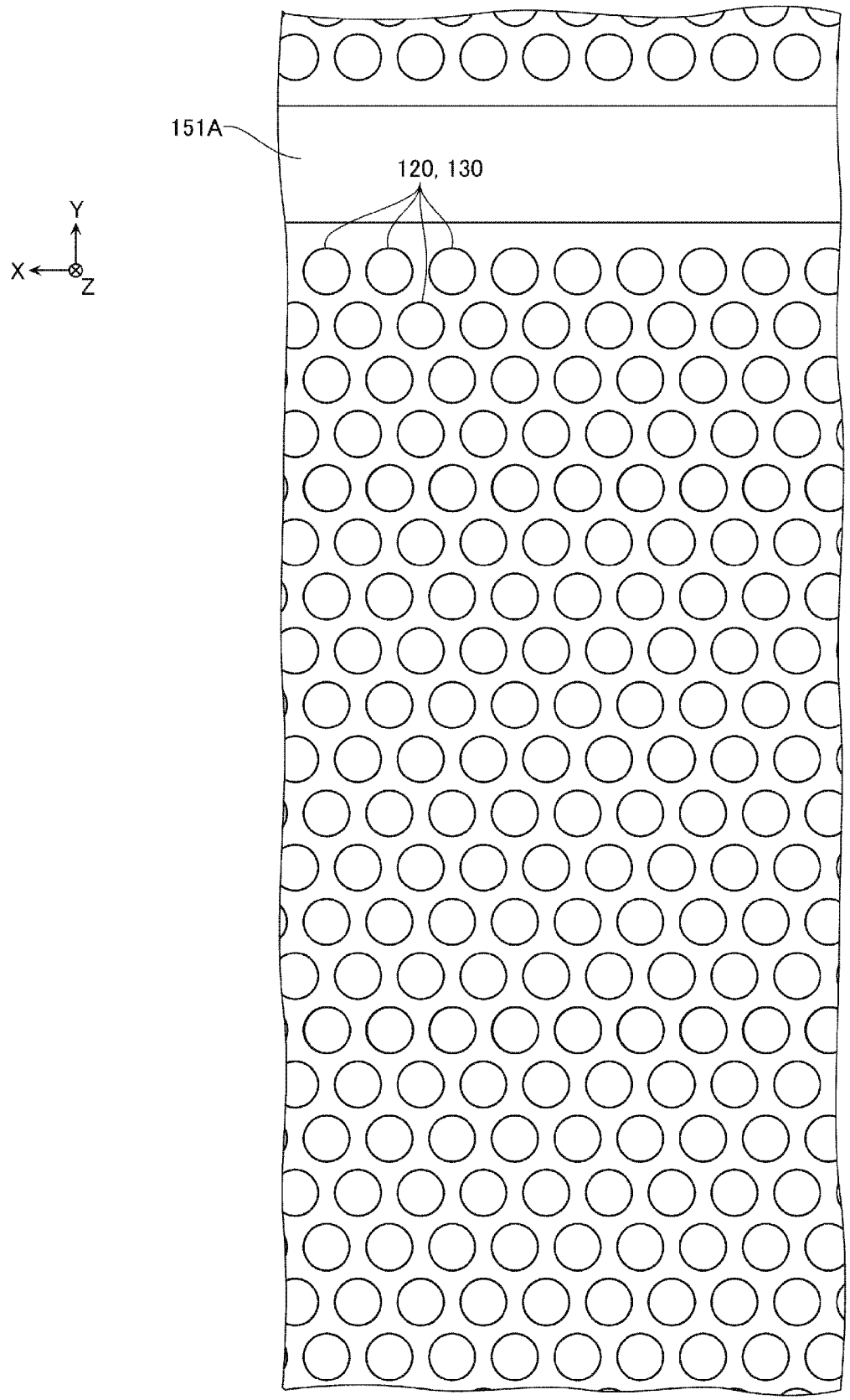

Next, as shown in FIG. 34, a part of the sacrificial layer 110A and the insulating layer 101 is removed. This process is performed, for example, by wet etching or the like. As a result, the diameter of the via holes VH corresponding to the position of the inter-block insulating layer 151 is increased. Furthermore, as shown in FIG. 35, a plurality of via holes VH arranged along the X direction are joined with each other to form a groove 151A extending in the X direction.

Figure 36:
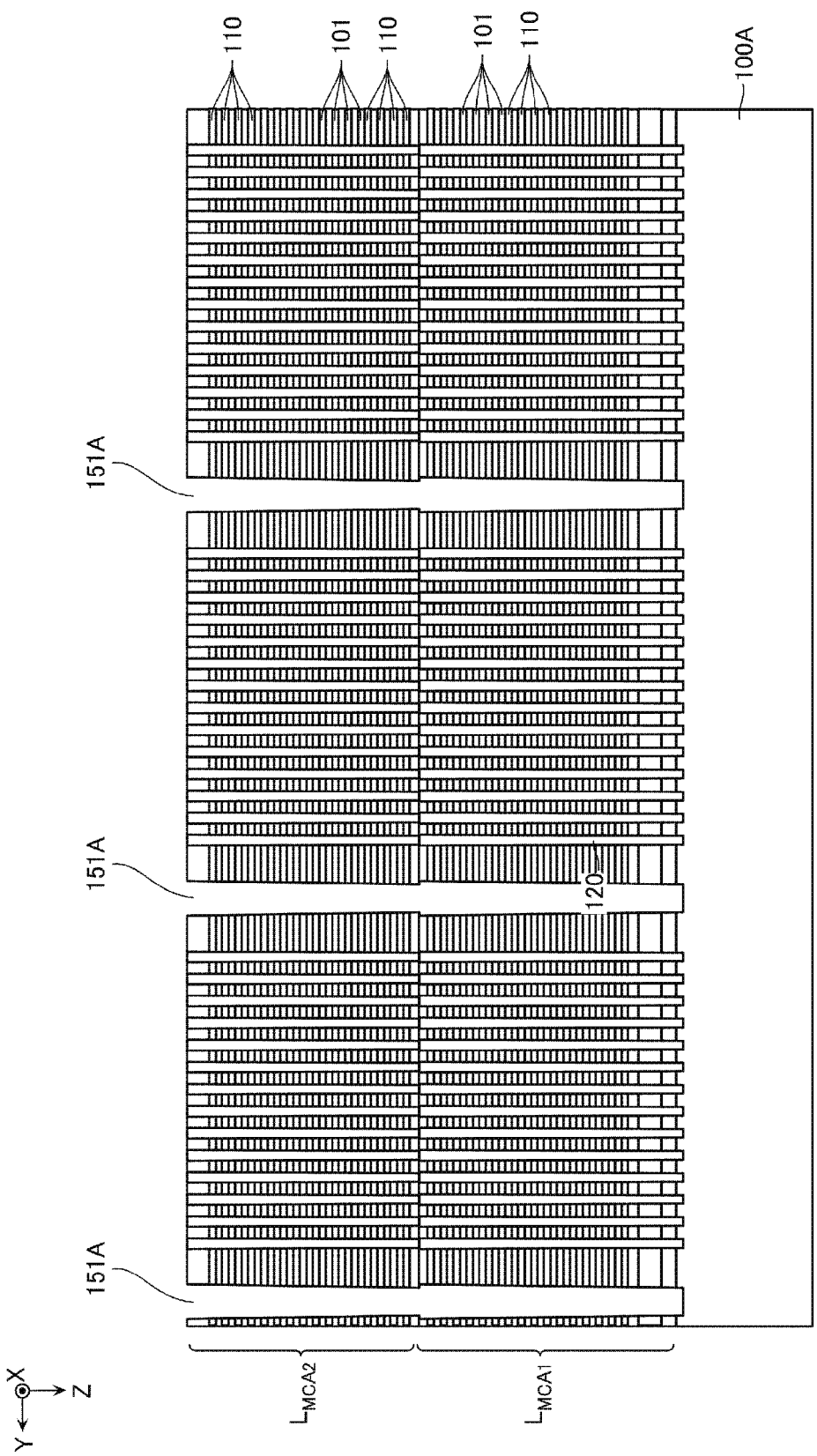
Figure 37:
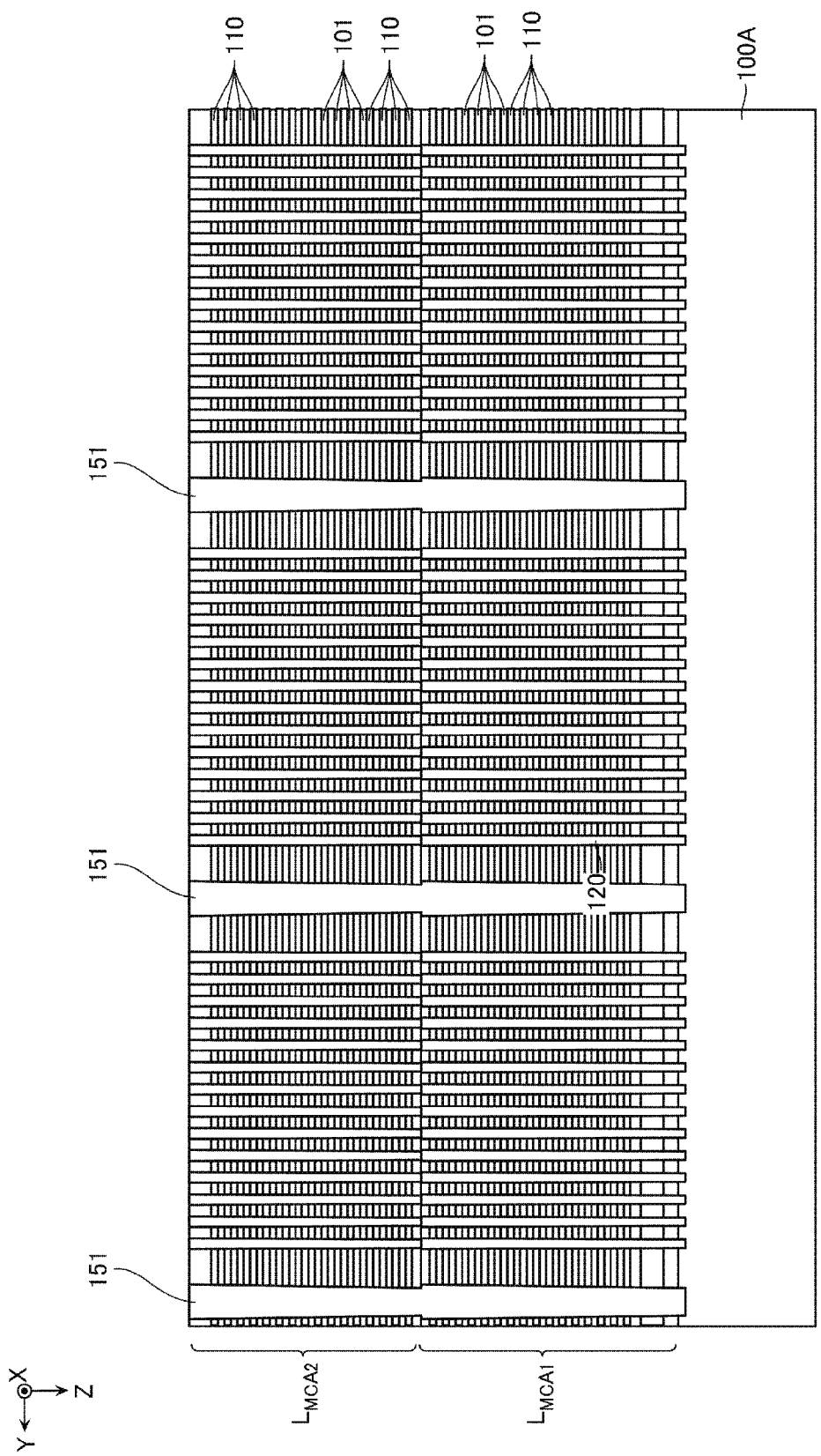

Next, the semiconductor layer 113 (described with reference to FIG. 9) is formed via the groove 151A. This process is performed, for example, by wet etching, selective CVD, and the like. Next, the sacrificial layer 110A is removed via the groove 151A. This process is performed by, for example, a method such as wet etching. As shown in FIG. 36, the conductive layer 110 is then formed. This process is performed by, for example, a method such as CVD. Then, as shown in FIG. 37, the inter-block insulating layer 151 is formed in the groove 151A. This process is performed by, for example, a method such as CVD and RIE.

Figure 38:
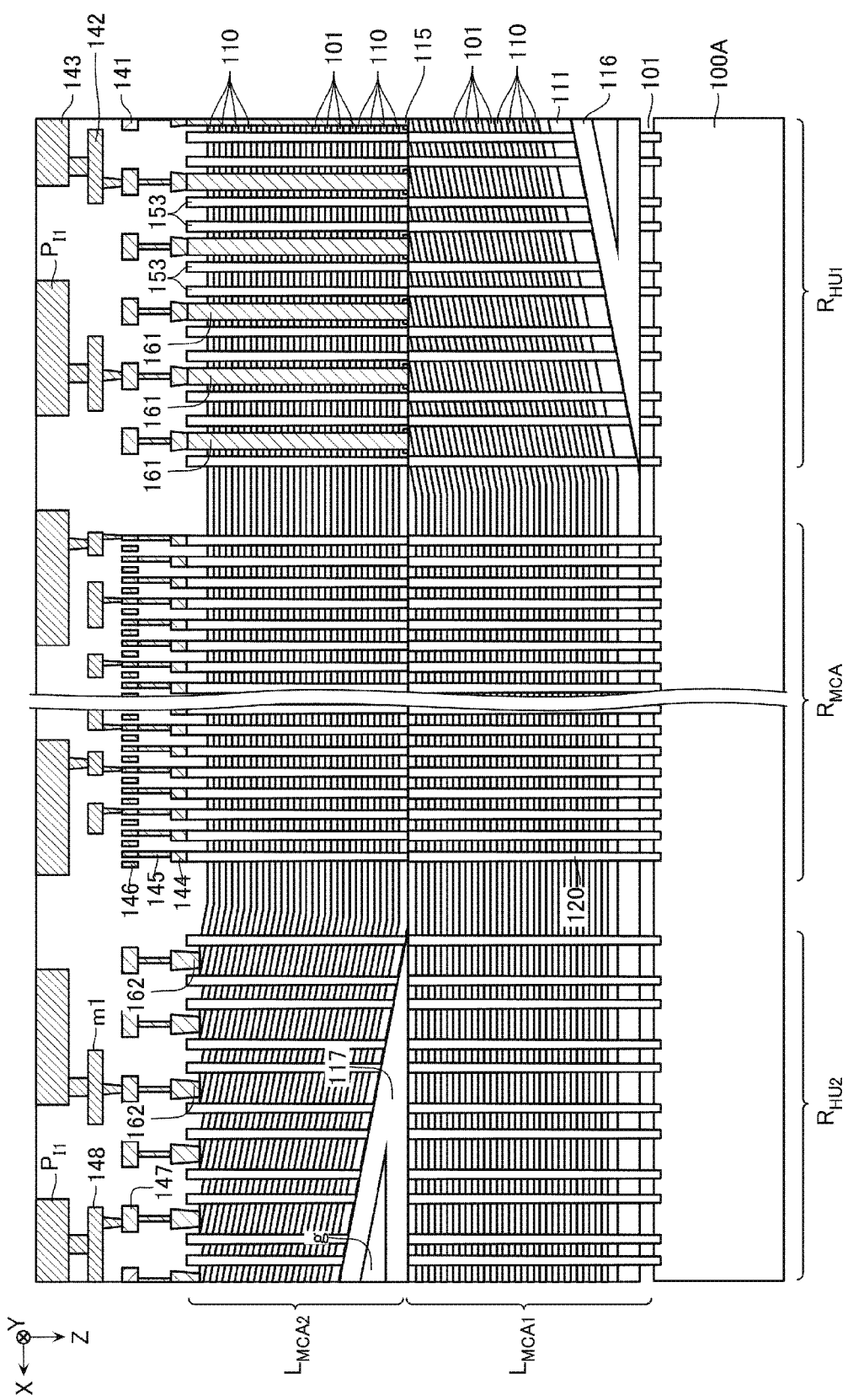

Next, as shown in FIG. 38, the configurations such as the wiring layers 141, 142, and 143 and the contacts connected to these wiring layers are formed so as to provide a configuration corresponding to the chip $C_M$.

Figure 39:
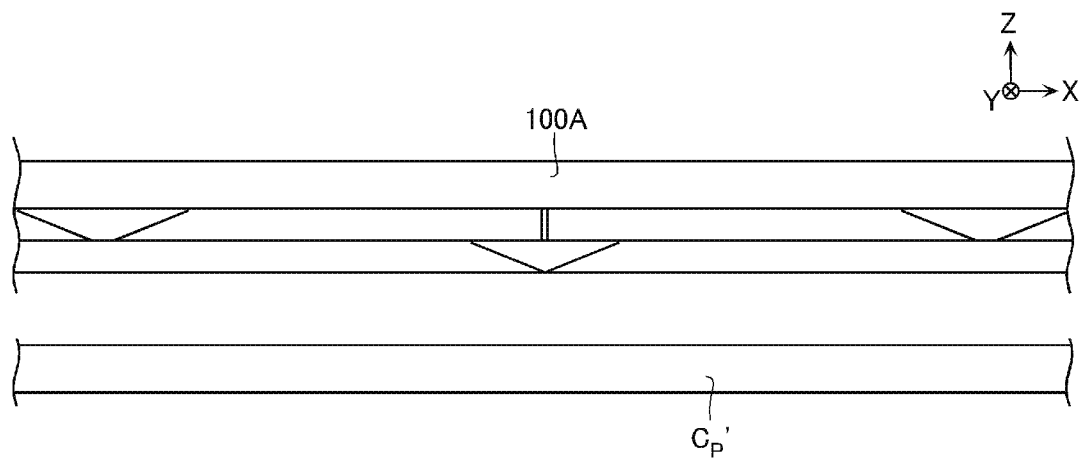
Figure 40:
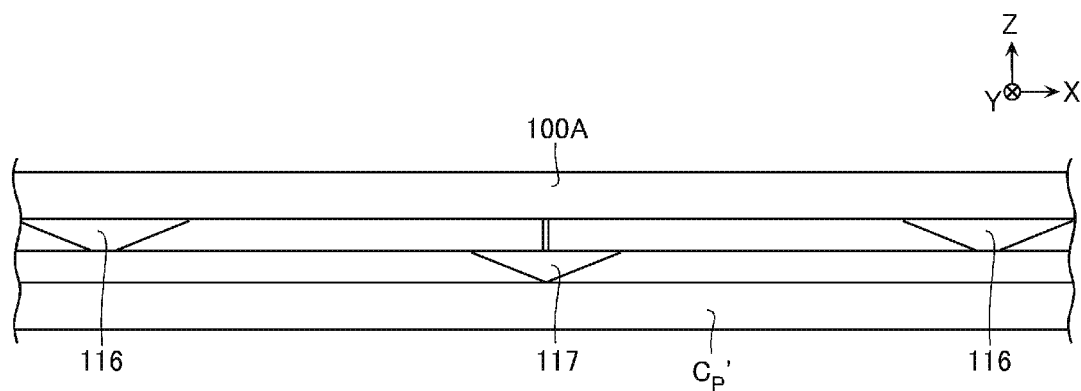

Next, as shown in FIGS. 39 and 40, the semiconductor wafer 100A in which the configuration corresponding to the chip $C_M$ has been formed, and a semiconductor wafer $C_P'$ in which the configuration corresponding to the chip $C_P$ has been formed are bonded together.

Figure 41:
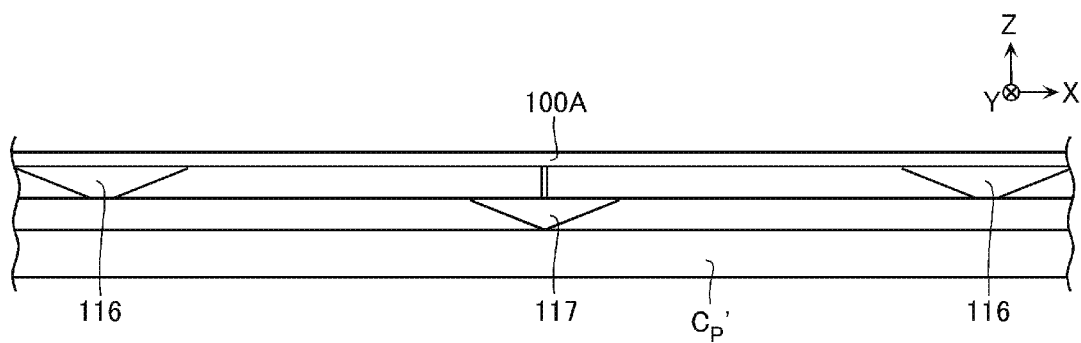

Next, as shown in FIG. 41, a part of the semiconductor wafer 100A is removed by polishing and the semiconductor wafer 100A is thereby thinned. Next, the external pad electrode $P_X$ (FIG. 1) is formed on the rear surface of the semiconductor wafer 100A.

Figure 42:
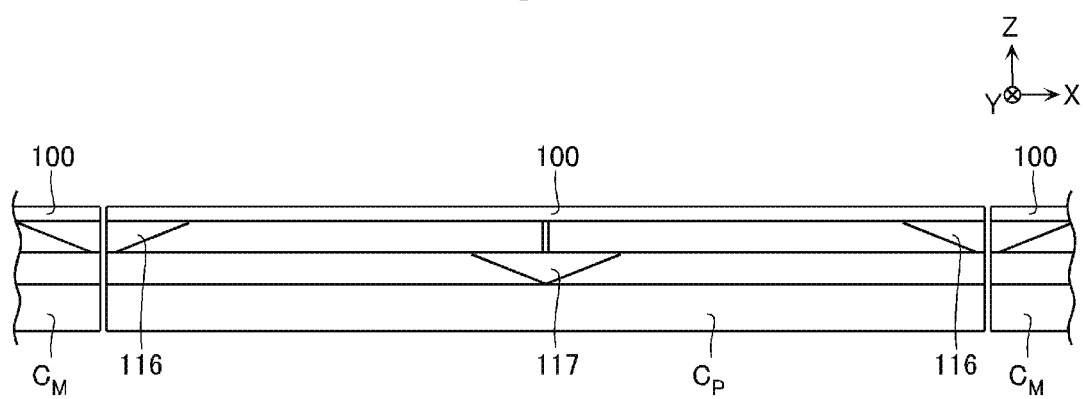

Next, as shown in FIG. 42, the semiconductor wafer is divided into pieces by dicing. As a result, the configuration described with reference to FIGS. 1 to 12 is formed.

[First Modification]

Figure 43:
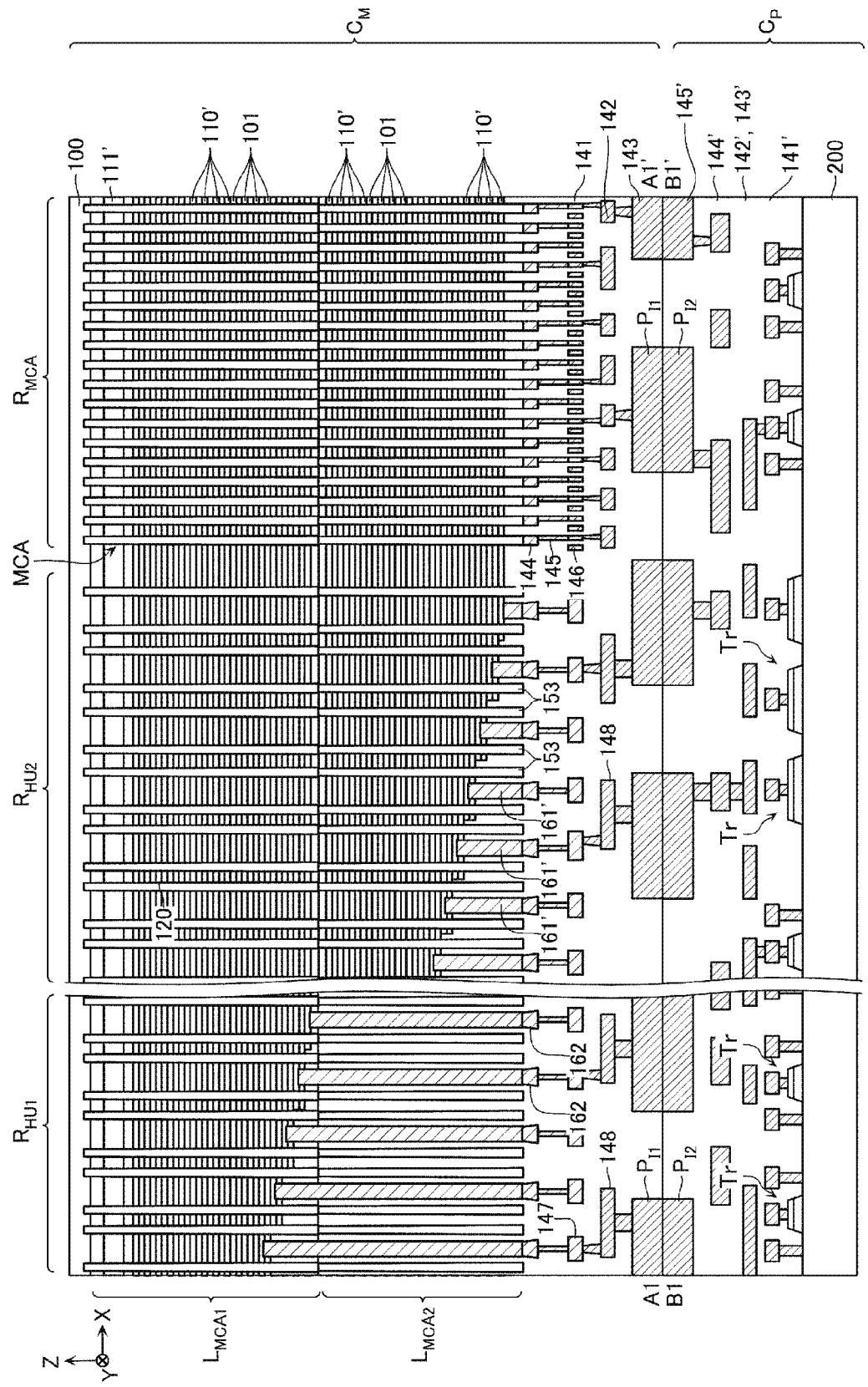
FIG. 43 is a schematic cross-sectional view showing the configuration of a semiconductor storage device according to a first modification.

FIG. 43 is a schematic cross-sectional view showing the configuration of a semiconductor storage device according to a first modification.

The semiconductor storage device according to the first modification does not include the conductive layers 110, but instead includes conductive layers 110'. The conductive layers 110' are basically configured in the same manner as the conductive layers 110 according to the first embodiment. However, the portions of the conductive layers 110' provided in the first hookup region $R_{HU1}$ and the second hookup region $R_{HU2}$ extend in the X direction. Therefore, the height positions of one end and the other end of the plurality of conductive layers 110' in the X direction coincide with the height positions of the portions of the corresponding conductive layers 110' provided in the memory cell array region $R_{MCA}$. The positions of the end portions of the plurality of conductive layers 110' are different from each other. As a result, a stepped structure is formed in the first hookup region $R_{HU1}$ and the second hookup region $R_{HU2}$.

Further, the semiconductor storage device according to the first modification does not include the contacts 161 but instead includes contacts 161'. The contacts 161' are basically configured in the same manner as the contacts 161 according to the first embodiment. However, the positions of the upper ends of the contacts 161' correspond to the height positions of the lower surfaces of the corresponding conductive layers 110'.

FIGS. 44 to 47 are schematic cross-sectional views showing a manufacturing method of the semiconductor storage device according to the first modification.

In the manufacturing method according to the first modification, the processes described with reference to FIGS. 13, 15, 19, 21, and 27 to 32 are not performed. Furthermore, in the manufacturing method according to the first modification, the via holes VH are not formed at the positions corresponding to the contacts 161' in the process described with reference to FIG. 22.

Figure 44:
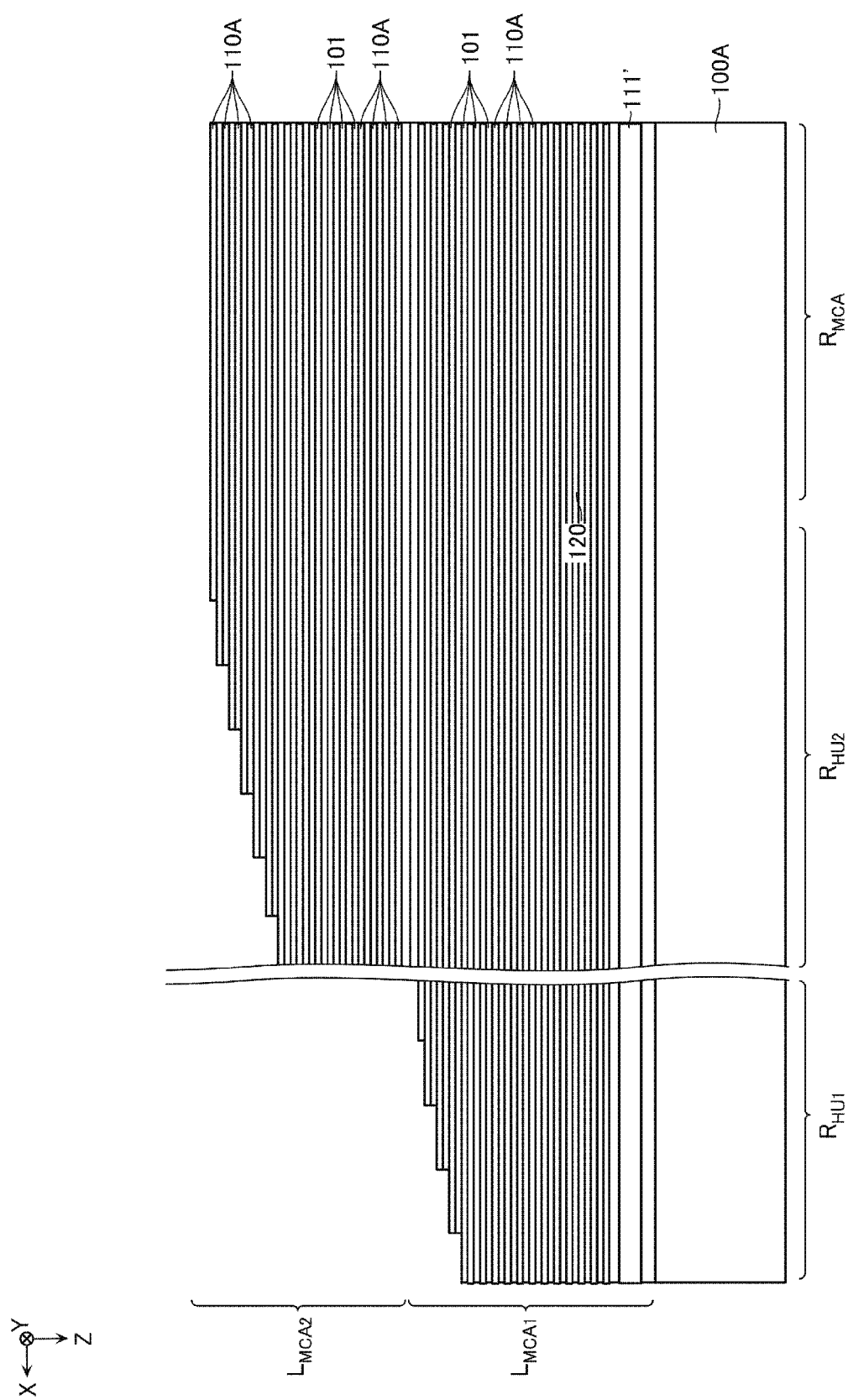
FIGS. 44-47 are schematic cross-sectional views illustrating aspects of a manufacturing method of the semiconductor storage device according to the first modification.

In the manufacturing method according to the first modification, after the process described with reference to FIG. 20, a part of the plurality of sacrificial layers 110A and insulating layers 101 is selectively removed to form a substantially stepped structure in the first hookup region $R_{HU1}$ and the second hookup region $R_{HU2}$, as shown in FIG. 44.

Figure 45:
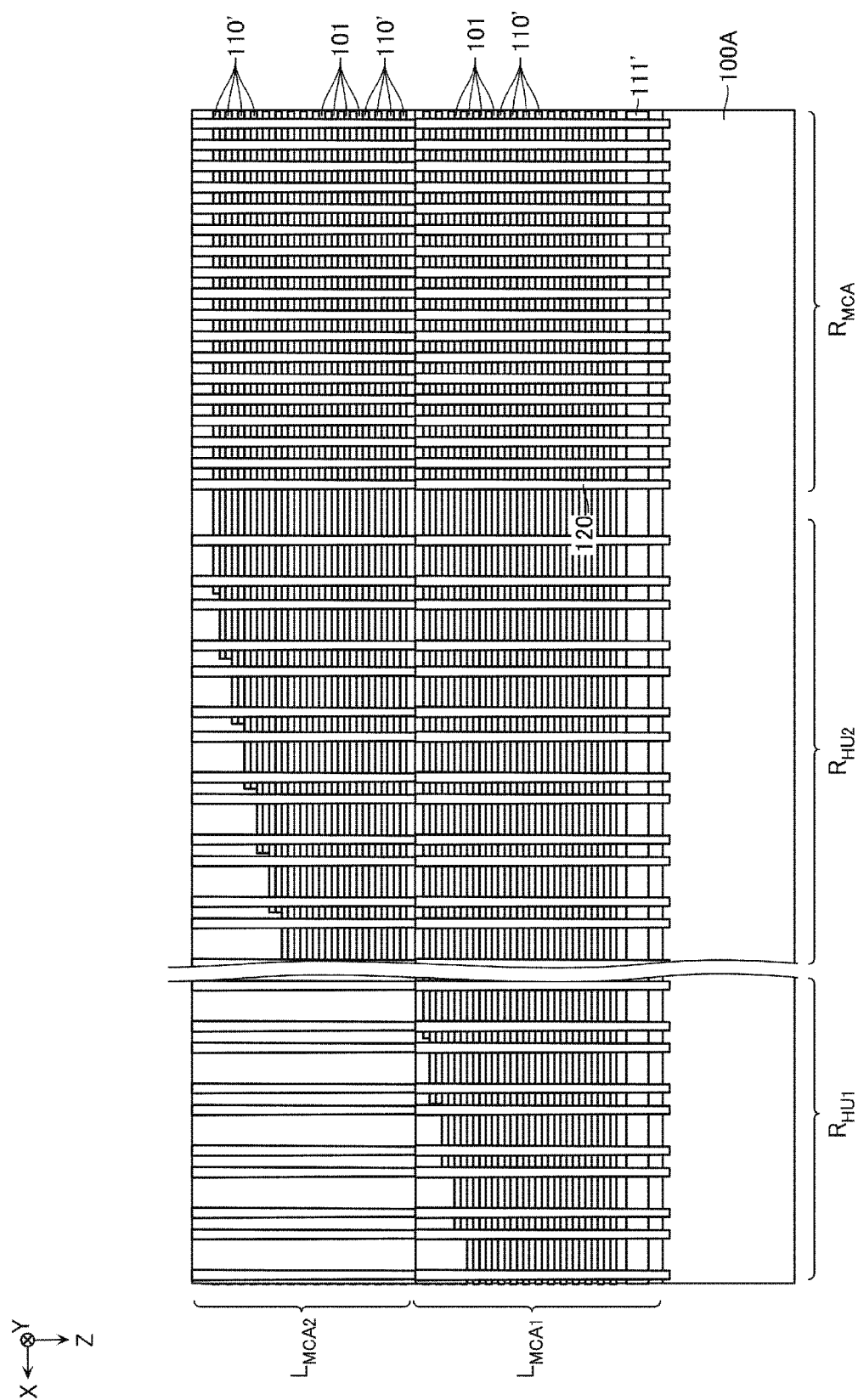
Figure 46:
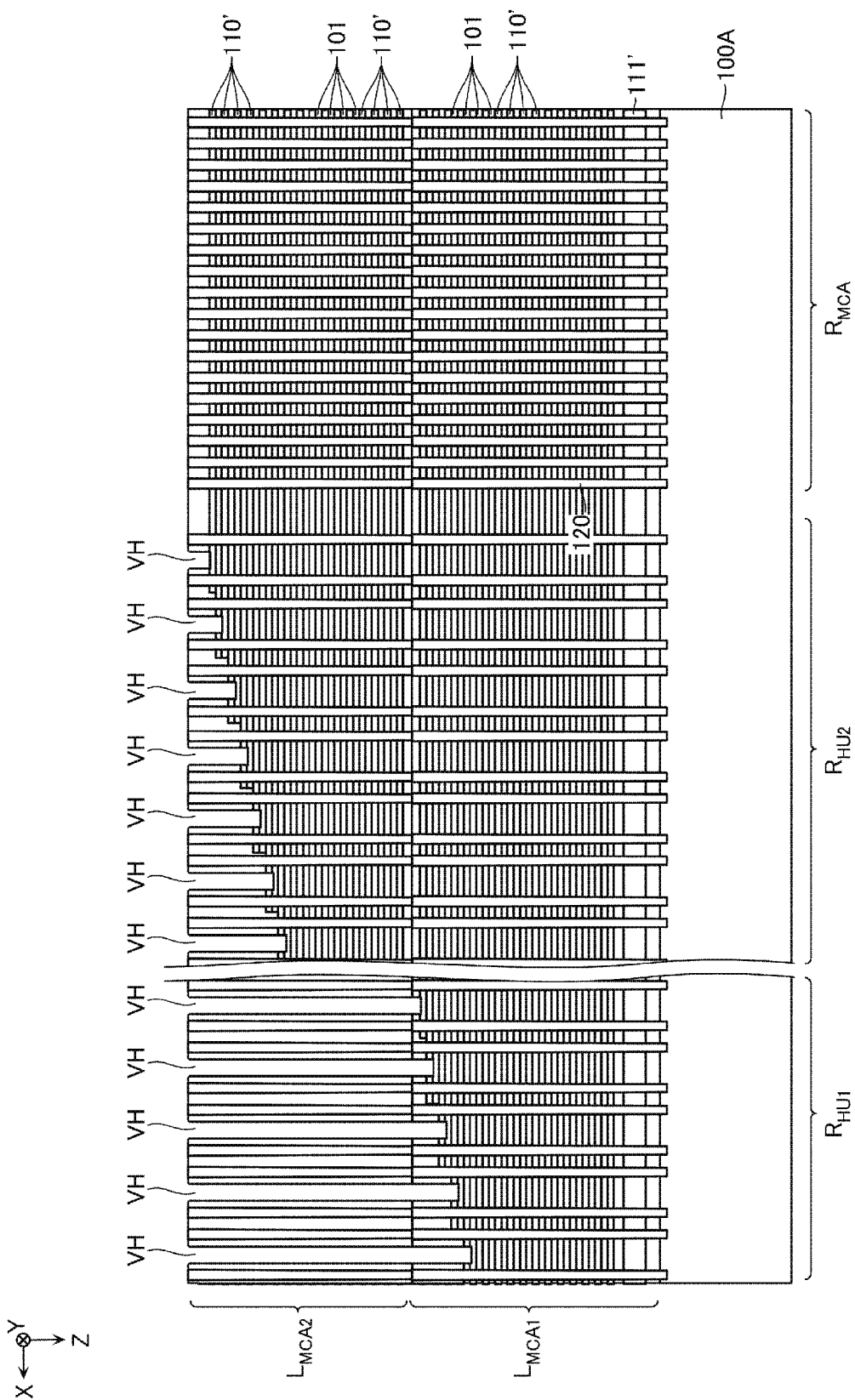

Furthermore, in the manufacturing method according to the first modification, after the process described with reference to FIG. 37, a plurality of via holes VH for exposing the upper surfaces of the plurality of sacrificial layers 110A are formed, as shown in FIGS. 45 and 46. This process is performed by, for example, a method such as RIE. The depth of the via hole VH varies depending on the position of the corresponding sacrificial layer 110A.

Figure 47:
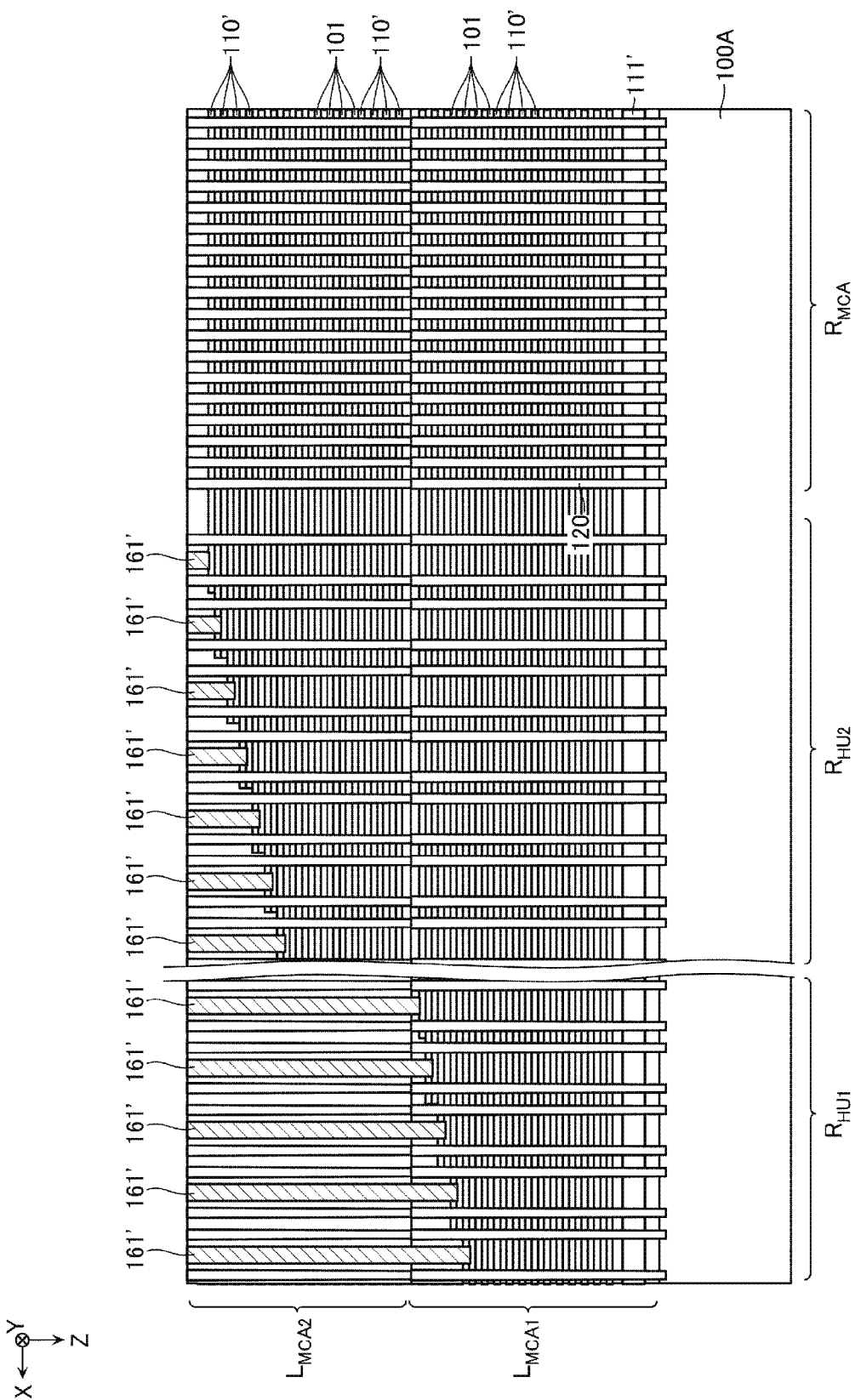

In the manufacturing method according to the first modification, after the process described with reference to FIG. 46, a contact 161' is formed inside the via hole VH, as shown in FIG. 47. This process is performed by, for example, a method such as CVD.

[Effect]

In the manufacturing method according to the first modification, it is necessary to form a plurality of via holes VH having different ultimate depths in the process described with reference to FIG. 46. When it is attempted to collectively form such a plurality of via holes VH, the via hole corresponding to a conductive layer 110', which is provided relatively above, penetrates the conductive layers 110', and such the conductive layer 110' may short-circuit with the lower conductive layer 110'. On the other hand, if it is attempted to form such a plurality of via holes VH in a plurality of different process steps, the number of manufacturing processes increases.

Therefore, the insulating layer 116 having a slope is formed in the first hookup region $R_{HU1}$ and the second hookup region $R_{HU2}$ according to in the process described with reference to FIG. 13. In the process described with reference to FIG. 14, a plurality of sacrificial layers 110A are formed on this slope. In the process described with reference to FIG. 15, a planarization process is performed on such a structure to expose the end portions of the plurality of sacrificial layers 110A.

According to such a method, it is possible to align the height positions of the end portions of the plurality of sacrificial layers 110A. Therefore, it is not necessary to form a plurality of via holes VH having different depths. Therefore, it is possible to prevent a short circuit of the conductive layer 110' as described above and an increase in the number of manufacturing processes.

In the present embodiment, the plurality of sacrificial layers 110A corresponding to the memory cell array layer $L_{MCA1}$ are formed in the process described with reference to FIG. 14, and the via holes VH are formed in the plurality of sacrificial layers 110A in the process described with reference to FIG. 16. However, as described with reference to FIG. 20, the plurality of sacrificial layers 110A corresponding to the memory cell array layer $L_{MCA2}$ are formed, and the via holes VH are formed in the plurality of sacrificial layers 110A in the process described with reference to FIG. 22.

According to such a method, it is not necessary to form the via holes VH in all the sacrificial layers 110A at the same time. Therefore, it is possible to increase the number of stacked sacrificial layers 110A relatively easily. This makes it possible to achieve high integration in the semiconductor storage device.

However, when such a method is combined with the above-mentioned method of adjusting the position of the end portion of the sacrificial layer 110A in the Z direction using a slope structure or the like, the X-direction end portions of the plurality of sacrificial layers 110A corresponding to the memory cell array layer $L_{MCA1}$ are covered in the process described with reference to FIG. 20.

Therefore, in the process described with reference to FIG. 22, the via hole VH is first provided at a position corresponding to the contact 161, and the contact 161 is subsequently formed by using the already formed via hole VH. According to such a method, it is possible to achieve high integration of the semiconductor storage device while preventing a short circuit of the conductive layer 110' as described above and an increase in the number of manufacturing processes.

Furthermore, in the process described with reference to FIG. 22, the via holes VH are formed in the positions corresponding to the semiconductor layers 120, the positions corresponding to the support structures 153, the positions corresponding to the contacts 161, and the positions corresponding to the inter-block insulating layers 151 in the same processing. As a result, the total number of processes for forming the via holes VH can be significantly reduced.

When the method of adjusting the position of the end portion of the sacrificial layer 110A in the Z direction by using a slope structure as described above is adopted, two slopes arranged in the X direction are formed corresponding to the insulating layers 116A and 117A having such a slope. When such a slope is provided in one memory die MD, a slope may be formed in a region other than the region connecting the conductive layer 110 and the contacts 161 and 162, and a dead space may be generated.

Therefore, in the present embodiment, in the process described with reference to FIG. 13 and the process described with reference to FIG. 19, the insulating layers 116A and 117A are formed over the regions corresponding to the two memory planes 10, while one slope corresponds to one memory plane 10 and the other slope corresponds to the other memory plane 10. Further, when such an insulating layer is formed over two chips $C_M$, the insulating layer 116 will be cut by dicing in the process described with reference to FIG. 42. This makes it possible to achieve high integration of the semiconductor storage device.

Other Embodiments

A semiconductor storage device according to the first embodiment was described above. However, the semiconductor storage device according to the first embodiment is merely one example, and the specific configuration and the like can be appropriately adjusted.

Figure 48:
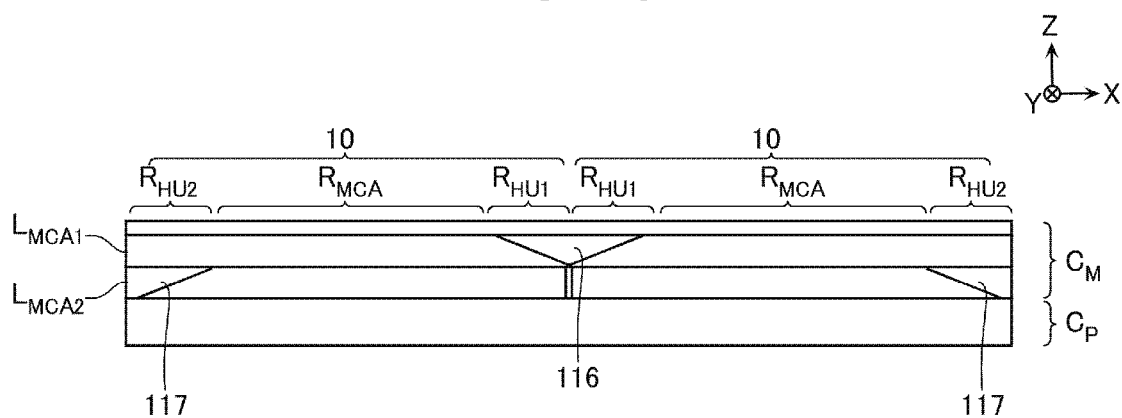
FIG. 48 is a schematic cross-sectional view showing the configuration of a semiconductor storage device according to a second modification.
Figure 49:
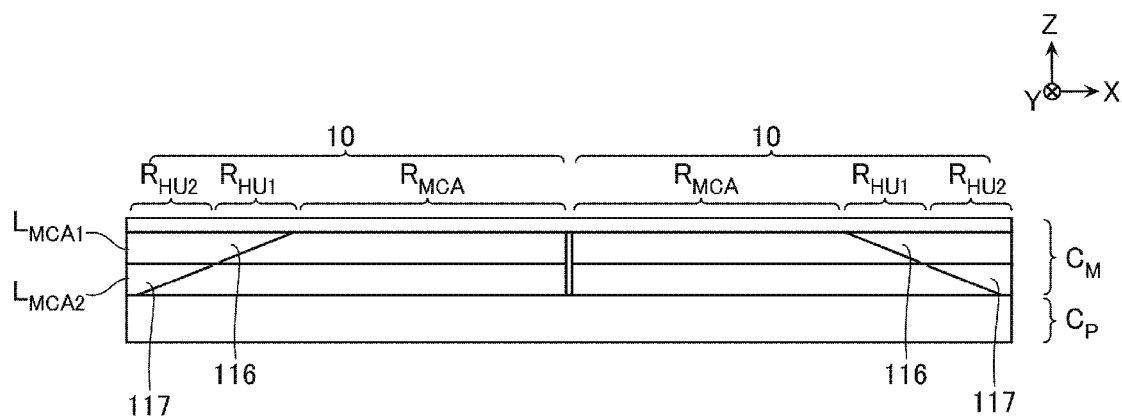
FIG. 49 is a schematic cross-sectional view showing the configuration of a semiconductor storage device according to a third modification.
Figure 50:
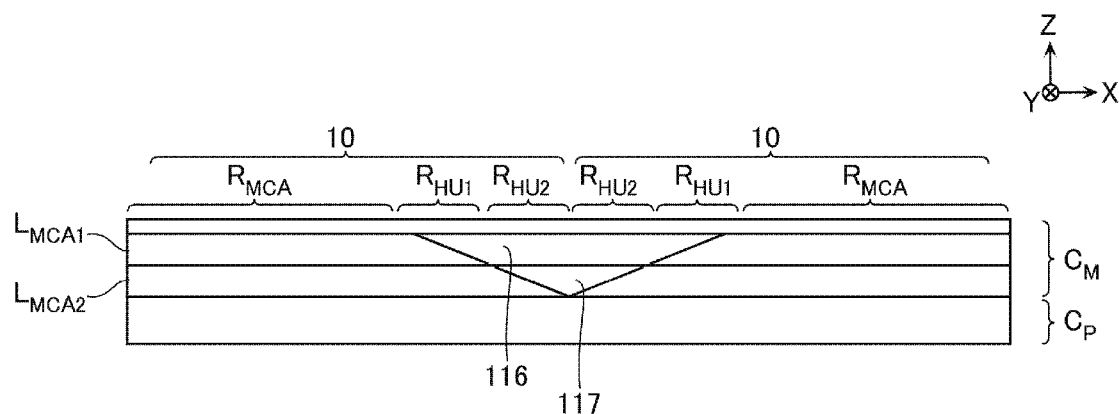
FIG. 50 is a schematic cross-sectional view showing the configuration of a semiconductor storage device according to a fourth modification.

For example, as described with reference to FIGS. 2 and 10, the first hookup region $R_{HU1}$ was provided on the outer edge side from the memory cell array region $R_{MCA}$, and the second hookup region $R_{HU2}$ was provided on the inner side of the memory cell array region $R_{MCA}$. However, such a configuration is an example and the specific configuration and the like can be adjusted as appropriate. For example, as illustrated in FIG. 48, the first hookup region $R_{HU1}$ may be provided on the inner side of the memory cell array region $R_{MCA}$ and the second hookup region $R_{HU2}$ may be provided on the outer edge side from the memory cell array region $R_{MCA}$. Further, as illustrated in FIG. 49, both the first hookup region $R_{HU1}$ and the second hookup region $R_{HU2}$ may be provided on the outer edge side from the memory cell array region $R_{MCA}$. Furthermore, as illustrated in FIG. 50, both the first hookup region $R_{HU1}$ and the second hookup region $R_{HU2}$ may be provided on the inner side of the memory cell array region $R_{MCA}$.

Figure 51:
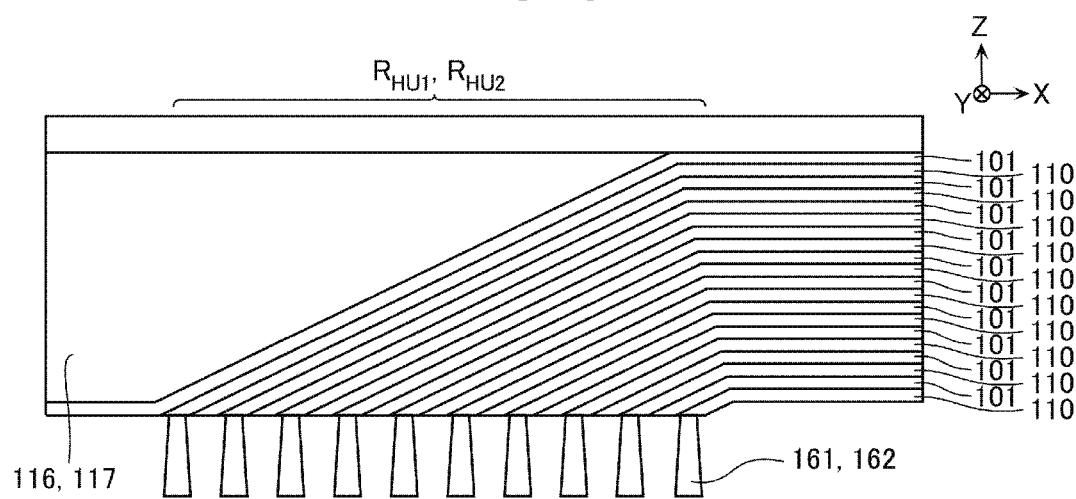
FIG. 51 is a schematic cross-sectional view showing the configuration of the semiconductor storage device according to the first embodiment.

Further, as illustrated in FIG. 51, in the first embodiment, conductive layers 110, provided in the first hookup region $R_{HU1}$ and the second hookup region $R_{HU2}$ are extended in a substantially straight line in a direction between the X direction and the Z direction (the diagonally downward direction to the left in FIG. 51) so as to be located downward as the distance from the memory cell array region $R_{MCA}$ increases. Among the plurality of conductive layers 110, the lower surfaces of the end portions in the X direction of the portions provided in the first hookup region $R_{HU1}$ and the second hookup region $R_{HU2}$ are formed flat along the XY plane. However, such a configuration is an example and the specific configuration and the like can be adjusted as appropriate.

Figure 52:
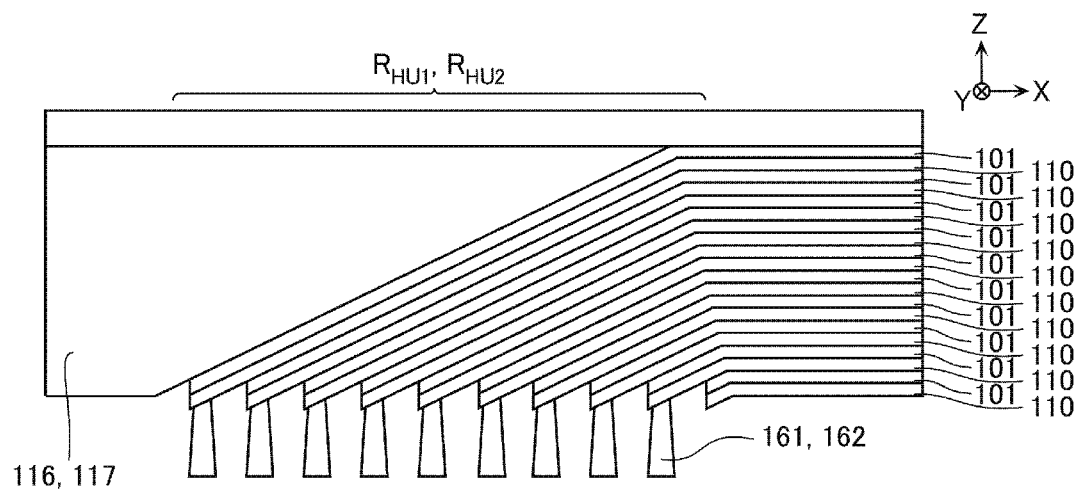
FIG. 52 is a schematic cross-sectional view showing the configuration of a semiconductor storage device according to a fifth modification.

As illustrated in FIG. 52, among the plurality of conductive layers 110, the end portions in the X direction of the portions provided in the first hookup region $R_{HU1}$ and the second hookup region $R_{HU2}$ may be formed in a stepped or staggered manner. In the example of FIG. 52, the lower ends of the end portions in the X direction of the insulating layers 101 are provided above the lower ends of the end portions in the X direction of the conductive layers 110, respectively. Such a configuration can be formed, for example, by performing a process such as etching instead of the planarization process in the processing described with reference to FIG. 15 and the processing described with reference to FIG. 21.

Figure 53:
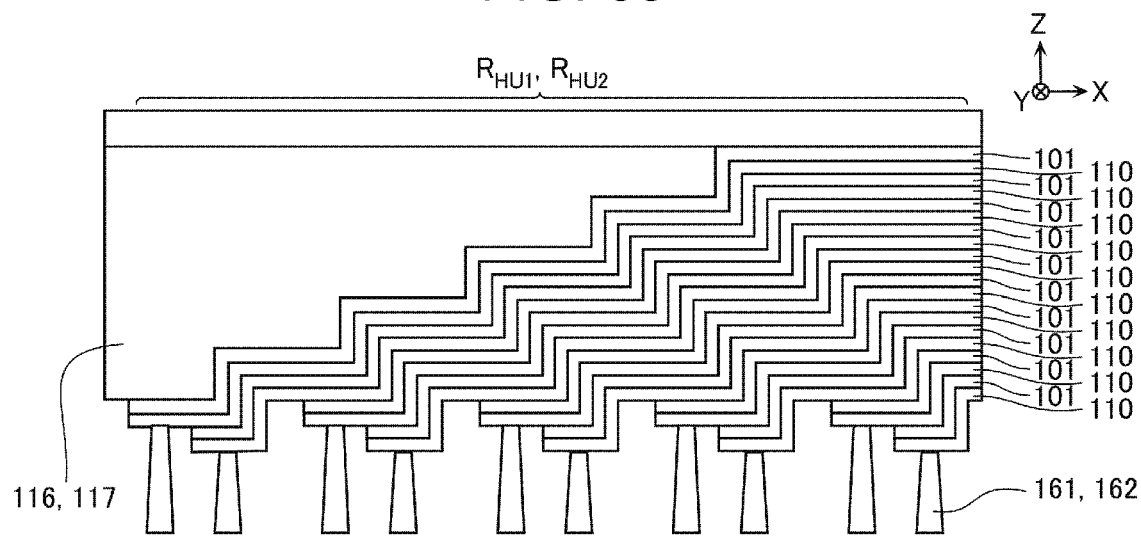
FIG. 53 is a schematic cross-sectional view showing the configuration of a semiconductor storage device according to a sixth modification.
Figure 54:
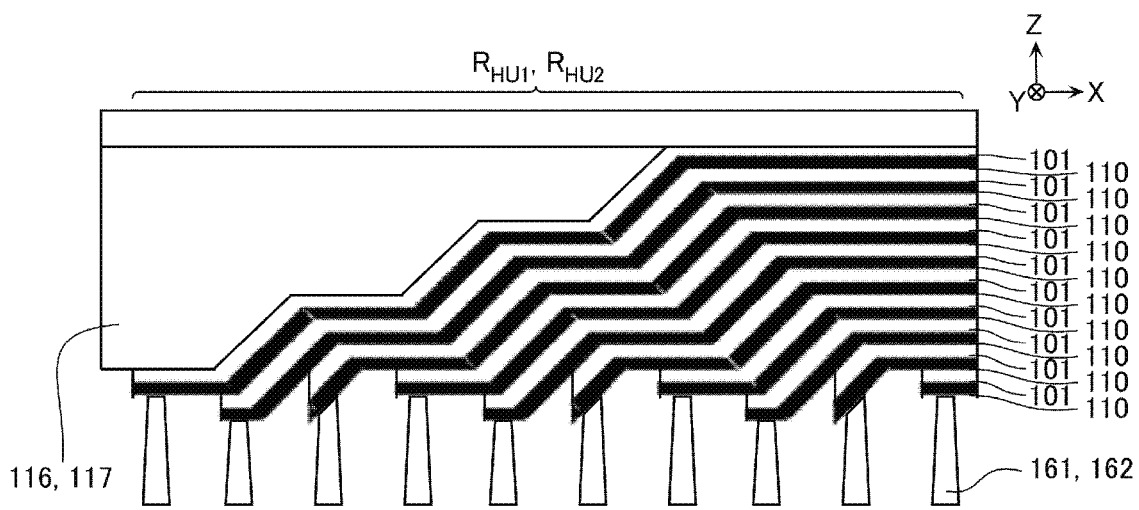
FIG. 54 is a schematic cross-sectional view showing the configuration of a semiconductor storage device according to a seventh modification.

Furthermore, as illustrated in FIGS. 53 and 54, among the plurality of conductive layers 110, the portions provided in the first hookup region $R_{HU1}$ and the second hookup region $R_{HU2}$ may be formed in a substantially stepped shape (stair step pattern) or zig-zag pattern. For example, as illustrated in FIG. 53, a configuration may be adopted in which the plurality of conductive layers 110 include a plurality of portions extending in the Z direction and a plurality of portions extending in the X direction. Furthermore, as illustrated in FIG. 54, a configuration may be adopted in which the plurality of conductive layers 110 include a plurality of portions extending in a direction between the X direction and the Z direction (the diagonally downward direction to the left in FIG. 51) and a plurality of portions extending in the X direction such that the plurality of conductive layers 110 are located downward as they are separated from the memory cell array region $R_{MCA}$. Such a configuration can be formed, for example, in the process described with reference to FIG. 13 and the process described with reference to FIG. 19, by forming the insulating layers 116 and 117 in a substantially stepped shape, instead of forming one smooth or gradual slope on the insulating layers 116 and 117.

Figure 55:
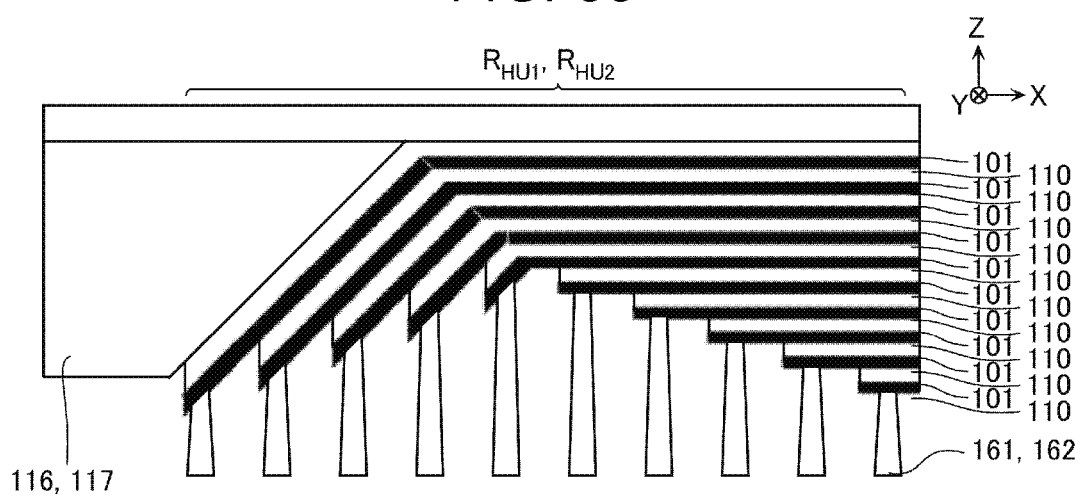
FIG. 55 is a schematic cross-sectional view showing the configuration of a semiconductor storage device according to an eighth modification.

Furthermore, as illustrated in FIG. 55, only some the portions provided in the first hookup region $R_{HU1}$ and the second hookup region $R_{HU2}$ among the plurality of conductive layers 110 need be formed in the same manner as in the first modification, and the other parts may be formed in the same manner as in the configuration illustrated in FIG. 52. Such a configuration can be formed, for example, by forming the insulating layers 116 and 117 in a part of first hookup region $R_{HU1}$ and second hookup region $R_{HU2}$, rather than in the whole of these regions, in the process described with reference to FIG. 13 and the process described with reference to FIG. 19, and by performing a process such as etching, instead of the planarization process in the process described with reference to FIG. 15 and the process described with reference to FIG. 21.

Figure 56:
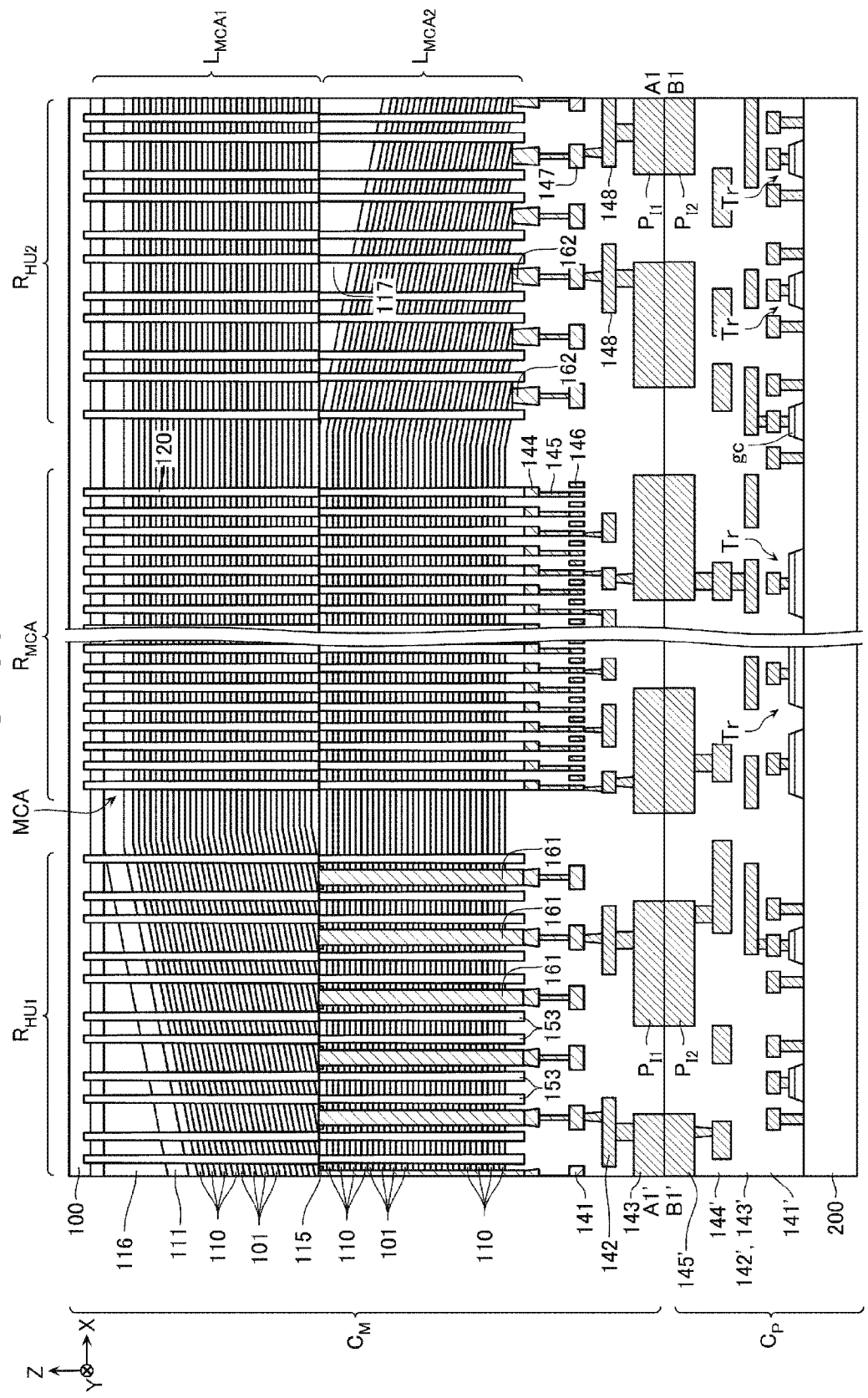
FIG. 56 is a schematic cross-sectional view showing the configuration of a semiconductor storage device according to a ninth modification.

As described with reference to FIG. 4, in the first embodiment, a gap g is provided inside both the insulating layers 116 and 117. However, such a configuration is just one example and the specific configuration and the like can be adjusted as appropriate. For example, as illustrated in FIG. 56, a gap g may not be provided inside either of the insulating layers 116 and 117.

As described with reference to FIG. 9, the conductive layer 110 according to the first embodiment may contain polycrystalline silicon or the like doped with impurities such as phosphorus or boron. In such a case, for example, in the process described with reference to FIG. 14 and the process described with reference to FIG. 20, doped silicon or the like may be formed instead of the sacrificial layer 110A, and a sacrificial layer of, for example, silicon germanium (SiGe) may be formed instead of the insulating layer 101. In the process described with reference to FIG. 36, the silicon germanium (or the like) sacrificial layer may be removed instead of the sacrifice layer 110A. Further, in the process described with reference to FIG. 36, the insulating layer 101 may be formed instead of the conductive layer 110. In such a case, a structure in which a gap g is not provided inside the insulating layers 116 and 117 (as illustrated in FIG. 56) may be adopted. In such a case, in the peripheral region $R_P$ described with reference to FIG. 2, the memory cell array layers $L_{MCA1}$ and $L_{MCA2}$ may be provided with a stacked structure including a plurality of layers containing silicon and a plurality of layers containing silicon germanium.

In the first embodiment, a memory cell including a memory transistor including a charge storage film in the gate insulating film was exemplified. Also, a configuration in which a plurality of conductive layers 110 (corresponding to the gate electrodes) are arranged in the Z direction was illustrated. However, such a configuration is an example and the specific configuration and the like can be adjusted as appropriate. For example, the above configuration is also applicable to a configuration in which a plurality of semiconductor layers corresponding to a channel region are arranged in the Z direction. Further, it is also applicable to a configuration including a pair of electrodes and a memory film provided between these electrodes, instead of the memory transistor.

In the first embodiment, a semiconductor substrate is not provided on the rear surface side of the chip $C_M$, but the semiconductor substrate 200 is provided on the rear surface side of the chip $C_P$. However, such a configuration is an example and the specific configuration and the like can be adjusted as appropriate. For example, a semiconductor substrate may be provided on the rear surface side of the chip $C_M$. In such a case, the up-down relationship between the above-mentioned configuration in the chip $C_M$ and the configuration in the chip $C_P$ may be defined in the opposite direction to that of the first embodiment.

In the first embodiment, the memory cell array MCA and the peripheral circuit PC are formed as parts of separate chips. However, such a configuration is an example and the specific configuration and the like can be adjusted as appropriate. For example, these components may be formed as part of the same chip on the same wafer or the like. In such a case, the memory cell array MCA may be formed in a predetermined region on the semiconductor substrate and the peripheral circuit may be formed in other regions. In such a case, the peripheral circuit may instead be formed on the semiconductor substrate and the memory cell array MCA may be formed above the peripheral circuit.

[Others]

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a substrate having a first surface with a memory cell region and a first region disposed to one side of the memory cell region in a direction parallel to the first surface;
   a first memory cell array layer on the substrate;
   a second memory cell array layer between the first memory cell array layer and the substrate in a first direction;
   a plurality of first conductive layers in the first memory cell array layer, the first conductive layers being stacked on each other in the first direction;
   a plurality of second conductive layers in the second memory cell array layer, the second conductive layers being stacked on each other in the first direction; and
   a plurality of first contacts above the first region of the substrate, the first contacts extending in the first direction through second conductive layer from the substrate to the first memory cell array layer, the first contacts being electrically insulated from the second conductive layers and electrically connected to ends of the first conductive layers in the first region.

2. The semiconductor storage device according to claim 1, the first conductive layers each include a portion in the first region extending in a diagonal direction intersecting the substrate.

3. The semiconductor storage device according to claim 2, wherein the ends of the first conductive layer in the first region directly contact an end of a respective first contact at an upper surface of the second memory cell array layer.

4. The semiconductor storage device according to claim 1, wherein the first conductive layers each include a portion within the first region that extends towards the second memory cell array layer.

5. The semiconductor storage device according to claim 4, wherein the portion extends towards the second memory cell array layer in a stair-stepped manner.

6. The semiconductor storage device according to claim 1, further comprising:
   a peripheral circuit formed in the substrate, wherein the first contacts electrically connect to the peripheral circuit.

7. The semiconductor storage device according to claim 1, wherein
the first surface of the substrate further includes a second region disposed another side of the memory cell region such that the memory cell region is between the first and second regions along the direction parallel to the first surface, and
the second conductive layers each include a portion within the second region that extends towards the first surface.

8. The semiconductor storage device according to claim 7, wherein the portions of the second conductive layers in the second region extend diagonally downwards towards the first surface.

9. The semiconductor storage device according to claim 7, wherein the portions of the second conductive layers in the second region extend in a stair-stepped manner towards the first surface.

10. The semiconductor storage device according to claim 7, wherein each end of the second conductive layers in the second region is at the first surface.

11. The semiconductor storage device according to claim 1, wherein at least some of the plurality of first contacts extend in the first direction into the first memory cell array layer in the first region.

12. The semiconductor storage device according to claim 1, further comprising:
a plurality of memory pillars extending in the first direction through the first conductive layers in the first memory cell array layer and the second conductive layers in the second memory cell array layer.

13. The semiconductor storage device according to claim 1, further comprising:
an insulating layer disposed on the uppermost first conductive layer in plurality of first conductive layers in the first region.

14. The semiconductor storage device according to claim 13, wherein the insulating layer is wedge shaped and includes a gap formed therein.

15. A semiconductor storage device, comprising:
a semiconductor substrate with a first surface;
a plurality of first conductive layers stacked in a first direction intersecting the first surface;
a first semiconductor layer extending in the first direction through the plurality of first conductive layers;
a plurality of first memory cells at intersections of the first conductive layers and the first semiconductor layer;
a plurality of second conductive layers stacked in the first direction;
a second semiconductor layer extending in the first direction through the plurality of second conductive layers and connected to the first semiconductor layer at an end in the first direction;
a plurality of second memory cells at intersections of the second conductive layers and the second semiconductor layer; and
a plurality of first contacts extending in the first direction through the second conductive layers in a first region, each first contact being electrically insulated from the second conductive layers and having an end in the first direction connected to a corresponding one of first conductive layers in the first region, wherein
the lowermost one of the first conductive layers is connected to the first contact of the plurality of first contacts nearest to the plurality of first memory cells, and
the uppermost one of the first conductive layers is connected to the first contact of the plurality of first contacts farthest from the plurality of first memory cells.

16. The semiconductor storage device according to claim 15, further comprising: a plurality of second contacts having an end in the first direction connected to a corresponding one of second conductive layers in a second region spaced from the first region in a second direction parallel to the first surface, wherein the lowermost one of the second conductive layers is connected to the second contact of the plurality of second contacts nearest to the plurality of second memory cells, and the uppermost one of the second conductive layers is connected to the second contact of the plurality of second contacts farthest from the plurality of second memory cells.

17. The semiconductor storage device according to claim 15, wherein the first conductive layers each include a portion within the first region that extends towards the substrate at an angle less than ninety degrees.

18. The semiconductor storage device according to claim 15, wherein the first conductive layers each include a portion within the first region that extends towards the substrate in a stair-stepped manner.

19. The semiconductor storage device according to claim 15, wherein at least some of the plurality of first contacts extend in the first direction to a level equal to the first memory cells.

* * * * *